US010956857B2

(12) United States Patent
Jacobsson

(10) Patent No.: US 10,956,857 B2
(45) Date of Patent: Mar. 23, 2021

(54) METHOD, SYSTEM AND DEVICE FOR PROVIDING INFORMATION ON A DISPLAY ARRANGED ON A CARRIER IN A SURFACE MOUNT TECHNOLOGY SYSTEM

(71) Applicant: Mycronic AB, Taby (SE)

(72) Inventor: Nils Jacobsson, Taby (SE)

(73) Assignee: Mycronic AB, Taby (SE)

( * ) Notice: Subject to any disclaimer, the term of this patent is extended or adjusted under 35 U.S.C. 154(b) by 344 days.

(21) Appl. No.: 15/551,895

(22) PCT Filed: Feb. 19, 2016

(86) PCT No.: PCT/EP2016/053569
§ 371 (c)(1),
(2) Date: Dec. 22, 2017

(87) PCT Pub. No.: WO2016/131967
PCT Pub. Date: Aug. 25, 2016

(65) Prior Publication Data
US 2018/0130011 A1 May 10, 2018

Related U.S. Application Data

(60) Provisional application No. 62/167,585, filed on May 28, 2015, provisional application No. 62/118,243, filed on Feb. 19, 2015.

(51) Int. Cl.
*G06Q 10/08* (2012.01)
*H05K 13/02* (2006.01)
*H05K 13/08* (2006.01)

(52) U.S. Cl.
CPC ......... *G06Q 10/087* (2013.01); *H05K 13/021* (2013.01); *H05K 13/086* (2018.08)

(58) Field of Classification Search
CPC .... G06Q 10/087; G06Q 10/08; H05K 13/086; H05K 13/021; H05K 13/0417
(Continued)

(56) References Cited

U.S. PATENT DOCUMENTS 4,783,740 A    11/1988 Ishizawa et al.
7,518,511 B1 *  4/2009 Panja .................... G06Q 10/08
                                                340/572.1
(Continued)

FOREIGN PATENT DOCUMENTS

CN    106034406 A    10/2016
CN    107535086 A     1/2018
(Continued)

OTHER PUBLICATIONS

EP 16705524.3—First Office Action dated Nov. 28, 2019, 8 pages.
(Continued)

*Primary Examiner* — Thien M Le
*Assistant Examiner* — Tae W Kim
(74) *Attorney, Agent, or Firm* — Haynes Beffel & Wolfeld LLP; Ernest J. Beffel, Jr.

(57) ABSTRACT

A method and a system for changing operator display data on a display unit/electronic label located on a carrier in a Surface Mount Technology (SMT) system performing the steps of providing a carrier in the form of a bin or trolley configured to carry a plurality of bin load units, wherein said carrier comprises a display unit/electronic label; receiving or retrieving input data related to said carrier and an ongoing or upcoming SMT job; presenting display data on said display unit/electronic label based on said received input data; and scanning at least one barcode associated with or arranged on said carrier.

25 Claims, 38 Drawing Sheets

(58) Field of Classification Search
CPC .. B65G 1/137; G01N 35/00732; G01N 35/04; G01N 2035/00782; G01N 2035/0406
USPC .......................................................... 235/385
See application file for complete search history.

(56) References Cited

U.S. PATENT DOCUMENTS

| | | | |
|---|---|---|---|
| 9,679,326 B2* | 6/2017 | Elberbaum | ............... H02J 7/00 |
| 2003/0046808 A1* | 3/2003 | Eskang | ............. H05K 13/0417 |
| | | | 29/650 |
| 2004/0088229 A1 | 5/2004 | Xu | |
| 2005/0178811 A1* | 8/2005 | Rodgers | ............. H05K 13/0417 |
| | | | 226/1 |
| 2006/0206235 A1 | 9/2006 | Shakes et al. | |
| 2008/0078834 A1 | 4/2008 | Woodward | |
| 2008/0217394 A1 | 9/2008 | Okada et al. | |
| 2012/0287095 A1* | 11/2012 | Cote | ...................... G06Q 10/08 |
| | | | 345/204 |
| 2013/0312371 A1 | 11/2013 | Ambrose | |
| 2014/0083144 A1 | 3/2014 | Hwang et al. | |
| 2014/0370608 A1* | 12/2014 | Gelbman | ................ B01L 3/545 |
| | | | 436/47 |
| 2015/0014215 A1 | 1/2015 | Jacobsson et al. | |
| 2015/0098774 A1 | 4/2015 | Jacobsson | |
| 2019/0223334 A1 | 7/2019 | Jacobsson | |

FOREIGN PATENT DOCUMENTS

| | | |
|---|---|---|
| CN | 107535087 A | 1/2018 |
| CN | 108142003 A | 6/2018 |
| DE | 10 2006 022371 A1 | 11/2007 |
| EP | 0453370 A1 | 10/1991 |
| EP | 1715733 A2 | 10/2006 |
| EP | 2792619 A1 | 10/2014 |
| JP | H0738285 A | 2/1995 |
| JP | 2000068690 A | 3/2000 |
| JP | 200964901 A | 3/2009 |
| JP | 2014110322 A | 6/2014 |
| JP | 2018507558 A | 3/2018 |
| JP | 2018520059 A | 7/2018 |
| JP | 6599999 B2 | 10/2019 |
| WO | 2013/127676 A1 | 9/2013 |
| WO | 2013/135730 A1 | 9/2013 |
| WO | 2014/091578 A1 | 6/2014 |
| WO | 2015/040082 A2 | 3/2015 |
| WO | 2015/040085 A1 | 3/2015 |
| WO | 2016/131966 A1 | 8/2016 |
| WO | 2016/131967 A1 | 8/2016 |
| WO | 2016/189059 A2 | 12/2016 |

OTHER PUBLICATIONS

CN 201680022351.X—Office Action dated Jun. 26, 2019, 14 pages.
PCT/EP2016/061848—International Prelimininary Report on Patentability dated Oct. 11, 2017, 18 pages.
PCT/EP2016/061848—International Search Report w/Written Opinion dated Dec. 12, 2016, 21 pages.
PCT/EP2016/053568—International Prelimininary Report on Patentability dated Oct. 25, 2017, 19 pages.
PCT/EP2016/053568—International Search Report and Written Opinion dated Aug. 25, 2016, 14 pages.
"The Mycronic Solution—Creating tomorrow's intelligent factory" https://www.mycronic.com/globalassets/brochures/p-001-0244-solution-brochure-oct-2015.pdf , Mycronic, Oct. 2015, 11 pages.
EP 16705524.3—Response to Rule 161 filed Jul. 9, 2019, 15 pages.
U.S. Appl. No. 15/577,504—Preliminary Amendment filed Nov. 28, 2017, 8 pages.
U.S. Appl. No. 15/577,504—Preliminary Amendment filed Feb. 16, 2018, 8 pages.
U.S. Appl. No. 15/577,504—Office Action dated May 13, 2018, 8 pages.
U.S. Appl. No. 15/577,504—Response to Office Action dated May 13, 2018 filed Aug. 13, 2018, 14 pages.
U.S. Appl. No. 15/577,504—Final Office Action dated Oct. 28, 2019, 8 pages.
U.S. Appl. No. 15/577,504—Response to Final Office Action dated Oct. 28, 2019 filed Jan. 22, 2020, 14 pages.
JP 2017-561898—Voluntary Amendment filed May 23, 2019, 2 pages.
EP 16729206.9—Response to Rule 161 filed Jul. 8, 2018, 12 pages.
EP 16729206.9—Office Action dated Dec. 18, 2019, 11 pages.
CN 201680042845.4—First Office Action dated Sep. 25, 2019, 15 pages.
CN 201680022843.9—First Office Action dated Jul. 9, 2019, 19 pages.
JP 2017-544001—Voluntary Amendment filed Feb. 19, 2019, 12 pages.
PCT/EP2016/053569—International Search Report and Written Opinion, dated Apr. 25, 2016, 16 pages.
PCT/EP2016/053569—International Prelimininary Report on Patentabily , dated Apr. 25, 2016, 16 pages.

* cited by examiner

8mm Agilis 4.7 Yellow
8MM 060

8mm Agilis 4.7 Yellow
8MM 060

Move Container
Scan new Location

| MYCenter – Electronic labels overview | | | | | | | ⊠ |
|---|---|---|---|---|---|---|---|
| Barcode | Battery level | Container name | Container type | Location | Size | Connection | |
| A1001AD1 | ▯ | Bin66 | Bin | barcode01 | 2" | Online | |
| A2001025 | ▯ | Bin16-1 | Bin | Line1_Machine2/11 > 11-... | 2" | Online | |
| A1001AF0 | ▯ | 1647565 | Container | barcode01 | 2" | Online | |
| A1001A77 | ▯ | | Unknown | | 2" | Online | |
| A1001ACA | ▯ | | Unknown | | 2" | Online | |
| A1001B7E | ▯ | | Unknown | | 2" | Online | |
| A1001B9F | ▯ | | Unknown | | 2" | Online | |
| A1001BBF | ▯ | | Unknown | | 2" | Online | |
| A1001BFB | ▯ | | Unknown | | 2" | Online | |
| A1001CA0 | ▯ | | Unknown | | 2" | Online | |
| A20010CF | ▯ | | Unknown | | 2" | Online | |
| B3007A9F | ▯ | | Unknown | | 2.7" | Online | |
| B30347BF | ▯ ? | | Unknown | | 2.7" | Offline | |

FIG. 37a

| A1001AD1 | ▯ | Bin66 | Bin | barcode01 | 2" | Online |
|---|---|---|---|---|---|---|
| A2001025 | ▯ | Bin16-1 | Bin | Reset label ne2/11 > 11-... | 2" | Online |
| A1001AF0 | ▯ | 1647565 | Container | | 2" | Online |
| A1001A77 | ▯ | | Unknown | | 2" | Online |

FIG. 37b

METHOD, SYSTEM AND DEVICE FOR PROVIDING INFORMATION ON A DISPLAY ARRANGED ON A CARRIER IN A SURFACE MOUNT TECHNOLOGY SYSTEM

CROSS-REFERENCE

This application is the U.S. national stage of PCT Application No. PCT/EP2016/053569, filed Feb. 19, 2016, titled "METHOD, SYSTEM AND DEVICE FOR PROVIDING INFORMATION ON A DISPLAY ARRANGED ON A CARRIER IN A SURFACE MOUNT TECHNOLOGY SYSTEM: which is related to and claims the benefit of U.S. Provisional Patent Application 62/118,243, titled "METHOD, SYSTEM AND DEVICE FOR PROVIDING AND CHANGING INFORMATION RELATED TO AN SMT JOB", filed on Feb. 19, 2015 and U.S. Provisional Patent Application 62/167,585, titled "SMART CONTAINERS/BOXES FOR BEING HANDLE BY, AND STORED IN, AN AUTOMATED SMD WAREHOUSE", filed on May 28, 2015.

TECHNICAL FIELD

The technology disclosed relates to handling of components/bin load units in an SMT system and the receiving and providing of information related to a Surface Mount Technology (SMT) job. In particular, the technology disclosed relates to a display associated with and arranged on a carrier adapted for carrying a plurality of component tapes held by reels, and changing display data on the display arranged on the carrier.

BACKGROUND

Surface Mount Technology is now the preferred method of automated production of electronic printed circuit boards. Machines for pick-and-place mounting of components on a substrate, such as a Printed Circuit Board (PCB), or a substrate for a System in Package (SiP) component are subject to different, often contradictory demands, such as mounting speed, mounting precision, size, prize, etc. The expression "pick and place" is understood by the person skilled in the art as describing the very mounting operation where a mounting head is moved to a component feeder area, where the mounting head picks one or more components from one or more of the component feeders from a component tape reel, and then is moved to a mounting area where the mounting head places the component or components on the substrate.

In conventional solutions, the SMT operator uses a job planning computer to obtain all instructions to complete the next step in a loading, kitting or changeover work or replenishment work process. In performing one of the above jobs, the SMT operator moves back and forth between the job planning computer and a storage area where component tape reels and carriers such as bins and trolleys are stored. The location of components tapes reels and carriers, e.g. bins or trolleys, may often result in downtime of the SMT pick and place machine. After a completed pick-and-place job, the SMT operator returns components tape reels from the SMT pick and place machine to the Surface Mount Device (SMD) warehouse or a Shelf Storage Unit.

SUMMARY

A first problem with current solutions for preparing an SMT pick and place job in an SMT system is that it is time consuming for the SMT operator to repeatedly and constantly move between the storage area and the monitor of the job planning computer in order to obtain instructions or information to complete the next step in a loading, kitting or changeover work or replenishment work process. A second problem with conventional solutions is that it is time consuming to identify the location of component tapes/bin load units, e.g. storage locations, which may result in downtime of the SMT pick and place machine. A third problem is that an SMT operator may collect the wrong type of components resulting in incorrect material delivery to the SMT pick and place machine. A fourth problem is that it is time consuming for the SMT operator, e.g. after a pick-and-place job at the pick-and-place machine has been completed, to move between the storage area and the monitor of the job planning computer in order to obtain instructions or guidance information for returning the correct components tape reels from the SMT pick and place machine to the Surface Mount Device (SMD) warehouse or a Shelf Storage Unit.

The object of the methods, devices and system of the technology disclosed is to provide continuously updated instructions or guidance information which is adapted to always be visible on a display in front of an SMT operator during a time when the operator is in the storage area working with kitting/loading of a carrier such as a bin or trolley, and further to provide a more efficient and less error-prone method and system for handling kitting/loading, changeover work and replenishment work associated with a Surface Mount Technology (SMT) job.

The technology disclosed relates to improved handling of components/bin load units in an SMT system. In particular, technology disclosed aims to provide a more efficient and less error-prone method, system and device for handling changeovers and replenishment work associated with a Surface Mount Technology (SMT) job.

In certain aspects of the technology disclosed, a method is provided for changing operator display data on a display associated with and arranged on a carrier for carrying a plurality of components tape reels/bin load units, in a Surface Mount Technology (SMT) system, the method is comprising:

reading/scanning the unique identity/ID, e.g. a unique tag identity, of a carrier;

receiving input data at said carrier/display based said reading, wherein said input data received is triggered by the action of reading/scanning the unique identity/ID of said carrier;

generating display data on said display based on said received input data;

presenting said display data on the display, thereby is the SMT operator presented with guidance information and/or instructions regarding a loading, kitting or changeover work or replenishment work process.

In certain aspects of the technology disclosed, a method is provided for presenting display data on a display associated with and arranged on a carrier for carrying a plurality of components tape reels/bin load units, in a Surface Mount Technology (SMT) system, the method is comprising:

reading/scanning the unique identity/ID, e.g. a unique tag identity, of a component tape reel/bin load unit associated with, e.g. to be carried by, said carrier;

receiving input data at said carrier/display based said reading, wherein said input data received is triggered by the action of reading/scanning the unique identity/ID of said component tape reel/bin load unit associated with said carrier;

generating updated display data on said display based on said received input data;

presenting said updated display data on the display, thereby is the SMT operator presented with guidance information and/or instructions regarding a loading, kitting or changeover work or replenishment work process.

In certain aspects of the technology disclosed, a method is provided for changing operator display data on a display associated with and arranged on a carrier for carrying a plurality of components tape reels/bin load units, in a Surface Mount Technology (SMT) system, the method is comprising:

presenting display data on the display based on input data, wherein the display data is related to the carrier and a Surface Mount Technology, SMT, job;

reading the unique identity/ID, e.g. a unique tag identity, of at least one of the carrier and a component taper reel/bin load unit associated with, e.g. to be carried by, said carrier;

receiving input data at said display based said reading, wherein said input data received is triggered by the action of reading the unique identity/ID of at least one of the carrier and a component taper reel/bin load unit associated with the carrier;

generating updated display data on said display based on said received input data;

presenting said updated display data on the display, thereby is the SMT operator presented with guidance information and/or instructions regarding a loading, kitting or changeover work or replenishment work process.

An advantage of the methods and system of technology disclosed is that an SMT operator is presented with instructions and/or guidance information regarding a loading, kitting or changeover work or replenishment work process at the operator's present location and can save time, e.g. need not to constantly and repeatedly during an ongoing kitting/loading job move between the storage area and a job planning computer presenting a list of component tapes for the carrier. A further advantage is that the time required for the SMT operator to complete the steps in a loading, kitting or changeover work or replenishment work process can be further reduced when the operator is presented with instructions or guidance information about the kitting/loading of a carrier on the display of the carrier itself.

Another advantage is the reduced time it takes for the operator to identify the location of components/bin load units, which may result in downtime of the SMT pick and place machine, can be reduced. A further advantage is that the risk that a SMT operator may collect the wrong type of components resulting in incorrect material delivery to the SMT pick and place machine is reduced as the operator according to the technology disclosed is presented with instructions or guidance information about e.g. the current state of a carrier and next step(s)/location in the kitting/loading of the carrier on the display attached to said carrier.

A further advantage of the method and system according to the technology disclosed is that the SMT operator, by the use of a reader unit for reading the unique ID of a carrier/bin/trolley, e.g. scanning a barcode ID or reading an RF tag, may choose any arbitrary carrier (bin or trolley) in the storage area for a kitting/loading job and still be presented with instructions or guidance information about e.g. the current state of said arbitrarily chosen carrier and the next step(s)/location in the kitting/loading of the carrier on the display of said arbitrarily chosen carrier.

The method and system according to the technology disclosed may further comprise associating the carrier and its unique identity/ID with at least one of a carrier kit comprising a carrier kit identity and the identity/ID of individual bin load units or a subset of bin load units to be carried by said carrier and which are required to complete an upcoming SMT job, wherein the unique carrier identity/ID may also be linked or coded together with at least one of the unique ID of the carrier kit, the unique ID of an individual bin load units or the unique ID of the subset of bin load units and where association between the carrier ID and at least one of those mentioned unique IDs are stored as retrievable information in the SMT information database 92. One advantage is that, by association between the carrier ID and the correct subset of bin load units required to complete a loading/kitting of the carrier and/or the upcoming SMT job is available as retrievable information in the SMT information database and can further be used for generating and presenting guidance information to the SMT operator standing in front of the same carrier and its display.

The method may further comprise, generating display data further indicative of an SMT operator instruction based on the identity of at least one of the carrier, the bin load unit and the subset of bin load units.

An advantage of methods and system of the technology disclosed is that the risk that an SMT operator collects the wrong type of components resulting in incorrect material delivery to the SMT pick and place machine is reduced.

The methods and system of the technology disclosed may further comprise updating information in a SMT information database based on user input data from reading or scanning an identity/ID in the SMT system, e.g. updated information may indicate a changed loading state for a carrier or that a bin load unit to be placed in one of the compartments of a carrier has been retrieved from its storage location.

The advantage of the above is that the different entities of the SMT system, e.g. the SMT information database, the SMT job planning computer and the SMT pick-and-place machine which are both configured to retrieve information from the database, can keep track of which bin load units/reels for the loading of a carrier that have been retrieved and which bin load units/reels that remain to be retrieved. The risk of the SMT operator retrieving the same bin load unit/reel twice is therefore reduced. A further advantage of this aspect of the technology disclosed is that the SMT operator is continuously presented with updated instructions or guidance regarding a loading, kitting or changeover work or replenishment work process as the work progresses, and that the information is presented on a display attached to the carrier the operator is currently working with.

BRIEF DESCRIPTION OF DRAWINGS

These and other aspects of the invention will be described in the following description of the invention, given merely as one non-restricting example, with reference to the attached drawings, of which:

FIGS. 33a to c show three examples of display data presented on a display (or electronic label) arranged on/attached to a carrier (bin/trolley) according to the technology disclosed, where the change of display data to what is illustrated in FIGS. 34a and 34b being triggered by at least one of the actions of scanning the barcode ID (or reading an RF tag) on the carrier and the scanning of a barcode ID attached to a component tape reel associated with the same carrier on which the display/electronic label is arranged on.

FIG. 34a and FIG. 34b show two examples of display data presented on a display (or electronic label) arranged on/attached to a carrier (bin/trolley) according to the technology disclosed, where the change of display data to what is illustrated in FIGS. 34a and 34b being triggered by at least one of the actions of scanning the barcode ID (or reading an RF tag) on the carrier and the scanning of a barcode ID attached to a component tape reel associated with the same carrier on which the display/electronic label is arranged on.

FIGS. 35a to 35c show examples of various display data presented on a display (or electronic label) arranged on/attached to a carrier (bin/trolley) according to the technology disclosed, at least some of the display data illustrated in FIGS. 35a to 35c being triggered by at least one of the actions of scanning the barcode ID (or reading an RF tag) on the carrier and the scanning of a barcode ID attached to a component tape reel associated with the same carrier on which the display/electronic label is arranged on.

FIG. 36 shows a sequence of updates of display data presented on a display (or electronic label) arranged on a carrier (bin/trolley) which are related to a s specific kitting job for loading said carrier, and where at least some of the illustrated updates of display data being triggered by at least one of the actions of scanning the barcode ID (or reading an RF tag) on the carrier and the scanning of a barcode ID attached to a component tape reel associated with the same carrier on which the display/electronic label is arranged on.

FIGS. 37a-b show views on the SMT job planning computing device, in accordance with one or more embodiments of the invention.

DETAILED DESCRIPTION

Figure 1:
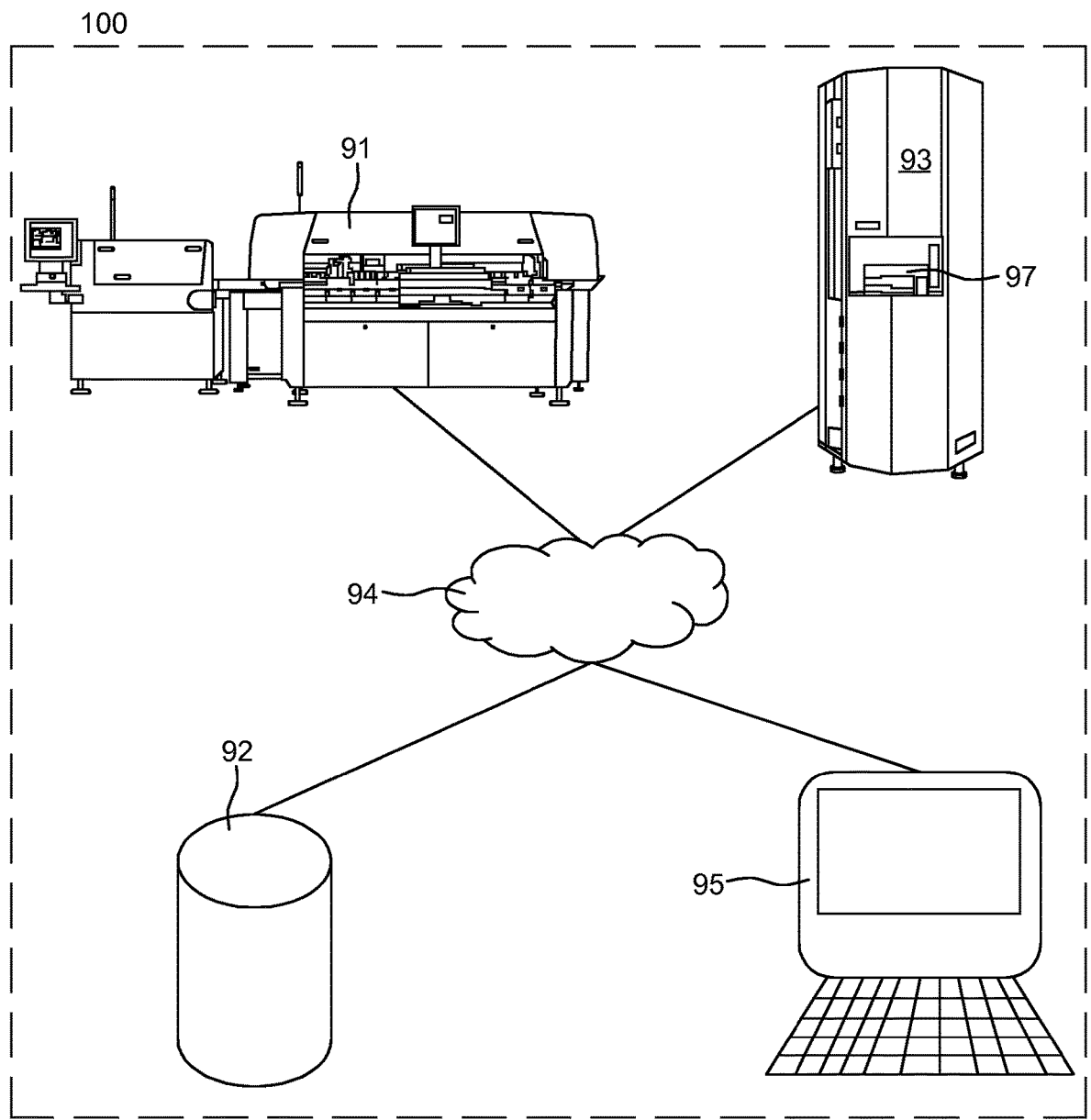
FIG. 1 shows schematically a system for SMT (Surface Mount Technology) semi-automated mounting of electronic components on printed circuit boards.

The invention relates to Surface Mount Technology (SMT) systems and SMT methods in the field of Surface Mount Technology are now the preferred method of automated production of electronic printed circuit boards. Such a system may typically comprise an SMT information database, an SMT pick and place machine, an automated Surface Mount Device (SMD) warehouse and optionally an SMT job planning computing device, wherein all the nodes mentioned above are communicatively coupled (e.g., in a communications network).

SMT pick and place machines for pick-and-place mounting of components on a substrate, such as a Printed Circuit Board (PCB), or a substrate for a System in Package (SiP) component are subject to different, often contradictory demands, such as mounting speed, mounting precision, size, prize, etc. The expression "pick and place" is understood by the person skilled in the art as describing the very mounting operation where a mounting head in said SMT pick and place machine is moved to a component feeder area, where the mounting head picks one or more components from one or more of the component feeders located at predetermined component feeder positions at the pick and place machine, and then is moved to a mounting area where the mounting head places the component or components on the substrate. The total task of placing all required components to a predetermined number of substrates is referred to as producing an SMT job. The SMT job typically comprises SMT job data descriptive of all required components, the position of each component on a substrate required to produce SMT production units, such as electronic printed circuit boards, and the planned relative order the SMT job should be produced in (e.g., third in order to be produced out of five planned SMT jobs).

A typical workflow in a SMT system, as the one described above, is that a planning user plans an SMT job to be executed, stores said SMT job in an SMT information database, an SMT operator (i.e., a human being or alternatively a robot) retrieves required components from said automated Surface Mount Device (SMD) warehouse, transfers required components (e.g., placed on component tape reels) to the pick and place machine and loads predetermined component feeder positions at the pick and place machine (e.g., magazines or trolleys) of said SMT pick and place machine and start SMT production of SMT production units (i.e., substrates with SMT components placed thereupon).

The technology disclosed relates to a method, a system and an arrangement for handling component tapes in connection with mounting components onto circuit boards in a component mounting machine, which utilizes a carrier in form of a bin for carrying component tapes. Each component tape is held by a component tape reel. The component mounting machine utilizes component magazines or a trolley from which components, carried by the component tape, are supplied for use in a mounting process of the component mounting machine. The component tape of each component tape reel is loaded into a tape guide or component feeder for guiding the component tape in the component mounting machine, and the component tape reels are arranged in the bin, which thereafter is placed in the magazine. The tape guides, or component feeders, are then mounted in the magazine such that the component tape loaded therein may interact with feeding devices provided in the magazine. Accordingly, the magazine is loaded with components and prepared for the ensuing mounting process.

To operate the SMT system, the operator is responsible for monitoring the production of the SMT production units, retrieving components from the SMD warehouse and inserting components in positions in the SMT pick and place machine. Today these tasks are performed by manual methods such as printouts. There is a need to provide the operator with dynamic information (e.g., into which position a retrieved component should be inserted in the SMT pick and place machine or which components that are about to run out when the SMT pick and place machine is in production of SMT production units). With improved information obtained by the operator, the risk of erroneous insertion in the SMT pick and place machine can be reduced and the time required to stop the production to replace a component tape reel can be reduced.

The method and system according to the technology disclosed may further comprise associating the carrier and its unique identity/ID with at least one of a carrier kit comprising a carrier kit identity and the identity/ID of individual bin load units or a subset of bin load units to be carried by said carrier and which are required to complete an upcoming SMT job, wherein the unique carrier identity/ID may also be linked or coded together with at least one of the unique ID of the carrier kit, the unique ID of an individual bin load units or the unique ID of the subset of bin load units and where association between the carrier ID and at least one of those mentioned unique IDs are stored as retrievable information in the SMT information database 92. One advantage is that, by association between the carrier ID and the correct subset of bin load units required to complete a loading/kitting of the carrier and/or the upcoming SMT job is available as retrievable information in the SMT information database and can further be used for generating and presenting guidance information to the SMT operator standing in front of the same carrier and its display.

The method may further comprise, generating display data further indicative of an SMT operator instruction based on the identity of at least one of the carrier, the bin load unit and the subset of bin load units.

An advantage of methods and system of the technology disclosed is that the risk that an SMT operator collects the wrong type of components resulting in incorrect material delivery to the SMT pick and place machine is reduced.

The methods and system of the technology disclosed may further comprise updating information in a SMT information database based on user input data from reading or scanning an identity/ID in the SMT system, e.g. updated information may indicate a changed loading state for a carrier or that a bin load unit to be placed in one of the compartments of a carrier has been retrieved from its storage location.

The advantage of the above is that the different entities of the SMT system, e.g. the SMT information database, the SMT job planning computer and the SMT pick-and-place machine which are both configured to retrieve information from the database, can keep track of which bin load units/reels for the loading of a carrier that have been retrieved and which bin load units/reels that remain to be retrieved. The risk of the SMT operator retrieving the same bin load unit/reel twice is therefore reduced. A further advantage of this aspect of the technology disclosed is that the SMT operator is continuously presented with updated instructions or guidance regarding a loading, kitting or changeover work or replenishment work process as the work progresses, and that the information is presented on a display attached to the carrier the operator is currently working with.

The display data may further comprise a historic state value of a historic state of the carrier, e.g. a selection of ["Unregistered", "Idle", "Preloading", "Fully loaded", "Kitted", "Changeover" or "In machine"], wherein the updated display data further comprises a current state value generated based on the tag identity and the historic state value, e.g. to a selection of ["Idle", "Preloading", "Fully loaded", "Kitted", "Changeover" or "In machine"].

The dynamically updated display data on the display attached to the carrier may comprise at least one of a changed state of the carrier in a process for loading the carrier with bin load units/reels, updated information about the bin load units comprised or to be comprised in the plurality of slots or compartments of the carrier, the next location and/or position for the carrier and/or the individual bin load unit(s)/reels carried by said carrier to be placed or positioned according to the SMT job planning, and/or updated information about an SMT job.

In particular, the updated display data may further comprise a selection of the carrier identity/ID, information about the next discrete location or position for the carrier or the individual bin load units/reels comprised in the carrier, the carrier kit identity, the identity of the next pick-and-place machine for the carrier to be loaded into according to the setup for an SMT job, a magazine identity and position for the carrier to be placed in, an SMT job ID, a predetermined bin load unit feeder position in a SMT pick and place machine and a bin load unit An advantage of the above aspects of the technology disclosed is that relevant information for guiding an SMT operator performing a kitting/loading job is available to the SMT operator, and visibly presented in front of the operator, when he is performing a task at the kitting/loading area involving a carrier such as a bin or trolley.

In further aspects of the technology disclosed a Surface Mount Technology (SMT) system is provided for changing operator display data on a display unit/electronic label located on a carrier in the system, the system comprising:

a carrier in the form of a bin or trolley configured to carry a plurality of bin load units such as component tape reels, wherein said carrier comprises a display unit/electronic label attached to the carrier's surface;

a SMT information database, a reader unit such a barcode scanner and/or a RFID reader for reading the identity/ID of at least one of the carrier/bin/trolley and a component tape reel/bin load unit;

at least one wired communications network and one wireless communications network configured to be communicatively coupled to the display unit/electronic label attached to the carrier, the SMT information database and the reader unit, wherein the display unit/electronic label is configured to present display data on the display/electronic label attached to the carrier based on instructions or input data wirelessly received from said at least one wireless communications network, wherein the display data is related to the carrier and a Surface Mount Technology, SMT, job, wherein the SMT information database 92, and/or software 951 of a job planning computer 95 which is configured to receive information from said SMT information database, is configured to receive input data from the SMT operator, triggered by the actions of reading identities/IDs and subsequent sending of data from the reader unit via the at least one of the communications network, said data comprising data representing at least an identity/ID of the carrier or an identity of a bin load unit/component tape;

generating at least one of bitmap data, address/ID data and data for instructing a change of display data on a display/electronic label attached to the carrier based on said input data representing at least an identity/ID of the SMT system;

send, via at least one wired line and one wireless communications network, the generated data to the display unit/electronic label attached to the carrier;

wherein the display unit/electronic label is further configured to present, based on the data received from the wireless communications network, the updated display data on the display/electronic label attached to the carrier such that an SMT operator is presented with instructions and guidance information regarding a loading, kitting or changeover work or replenishment work process.

The wireless communications network may be infrared or radio/wireless.

In a further aspect of the invention, the reader unit for reading the identity/ID of the carrier and the bin load units may be at least one of an optical scanner, such as infrared scanner, or a wireless scanner, such as a RFID reader. The identity/ID data of a carrier may be received by reader/scanning an identity tag. The identity/ID tags may be one of a EAN-13, EAN-8, UPC, Code 39, GS1-128, AI, Code 128, ITF-14, ITF-14, GS1 Datamatrix, GS1 Databar, Industrial 2 of 5, Industrial 2 of 5 Interleaved, 3-DI, ArrayTag, Aztec Code, Small Aztec Code, Codablock, Code 1, Code 16K, Code 49, ColorCode, Color Construct Code, Compact Matrix Code, CP Code, CyberCode, d-touch, DataGlyphs, Data Matrix, Datastrip Code, Dot Code A, EZcode, Grid Matrix Code, HD Barcode, High Capacity Color Barcode, HueCode, INTACTA.CODE, InterCode, JAGTAG, Maxi-Code, mCode, MiniCode, MicroPDF417, MMCC, Nintendo e-Reader#Dot code, Optar, PaperDisk, PDF417, PDMark, QR Code, QuickMark Code, Secure Seal, SmartCode, Snowflake code, ShotCode, SPARQCode, SuperCode, Trillcode, UltraCode, UnisCode, VeriCode, VSCode, WaterCode and Radio Frequency Identification (RFID) tags.

The carrier and the display unit/electronic label may be associated in the SMT information database.

In a further aspect of the invention a carrier is provided in the form of a container, bin or trolley for changing operator display data on a display unit/electronic label comprised by the carrier, the carrier configured to:

present display data on the display based on input data, wherein the display data is related to the carrier and a Surface Mount Technology, SMT, job;

receive user input data comprising at least a tag identity, the tag identity comprising information about the identity of a bin load unit such as a component tape reel;

generating updated display data based on input data, the user input data and the display data;

present the updated display data based on the updated display data such that an SMT operator is presented with instructions regarding a loading, kitting or changeover work or replenishment work process.

In a further aspect of the invention a computer program product is provided comprising computer readable code configured to, when executed in a processor, perform any or all of the method steps herein.

Certain aspects of the technology disclosed relate to a method, system and device for changing information related to an SMT job on a display and/or for changing operator display data on a display unit/electronic label located on a carrier in a Surface Mount Technology (SMT) system.

According to certain aspects of the technology disclosed, the at least one display, which is attached to or associated with a carrier (e.g., a bin or troley) allows operators to receive and/or change information and/or instructions on said display (e.g., the operator may receive just-in-time information about electronic components and material) anywhere on the shop floor (e.g., by means of a wireless communication link). The SMT system may thereby continuously guide the operator through an entire loading, kitting, replenishing or changeover process by presenting instructions on displays (e.g., electronic labels). As a result, operators can work more efficiently and instantly locate missing components and material (e.g., by sending a signal directly to the display).

In other aspects of the technology disclosed, the display associated with the carrier is further configured to receive instructions from the operator by the action of reading a RFID tag or scanning a barcode, e.g., by being logically, wirelessly or electronically connected to the display). The operator may thereby provide the SMT system (e.g., via a wireless communication link) with updated information through a loading, kitting or changeover process by sending instructions using the interface of the displays (electronic labels). As a result, operators can work more efficiently and in a less error-prone manner and be guided by the SMT information database 92 or software 951 in a computer 95 connected to the database (and his own and other operators' actions providing the SMT database and/or a separate radio/IR/WLAN-based system with updated information) through the entire loading, kitting or changeover process by sending instructions to the displays and/or uplink (e.g., via a communication network) to the SMT information database.

Yet another aspect of the technology disclosed is to receive instructions (e.g., triggering further actions associated with an ongoing and/or upcoming SMT job and/or the SMT information database) from an operator regarding an ongoing and/or upcoming SMT jobs. The carrier of the technology disclosed (e.g., a bin or trolley having a plurality of predefined number of slots/compartments adapted to receive component tape reels) may then be used as a means for receiving instructions, or input data, from an operator and/or the SMT system (SMT information database or software 951 in a computer 95 connected to the database) regarding an ongoing and/or upcoming SMT jobs.

Another object of the technology disclosed is to provide improved feedback to an operator and/or the SMT information database regarding an ongoing and/or upcoming SMT jobs. The carrier of the technology disclosed, (e.g., a bin or trolley having a plurality of predefined number of slots adapted to receive component tape reels) may then be used as a means for providing improved feedback to an SMT operator and the SMT information database regarding an ongoing and/or upcoming SMT jobs when a trolley or the magazine a bin is placed is loaded into the pick and place machine or while the pick and place machine is performing an SMT job and without interrupting production.

The technology disclosed offers a solution, where input data relating to an SMT job is wirelessly received at the carrier of a plurality of component tape reels, and display data which is generated from or based on the received input data is presented on a display of a display unit/electronic label attached to the carrier.

In certain aspects of the technology disclosed include that the ID of the component tape/reel, or of a bin load unit, is associated with the ID of a specific bin when the component tape reel is placed/comprised in the bin and that each component tape reel in said bin is linked, or is associated, by coding, suitably bar coding, with its bin. Further, in the continued processing, the association between the component tape/reel and the specific bin will be stored as retrievable and reusable information in the SMT information database, e.g. for the purpose of providing the operator with guidance information or for the pick and place machine to pick the proper components.

In certain aspects of the technology disclosed, a component tape reel may be associated/linked/coded together with its bin, or is associated/linked/coded, by coding, suitably bar coding, in connection with placing the component tape reel, or bin load unit, in one of the compartments or slots of the bin. Association may be performed between Bin/Trolley ID, Pallet ID, component tape reel ID and tape guide ID/SMT component feeder ID by storing the IDs in a data structure in an SMT information database.

In certain aspects of the technology disclosed, the ID of the component tape reel, or of a bin load unit, is associated/linked/coded to the ID of a specific bin or trolley, an association may then preferably be performed between bin/trolley ID and component tape reel ID and tape guide ID/SMT component feeder ID by storing and thereby associating the linked IDs in a data structure in an SMT information database. The carrier of the technology disclosed (e.g., a bin or trolley having a plurality of predefined number of slots or compartments adapted to receive component tape reels such as component tape reels pre-threaded into tape guides) may then be used as a means for receiving instructions, or input data, from the SMT information database regarding an ongoing and/or upcoming SMT jobs in order to change display data on a display of an electronic label or tag attached to a bin or trolley comprising a plurality of bin load units such as component tape reels.

Other optional aspects of the technology disclosed include that the component tape reel and the pre-threaded tape guide will be associated/linked/coded together in the SMT information database and stored as a bin load unit comprised in a bin or trolley. The bin or trolley comprising a display may be prepared and used in changeovers, kitting or replenishment work associated with a Surface Mount Technology (SMT) job and then be placed into the pick-and-place machine or a magazine of the pick-and-place machine. In preparing a changeover or replenishment work, the bin or trolley may be available at the kitting area or retrieved from a storage area such as the automated SMD storage warehouse.

In one or more aspects of the technology disclosed, said bin or trolley comprises an display controller unit and a display for displaying data relating to an SMT job and is further holding a plurality of component tape reels placed in individual compartments of the bin/trolley.

In one or more aspects of the technology disclosed, said bin or trolley comprises an display controller unit and a display for displaying data relating to an SMT job and is further holding a plurality of component tape reels placed in individual compartments of the bin/trolley, wherein said bin or trolley is also configured to comprise pallets holding a component tape reels and, optionally, a tape guide.

In one or more aspects of the technology disclosed, said display data is related to an SMT job and may be retrieved from and sent from said SMT information database, where said display data is represented by and/or is bitmap data which is sent between a plurality of the communication units of the SMT system.

In one or more aspects of the technology disclosed, said bin has a bin identity tag in the form of a barcode attached to the bins forward facing surface such that the surface is facing an operator.

In one or more aspects of the technology disclosed, said wireless network or communications network is a radio-based network.

In one or more aspects of the technology disclosed, said wireless network or communications network is an infrared (IR) network or a radio/wireless network.

In one or more aspects of the technology disclosed, said display data comprises a selection of SMT job ID, predetermined component feeder position in the SMT pick and place machine, the identity of the next magazine or pick-and-place machine the carrier is to be loaded, component type(s) and remaining number of components on a component tape reel comprised in said bin or trolley.

In one or more aspects of the technology disclosed, a Surface Mount Technology (SMT) system is proposed for providing operator information, the SMT system comprising: an SMT information database; a SMT pick and place machine; and an identity tag reader/scanner for reading/scanning the identities of individual bins or trolleys.

In one or more aspects of the technology disclosed, there is described a bin or trolley in a Surface Mount Technology (SMT) system for providing operator information in a Surface Mount Technology (SMT) system comprising a SMT information database and a SMT pick and place machine, wherein said bin is adapted to be received in a SMT pick and place machine operating in a started SMT production, the bin or trolley comprising a display configured to: receive input data relating to an SMT job pushed down from a separate system via a network (e.g., a communications network); and present display data on said display based on said input data, wherein said display data guides the operator through at least one of a changeover process, a replenishment process or a kitting process.

In one or more aspects of the technology disclosed, there is described a bin or trolley in a Surface Mount Technology (SMT) system for providing operator information in a Surface Mount Technology (SMT) system comprising an SMT information database and a SMT pick and place machine, wherein said bin is adapted to be received in a SMT pick and place machine, the bin or trolley comprising: a display configured to: receive input data related to an SMT job via a communications network; and present display data on said display based on said received input data, wherein said display data on said is sequentially updated based on received input data, and wherein said input data is pushed down from the SMT information database in order to guide the operator through a SMT job related process selected from one of: loading components in preparation for an SMT job to be performed by a pick and place machine, a changeover process, a replenishment process or a kitting process.

In one or more aspects of the technology disclosed, there is described a bin or trolley in a Surface Mount Technology (SMT) system for providing operator information in a Surface Mount Technology (SMT) system comprising an SMT information database and a SMT pick and place machine, wherein said bin is adapted to be received in a SMT pick and place machine operating in SMT production, the bin or trolley comprising a display configured to: receive input data related to an SMT job from a network such as e.g. a communications network; and present display data on said display based on said received input data, wherein said display data on said is sequentially updated based on received input data, and wherein said input data is pushed down from a separate communications network (e.g., a radio-based network, an infrared network or wireless local area network (WLAN) separate from the network associated with SMT information database) in order to guide the operator through a SMT job related process selected from one of: loading components in preparation for an SMT job to be performed by a pick and place machine, a changeover process, a replenishment process or a kitting process.

The technology disclosed relates to methods, systems and devices for handling of components in an SMT system, and changing and/or providing display data information regarding an SMT job to an SMT system operator, thereby providing reduced probability of inserting non-required components in an SMT pick and place machine and improved preparations of refill of components in a SMT pick and place machine. Further, the technology disclosed relates to methods, systems and devices for changing display data on a display and providing information related to an ongoing or upcoming SMT job from an operator to an SMT information database and vice versa, thereby providing reduced probability of inserting non-required components in an SMT pick and place machine and improved preparations of refill of components in a SMT pick and place machine during changeovers and replenishment work.

In certain aspects, the technology disclosed relates to a method and devices in an Surface Mount Technology (SMT) system comprising at least one SMT pick and place machine 91, an SMT information database 92 and a plurality of carriers such as bins and/or trolleys, each of said plurality of carriers is arranged with a carrier unique ID, e.g. a bin ID, in form of at least one of a barcode and a RFID tag, said carrier is further comprising a display unit with a display for presenting SMT job related information and is further configured for carrying a plurality of bin load units each with unique IDs, e.g. component tape reels each arranged with unique IDs on barcode labels which are attached to the reels, the method is comprising the actions of:

generating and presenting display data on a display arranged on one of the carriers;

reading, by a reader unit adapted for scanning a barcode ID and/or RFID tag arranged on or attached to said carrier, wherein data representing the carrier unique ID of said carrier is thereby obtained by said reader unit;

sending, from said reader unit and via at least one communications network of the SMT system, data representing or related to said obtained ID of said carrier, thereby providing the SMT information database 92, and/or software connected to said SMT information database 92, with data or information representing or related to said carrier ID;

scanning the unique barcode ID of at least one bin load unit, e.g. a component tape reel, wherein said at least one bin load unit according to the SMT job planning is to be comprised in one of the compartments of said carrier in an upcoming SMT pick-and-place job performed by an SMT pick and place machine 91; sending, from said reader unit and via at least one communications network of the SMT system, data representing or related to said barcode ID of at least one bin load unit, thereby providing the SMT information database 92, and/or software in a computer connected to said database, with data or information representing said barcode ID;

receiving, at the display unit of said carrier and from a wireless communications network, input or instruction data originating from the SMT information database 92 or software 951 in a computer 95 configured to retrieve data and information from said SMT information database 92, data for instructing or generating a change of display data on said display of said display unit; and generating, based on said received input or instruction data, a change of contents of the display data on said display arranged on the carrier, wherein said changed display data indicates at least one of a changed state of the carrier in a process for loading the carrier with bin load units, updated information about the bin load units comprised or to be comprised in the plurality of slots or compartments of the carrier, the next location and/or position for the carrier and/or a bin load unit(s) carried by said carrier to be placed or positioned according to SMT job planning, and/or updated information about an SMT job.

According to certain aspects of the inventive concept disclosed, the carriers (in form of a bin or basket for carrying the components held by a component tape reel) are provided with at least one alphanumerical display (e.g., an electronic label or tag) configured to change information that said alphanumerical display is showing in order to provide the operator of the component mounting machine with dynamic information (e.g., into which position a retrieved component should be inserted in the SMT pick and place machine or which components are about to run out when the SMT pick and place machine is in production of SMT production units). With improved information obtained by the operator, the risk of erroneous insertion in the SMT pick and place machine can be reduced and the time required to stop the production to replace a component tape reel can be reduced.

Certain aspects of the technology disclosed describes a carrier (e.g., a bin/basket, magazine or trolley) for carrying components held by component tape reels in a Surface Mount Technology (SMT) system and for providing operator information in a Surface Mount Technology (SMT) system including an SMT information database and a SMT pick and place machine, wherein the bin is adapted to be received in a SMT pick and place machine operating in a started SMT production, the bin comprising an alphanumerical display controller unit and an alphanumerical display. The alphanumerical display controller unit is configured to: receive display data relating to an SMT job pushed down from the SMT information database (e.g., via a separate system in form of a communications network); and present said display data on said alphanumerical display. The alphanumerical display controller unit of said alphanumerical display is further configured to receive instructions from an operator (of the SMT pick and place machine) in order to change the display data on said alphanumerical display.

Certain aspects of the technology disclosed describes a bin (e.g., a carrier in form of a basket for carrying components held by component tape reels) in a Surface Mount Technology (SMT) system for providing operator information in an Surface Mount Technology (SMT) system comprising an SMT information database and a SMT pick and place machine, wherein said bin is adapted to be received in a SMT pick and place machine operating in a started SMT production, the bin comprising a display controller unit and a display (e.g., an alphanumerical display). The display controller unit is configured to: receive display data relating to an SMT job pushed down from the SMT information database (e.g., via a separate system in the form of a communications network); and present said display data on said display. The display controller unit of said display is further configured to receive instructions from an operator (of the SMT pick and place machine) by means of at least one of the action of pushing a pressure-sensitive button provided on said bin (e.g., associated with or on said display) and/or the scanning of a barcode on said bin (e.g., associated with or on said display) in order to change the display data on said display.

Certain aspects of the technology disclosed describes a bin (e.g., a carrier in form of a basket for carrying components held by component tape reels) in a Surface Mount Technology (SMT) system for providing operator information in a Surface Mount Technology (SMT) system comprising an SMT information database and a SMT pick and place machine, wherein said bin is adapted to be received in a SMT pick and place machine operating in a started SMT production, the bin comprising a display. The display is configured to: receive input data relating to an SMT job pushed down from the SMT information database (e.g., via a communications network); and present display data on said display based on said received input data. Said display is further configured to: receive external instructions (e.g., from an external actuator/robot or the operator operating the SMT pick and place machine) in order to one of provide uplink information to an SMT information database, trigger actions related to an ongoing or upcoming SMT job and/or change the display data on said display. Said alphanumerical display on said bin is provided with a barcode that is configured to be scanned by a barcode scanner to thereby receive light from said barcode scanner, said light received from said barcode scanner providing information to said display to one of provide uplink information to an SMT information database (e.g., via a separate wireless communication network), trigger actions related to an SMT job and/or change the display data. Said display controller unit is configured to provide uplink information to an SMT information database, trigger actions related to an ongoing or upcoming SMT job and/or change said display data based on the information received from said barcode scanner.

Certain aspects of the technology disclosed describes a bin (e.g., a carrier in form of a basket for carrying components held by component tape reels) in a Surface Mount Technology (SMT) system for providing operator information in a Surface Mount Technology (SMT) system comprising an SMT information database and a SMT pick and place machine, wherein said bin is adapted to be received in a SMT pick and place machine operating in a started SMT production, the bin comprising a display. The display is configured to: receive input data relating to an SMT job pushed down from the SMT information database via a communications network; and present display data on said display based on said received input data, wherein said display is further configured to receive external instructions (e.g., from an external actuator/robot or the operator operating the SMT pick and place machine) in order to one of provide uplink information to an SMT information database, trigger actions related to an SMT job and/or change the display data on said alphanumerical display. Said bin (e.g., said alphanumerical display on said bin) is provided with at least one pressure-sensitive button that is configured to be pushed by an external actuator/robot or the operator (responsible for the SMT pick and place machine) to thereby receive instructions from the pushing of said at least one pressure-sensitive button. Said display controller unit is configured to provide uplink information to an SMT information database (e.g., via a separate wireless communication network), trigger actions related to an SMT job and/or change said display data based on the received instructions from the pushing of said at least one pressure-sensitive button.

Certain aspects of the technology disclosed describe a carrier (e.g., a trolley, tape magazine, bin or a basket for carrying components held by component tape reels) in a Surface Mount Technology (SMT) system for providing operator information in an Surface Mount Technology (SMT) system comprising an SMT information database and a SMT pick and place machine, wherein said bin is adapted to be received in a SMT pick and place machine operating in a started SMT production, and the carrier is associated with or comprises a display. The display is configured to: receive input data relating to an SMT job pushed down from the SMT information database, or a separate system and communications network; and present display data on said display based on said received input data. Said carrier or display is further configured with means for receiving instructions from an operator in order to provide the SMT database with updated information.

Certain aspects of the technology disclosed describe a carrier (e.g., a trolley, tape magazine, bin or a basket for carrying components held by component tape reels) in a Surface Mount Technology (SMT) system for providing operator information in an Surface Mount Technology (SMT) system comprising an SMT information database and a SMT pick and place machine, wherein said bin is adapted to be received in a SMT pick and place machine operating in a started SMT production, and the carrier is associated with or comprises a display. The display is configured to: receive input data relating to an SMT job pushed down from the SMT information database, or a separate system and communications network; and present display data on said display based on said received input data. Said carrier or display is further configured with means for receiving instructions from an operator in order to provide the SMT database with updated information. Said received input data is used to update display data on said display, thereby guiding the operator through a SMT job related process such as a loading process, change over process, replenishment work or kitting process.

The loading of predetermined component feeder positions at the pick and place machine (e.g., by means of connecting magazines or trolleys to said SMT pick and place machine) with individual component tape reels may be time consuming and introduce risks of erroneous loading of the magazines.

The technology disclosed addresses the problem of incorrect material delivery to the SMT pick and place machine and downtime of the SMT pick and place machine during a changeover process and/or a replenishment process when transferring components tape reels loaded into bins from the kitting area and/or the automated Surface Mount Device (SMD) warehouse to the SMT pick and place machine as well as reducing the time when returning component tape reels loaded into bins from the SMT pick and place machine to the automated Surface Mount Device (SMD) warehouse. A further advantage of the technology disclosed is to reduce the risk of erroneous loading of the SMT pick and place machine as a preconfigured bin comprising components tape reels, adapted to the upcoming SMT job, is placed in the SMT pick and place machine.

Definitions or Clarifications

Surface-mount technology (SMT) is in this document to be understood as technology for assembling and mounting SMT production units, for example, by placing SMT components on a substrate, such as a Printed Circuit Board (PCB), a substrate for a System in Package (SiP), etc.

SMT production is in this document to be understood as producing or assembling SMT production units, for example, by placing SMT components contained in bin load units on a substrate, wherein SMT production involves at least feeding components from bin load units, such as component tape reels, to an SMT pick and place machine.

SMT system in this document may typically comprise an SMT information database, an SMT pick and place machine, an automated Surface Mount Device (SMD) warehouse and optionally an SMT job planning computing device (e.g., in FIG. 1), wherein the nodes mentioned above are communicatively coupled (e.g., in a wired or wireless communications network).

Communications network may include at least one of a Local Area Network (LAN), Metropolitan Area Network (MAN), Global System for Mobile Network (GSM), Enhanced Data GSM Environment (EDGE), High Speed Downlink Packet Access (HSDPA), Wideband Code Division Multiple Access (W-CDMA), Code Division Multiple Access (CDMA), Time Division Multiple Access (TDMA), Bluetooth®, Zigbee®, Wi-Fi, Voice over Internet Protocol (VoIP), LTE Advanced, IEEE802.16m, WirelessMAN-Advanced, Evolved High-Speed Packet Access (HSPA+), 3GPP Long Term Evolution (LTE), Mobile WiMAX (IEEE 802.16e), Ultra Mobile Broadband (UMB) (formerly Evolution-Data Optimized (EV-DO) Rev. C), Fast Low-latency Access with Seamless Handoff Orthogonal Frequency Division Multiplexing (Flash-OFDM), High Capacity Spatial Division Multiple Access (iBurst®) and Mobile Broadband Wireless Access (MBWA) (IEEE 802.20) systems, High Performance Radio Metropolitan Area Network (HIPERMAN), Beam-Division Multiple Access (BDMA), World Interoperability for Microwave Access (Wi-MAX), optical communication, infrared communication and ultrasonic communication, etc., but is not limited thereto.

SMT components or surface-mount devices (SMD) is in this document to be understood as units to be placed on a substrate by the SMT system, in particular components adapted to be assembled or mounted by a SMT system. This may comprise electronic components or any other component used by the SMT system to produce an SMT production unit. The SMT components are usually delivered to a SMT pick and place machine in either paper/plastic/metallic pocket-tape, with a thin cover tape closing the pockets, wound on reels, in plastic tubes or in static-free trays whereby the SMT pick and place machine places the SMT components on said substrate to produce an SMT production unit. Non-limiting examples of SMT components are capacitors, resistors, diodes or integrated circuits (IC).

SMT component placement systems or SMT pick-and-place machines are in this document to be understood as robotic machines, which are used to place SMT components onto a substrate. The SMT components, carried by tapes wound up on component tape reels, are placed in predetermined component feeding positions (e.g., magazines) in the pick and place machine. Pick and place machines are used for high speed, high precision placing of broad range of SMT components.

SMT component feeder or tape guide is in this document to be understood as a device that is configured to feed or advance the component tape in the form of a pocket tape from the component tape reel, and remove a thin cover tape closing the pockets. The feeder might utilize internal or external drive to feed the pocket tape. The pick and place machine actuators (e.g., robotic arms) adapted with nozzles rapidly pick components out of their pockets in the pocket tape and place them on the substrate. Information such as substrate positions and types of SMT components, previous to initiation of the assembly and mounting by the pick and place machine, is generated, planned or determined by a planning user on a SMT job planning computing device, together with the number of SMT production units to be produced, and stored as information in a SMT information database in the form of an SMT job. Multiple SMT jobs might be planned and ordered in a SMT job list, also referred to as upcoming SMT jobs, stored in said SMT information database.

SMT feeder or tape and reel feed mechanism is in this document to be understood as an arrangement through which the component tape is threaded. The SMT component feeder is attached to or mounted on the pick and place machine and is adapted to feed or advance the pocket tape from the component tape reel and to remove a thin cover tape closing the pockets. The SMT component feeder may have a built-in tape advancing mechanism or utilize a tape advancing mechanism of the pick and place machine or the magazine (e.g., a feeding wheel or a protrusion utilizing an internal or external drive such as a linear motor) in the pick-and-place machine or magazine protrudes through the tape guide into contact with the pre-threaded tape. The SMT feeder might be adapted to comprise an SMT feeder ID that might be stored and associated to other identities in said SMT information database (e.g., associated to a component tape reel ID). The technology disclosed in this document also enables that the SMT feeder may be adapted to comprise an SMT feeder ID that might be stored and associated with identities of other types of units such as bin IDs or pallet IDs of said SMT system, and where the bin IDs or pallet IDs may also be stored as IDs in an SMT information database.

SMT job planning computing device is in this document to be understood as a computing device comprising a processor, a memory, a user input/output interface and a communication interface adapted to receive user input as data, present data to said user, store data to memory, retrieve data from memory and send data to an external unit (e.g., the SMT information database). The SMT job planning computing device may be configured and used to plan and optimize one or a plurality of upcoming SMT jobs (e.g., the order of upcoming SMT jobs), the order of loading of SMT feeders into the pick and place machine, etc.

SMT information database is in this document to be understood as a node adapted to receive information data via an external communication interface, such as a communication network, to store said data in memory, to receive a request for information, to retrieve data from memory based on said request and to send data via said external communication interface to a requesting node. Examples of information stored in the database may be SMT component location on a substrate, the type of SMT component, the number of produced substrates with placed SMT components, SMT job ID, identities of component tape reels, pallets and bins and association information (e.g., linking a component tape reel ID to a feeder ID, a component tape reel ID to a pallet ID, a component tape reel ID to a bin ID, etc.). The SMT information database might, in an aspect of the technology disclosed be implemented, as a relational database, a dBASE database, an object oriented database, NewSQL database or NoSQL database such as an XML database, etc.

Electronic Shelf Label (ESL) System is in this document to be understood as a system for presenting display data. An ESL system may comprise at least an ESL service module, an ESL access point and an ESL label/display. The ESL service module may be configured to receive display data, e.g. from the SMT information database, and send to the ESL label/display. The display data may be sent to the ESL label/display via an ESL access point, e.g. employing IR or radio/wireless communication. The ESL label/display may be configured to receive display data and to present the display data on the display, e.g. to an operator involved in component kitting and/or component changeover process. The SMT information database, the ESL service module or the ESL label/display may be configured to receive user input data and to generate updated display data based on input data, such as input data relating to an SMT job, user input data.

Storage unit is in this document to be understood as an arrangement configured with discrete storage position, such as a shelf, compartment or pigeonhole, and further configured to comprise bin load units, wherein said bin load unit may comprise a component tape reel. Each storage position may be represented or defined as a storage parameter comprising a vertical storage position value (Y) optionally combined with a horizontal storage position value (X) and an optional depth (Z) storage position value, such as a triplet (X,Y, Z). The storage parameter may be comprised in a data structure and stored in the SMT information database. The storage position may also be associated to a storage position identity comprised in an identity tag, typically arranged adjacent to the storage position and as a barcode tag. The storage position identity may be comprised in a data structure stored in the SMT information database. The storage parameter, the storage position identity and optionally bin load unit identities, e.g. representing component tape reels, stored at the storage position may be associated in the SMT information database.

Automated surface mount device (SMD) warehouse is in this document to be understood as an automatic robotic storage unit comprising a user input/output device, an external communication interface, a processor, and an actuator. The input/output device is adapted to receive user indications as user indication data and to send the user indication data to a processor. The input/output device is further adapted to receive user indication data from a processor and present the data to a user (e.g., by the use of indication means such as light emitting diodes or displays). The external communication interface is adapted to receive data as a signal from a processor and to send said data as a signal to external units, such as the SMT information database. The external communication interface is further adapted to receive data as a signal from external units, such as the SMT information database, and to send said data to said processor. The memory is adapted to receive data as a signal from a processor and to store said data. The memory is further adapted to retrieve data and to send said data as a signal to said processor. The processor is adapted to receive input data, wherein said input data may be received from an operator or retrieved as information from the SMT information database, and to control the actuator.

In the technology disclosed, a plurality of automated Surface Mount Device (SMD) warehouses may be configured to form an integrated automated Surface Mount Device (SMD) warehouse cluster, wherein bin load units may be redistributed between a first and a second automated Surface Mount Device (SMD) warehouse via a first opening in the first automated Surface Mount Device (SMD) warehouse and a second opening in the second automated Surface Mount Device (SMD) warehouse, wherein a first actuator in the first automated Surface Mount Device (SMD) warehouse is configured to grip a bin load unit in the second opening and a second actuator in the second automated Surface Mount Device (SMD) warehouse is configured to grip a bin load unit in the first opening such that bin load units can be passed from said first Surface Mount Device (SMD) warehouse and said second Surface Mount Device (SMD) warehouse.

In the technology disclosed, the automated Surface Mount Device (SMD) warehouse or storage unit may be further configured to store bins with a small physical volume adapted to hold two bin load units as described in more detail below with regard to FIG. 7.

In the technology disclosed, the automated Surface Mount Device (SMD) warehouse or storage unit may further be configured to store bins with a large physical volume, wherein the bins are configured with wheels to form a trolley (e.g., adapted to hold multiple bin load units), wherein the bin load units comprise component tape reels and SMT feeders mounted so that the bin load units can be positioned in a SMT pick and place machine for immediate operation and feed components directly into the SMT pick and place machine.

Pallet is in this document to be understood as an accumulator device for electronic components comprised on a component tape reel and adapted with an attachment arrangements allowing storage in a carrier such as a bin, a position in an automated Surface Mount Device (SMD) warehouse and position in an SMT pick and place machine, as would be understood by a person skilled in the art.

Carrier is in this document to be understood as a bin or trolley (with wheels) adapted to comprise component tape reels and optionally tape guides, component feeders, pallets or any component handled by an SMT pick and place machine in one or more compartments and adapted to be coupled to an SMT pick and place machine, as would be understood by a person skilled in the art. In the technology disclosed, the carrier comprises an alphanumerical display controller unit and an alphanumerical display. The alphanumerical display controller unit can optionally recognize and register component tape reels placed in the carrier (e.g., by scanning barcodes or RFID tags attached to the component tape reels). The scanning may be performed manually by a handheld barcode tag/RFID tag scanner or by a barcode tag/RFID tag scanner integrated in the bin. Alternatively, the alphanumerical display controller unit is configured to communicate data (e.g., identities of recognize and register component tape reels) via the communications network to the SMT information database (e.g., such that information on the content of the bin is available in the SMT information database). Alternatively, the carrier is a bin or magazine further configured with wheels to form a trolley such that the trolley can be retrieved manually or automatically from an automated Surface Mount Device (SMD) warehouse and positioned in an SMT pick and place machine for immediate operation. Alternatively, the carrier is configured to facilitate block-handling of component tape holders, such that components can be fed directly into the SMT pick and place machine when the component tape holders are placed in the bin, for example, by configuring the bin to hold SMT component feeders placed in the bin and individually positioned in separate compartments, or sections or cells in said bin, one for each component tape holder to feed components directly into the SMT pick and place machine. Alternatively, the carrier is provided with a plurality of separate compartments, sections or cells adapted to each comprise a taper guide or SMT component feeder with a pre-threaded component tape reel and wherein the alphanumerical display controller is configured to receive data via the communications network from the SMT information database, wherein the data comprises bin load unit related data such as pickup offset and component tape pitch. The carrier is provided with a number of separate positions for storing component tape holders (e.g., component tape reels) where each position is associated with a feeder position when the carrier is connected to the pick-and-place machine during production. Preferably, these positions are defined by separate compartments, or sections or cells, one for each component tape holder, the compartments preferably being separated by intermediate walls, or the like. Thus, each component tape holder is effectively kept in place and the component tape holders carried by the same carrier will not interfere with one another.

Display is in this document to be understood as an electronic display (e.g., an alphanumerical display or electronic label) that may be associated with, or attached directly to, a carrier. In certain aspects of the technology disclosed, the displays allow operators to receive and change information and display data (e.g., just-in-time information about material) anywhere on the shop floor, thanks to a factory-wide wireless communication link. Controlled by material handling software and/or the SMT information database, the system may guide the operator through the entire kitting and changeover process by presenting instructions on the alphanumerical displays (electronic labels). As a result, operators can work more efficiently and instantly locate missing material by sending a signal directly to the alphanumerical display. In other aspects of the technology disclosed, the display is further configured to receive instructions from the operator by the action of the operator of pushing a pressure-sensitive button (on or associated with the display) and/or scanning a barcode (on or associated with the display).

Systems

FIG. 1 schematically illustrates an embodiment of a SMT system 100.

Referring to FIG. 1, the SMT system 100 comprises an SMT information database 92, an SMT pick and place machine 91, an automated Surface Mount Device (SMD) warehouse 93 and optionally an SMT job planning computing device 95, wherein all the nodes mentioned above are communicatively coupled in a communications network 94. The communications network may include at least one of a Local Area Network (LAN), Metropolitan Area Network (MAN), Global System for Mobile Network (GSM), Enhanced Data GSM Environment (EDGE), High Speed Downlink Packet Access (HSDPA), Wideband Code Division Multiple Access (W-CDMA), Code Division Multiple Access (CDMA), Time Division Multiple Access (TDMA), Bluetooth®, Zigbee®, Wi-Fi, Voice over Internet Protocol (VoIP), LTE Advanced, IEEE802.16m, WirelessMAN-Advanced, Evolved High-Speed Packet Access (HSPA+), 3GPP Long Term Evolution (LTE), Mobile WiMAX (IEEE 802.16e), Ultra Mobile Broadband (UMB) (formerly Evolution-Data Optimized (EV-DO) Rev. C), Fast Low-latency Access with Seamless Handoff Orthogonal Frequency Division Multiplexing (Flash-OFDM), High Capacity Spatial Division Multiple Access (iBurst®) and Mobile Broadband Wireless Access (MBWA) (IEEE 802.20) systems, High Performance Radio Metropolitan Area Network (HIPER- MAN), Beam-Division Multiple Access (BDMA), World Interoperability for Microwave Access (Wi-MAX) and ultrasonic communication, infrared networks etc., but is not limited thereto.

Figure 2:
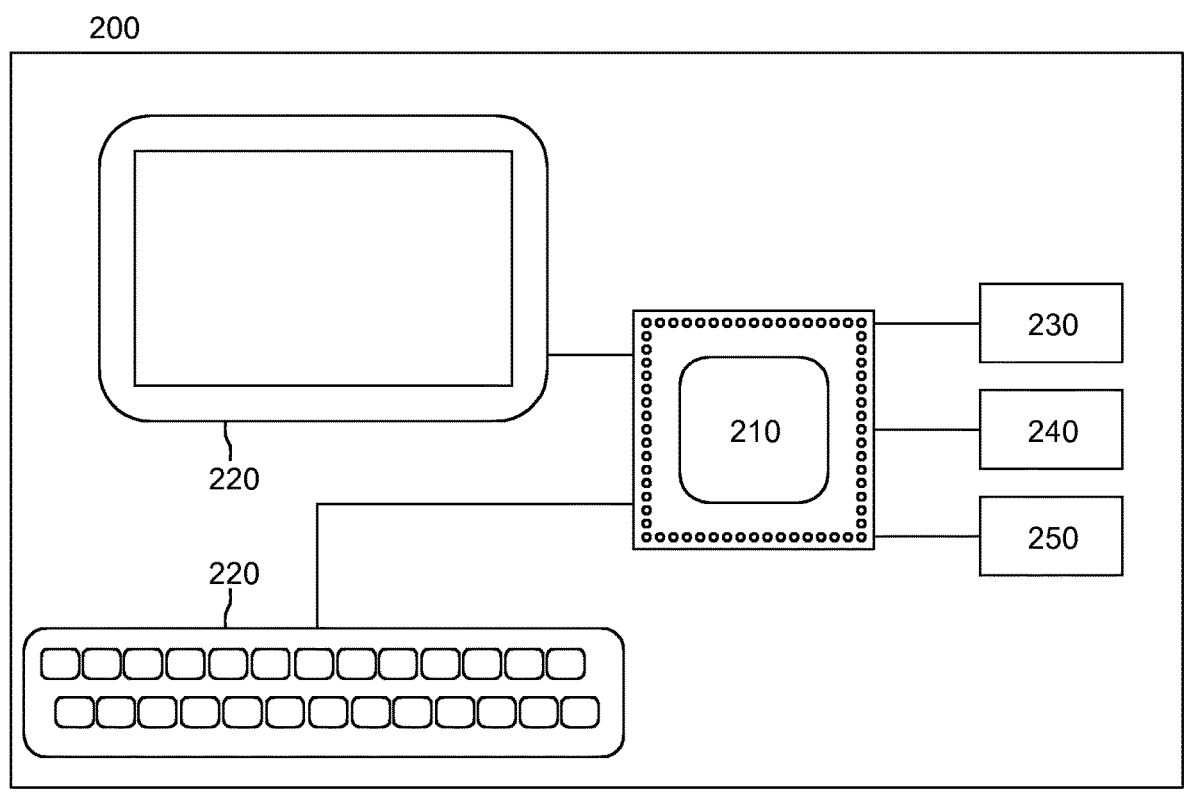
FIG. 2 shows an automated surface mount device (SMD) warehouse device.

FIG. 2 shows a schematic view of an automated Surface Mount Device (SMD) warehouse 200 adapted to obtain information related to upcoming SMT jobs, and store bins at predetermined positions within said automated Surface Mount Device (SMD) warehouse.

Referring to FIG. 2, the automated Surface Mount Device (SMD) warehouse comprises a processor/processing unit 210 provided with specifically designed programming or program code portions adapted to control the processing unit to perform the steps and functions of aspect of the technology disclosed of the inventive method described herein. The automated Surface Mount Device (SMD) warehouse further comprises at least one memory 230 configured to store data values or parameters received from a processor 210 or to retrieve and send data values or parameters to a processor 210. The automated Surface Mount Device (SMD) warehouse further comprises a communications interface 240 configured to send or receive data values or parameters to/from a processor 210 to/from external units via the communications interface 240. The automated Surface Mount Device (SMD) warehouse further comprises an actuator 250, such as a robot or robotic arm, adapted to retrieve/store bins, pallets and/or component tape reels from predetermined positions within the automated Surface Mount Device (SMD) warehouse based on control data received from the processor/processing unit 210.

The processor/processing unit 210 may be a specific or special purpose processor/processing unit (e.g., a microprocessor, microcontroller or other control logic) that comprises sections of code or code portions, stored on a (tangible or non-transitory) computer readable storage medium, such as a memory 230, that are fixed to perform certain tasks, but also other alterable sections of code, stored on a computer readable storage medium, that can be altered during use. Such alterable sections of code can comprise parameters that are to be used as input for the various tasks, such as displaying or processing HTML content or any other parameter related operations known to a person skilled in the art.

The processor/processing unit 210 may be configured to be communicatively coupled and communicate with a memory 230 where data and parameters are kept ready for use by the processing unit 210. The one or more memories 230 may comprise a selection of a hard random access memory (RAM), disk drive, a floppy disk drive, a magnetic tape drive, an optical disk drive, a CD or DVD drive (R or RW), flash memory, or other removable or fixed media drive.

When producing SMT production units in an SMT system, a SMT job associated with an SMT production unit is planned or predefined and stored in an SMT information database. Information relating to an SMT job might indicate the number of production units to be produced and component requirements to complete production of the SMT unit by an SMT pick and place machine. In conventional systems this involves retrieving individual component rolls carrying SMT components, transporting and inserting them in a component feeding position at the pick and place machine, where they can provide components to the pick and place machine robot. The invention reduces the complexity and error-prone previous process by providing pre-loaded bins, trays or accumulator devices that are automatically retrieved from the automated Surface Mount Device (SMD) warehouse and presented at a port, slit, outlet or access point to the operator of the pick and place machine, and can be inserted directly into the pick and place machine for the upcoming SMT job. As the bins have been pre-loaded with components required at the upcoming SMT job, less actions are required by the operator. Information relating to upcoming SMT jobs is obtained, for example, retrieved from memory, pushed or sent by the SMT information database over a communications network, retrieved over a communications network from the SMT information database and/or obtained from operator indications to an input/output device of the automated Surface Mount Device (SMD) warehouse. Examples of input data received by the automated Surface Mount Device (SMD) warehouse are SMT job ID, SMT job component requirements, bin ID, pallet ID, component tape reel ID or a parameter representing position in the automated Surface Mount Device (SMD) warehouse.

Figure 6:
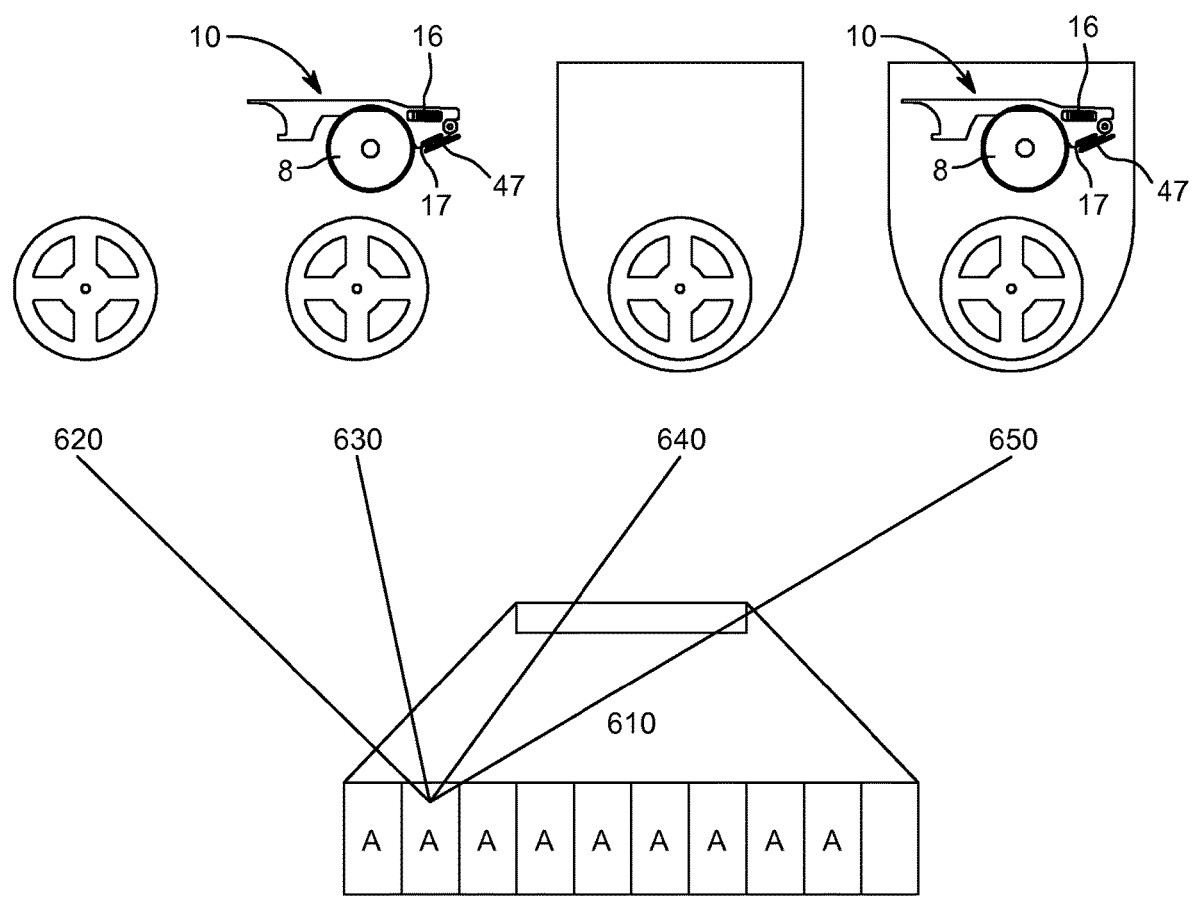
FIG. 6 shows various examples of bin load units, such as component tape reel, component tape reel with feeder, a pallet comprising a component tape reel and a pallet comprising a component tape reel and an SMT feeder.

FIG. 6 shows various examples of bin load units comprised in a bin 610, such as a component tape reel 620, a component tape reel with SMT feeder 630, a pallet comprising a component tape reel 640 and a pallet comprising a component tape reel and an SMT feeder 650. The bin 610 may comprise one or a plurality of compartments or slots adapted to comprise bin load units. The SMT feeder 650 may have a built-in tape advancing mechanism or utilize a tape advancing mechanism of the pick and place machine or the magazine, for example, a feeding wheel or a protrusion utilizing an internal or external drive such as a linear motor, in the pick-and-place machine or magazine, that protrudes through the tape guide into contact with the pre-threaded tape.

Figure 7A:
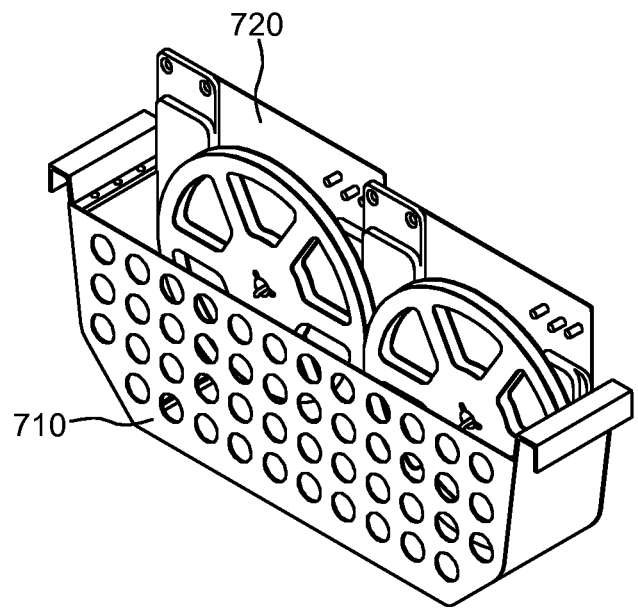
FIG. 7a shows an example of a bin comprising bin load units in the form of pallets 10 comprising component tape reels.

FIG. 7a shows an example of a bin 710 comprising bin load units 720 in the form of pallets comprising component tape reels.

Figure 7B:
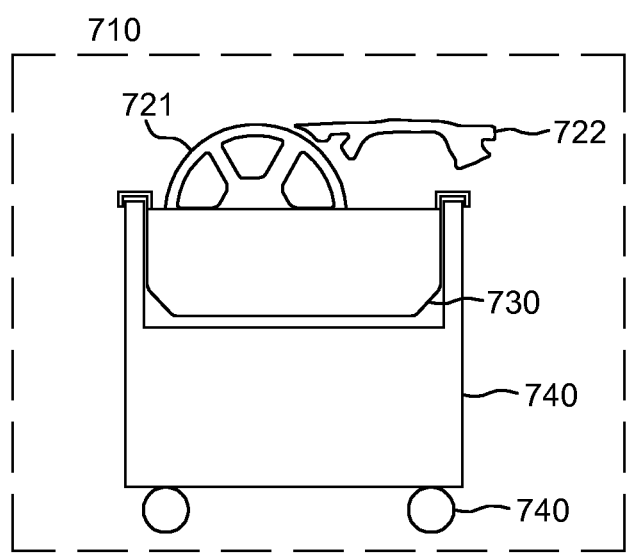
FIG. 7b shows an example of a bin configured as a trolley with wheels 740.

FIG. 7b shows an example of the bin 710 configured as a trolley.

Referring to FIGS. 7a and 7b, the bin 710 is loaded with a bin load unit consisting of a component tape reel 721 and a SMT feeder 722. In FIG. 7b, the bin 710 further comprises a first compartment section 730 including bin load units and a second chassis section 740 configured to roll on a supporting surface, such as a floor, such that the bin 710 can be moved back and forth between the SMD Warehouse and the pick-and-place machine, be retrieved/stored by an actuator in an automated SMD warehouse and to be inserted directly into the pick and place machine for producing the upcoming SMT job.

In one embodiment, the first compartment section 730 and the second chassis section 740 are configured as integral inseparable parts. In yet another embodiment, the first compartment section 730 and the second chassis section 740 is configured as separable parts such that the first compartment section 730 can be separated from the second chassis section 740 and stored separately in an automated SMD Warehouse or inserted separately in an SMT pick and place machine.

Figure 11:
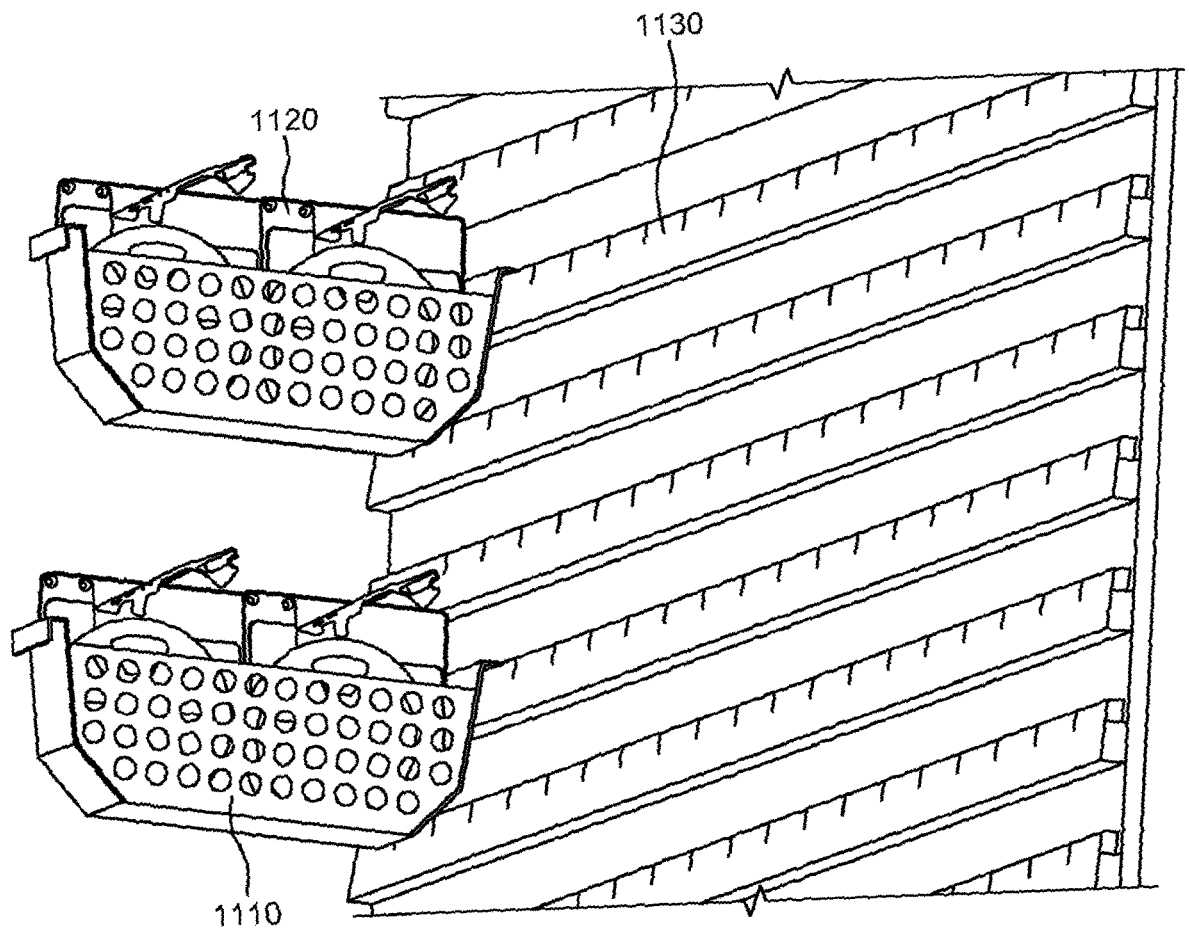
FIG. 11 shows an example where a first and a second bin are retrieved from, or stored in, predetermined storage positions in the automated Surface Mount Device (SMD) warehouse.

FIG. 11 shows an example of the technology disclosed where a first bin 1110 and a second bin 1120 are retrieved from, or stored in, predetermined storage positions 1130 in the automated Surface Mount Device (SMD) warehouse. The attachment of a bin to the storage position might be performed by a hook, an element protruding through a hole, by magnetic means or any other attachment means known to a skilled person.

Figure 15A:
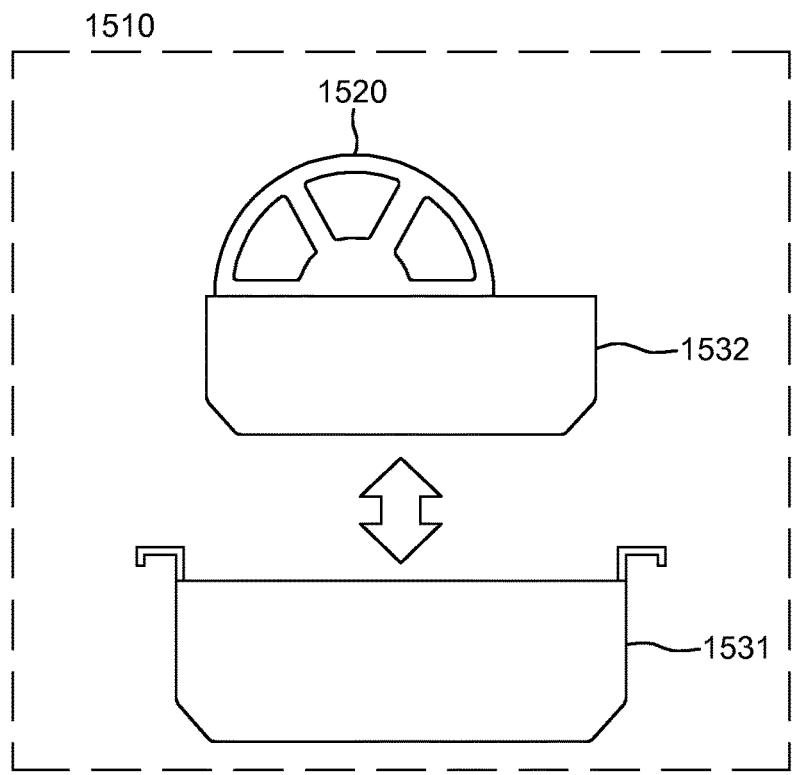
FIG. 15a and FIG. 15b show examples of a bin comprising a bin load unit compartment section and a receptacle compartment section.
Figure 15B:
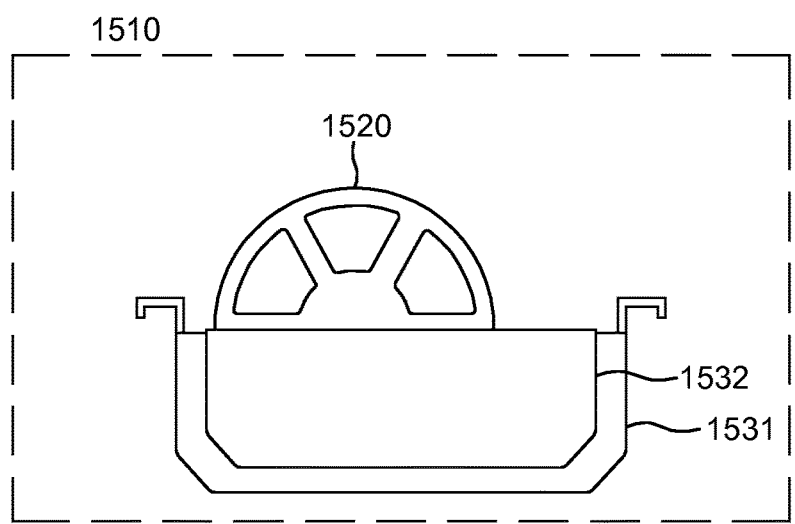

FIG. 15a and FIG. 15b show examples of a bin 1510 comprising bin load units 1520 in the form of component tape reels.

Referring to FIG. 15a and FIG. 15b, the bin 1510 comprises a third bin load unit compartment section 1532 comprising bin load units 1520 and a fourth receptacle compartment section 1531 comprising said third load unit compartment section 1532. The third bin load unit compartment section 1532 can be separated from the fourth receptacle compartment section 1531 and inserted back into the fourth receptacle compartment section 1531 at a later time. The bin 1510 comprising a third load unit compartment section 1532 inserted into the fourth receptacle compartment section 1531 can be inserted directly into the pick and place machine for producing the upcoming SMT job. By replacing the third load unit compartment section 1532 with a different one (e.g., a third load unit compartment section 1532 configured to receive component trays, component sticks or component tape reels), the bin can be more easily reconfigured to be loaded with different type of components depending on requirements of an SMT job. An advantage is that the delay when configuring a pick and place machine for an upcoming SMT job can be reduced. Yet another advantage is that the same fourth receptacle compartment section 1531 can be used for various components by changing the third load unit compartment section 1532.

After finishing an SMT job, the operator unloads the bin from the pick and place machine and returns the bin to the port of the automated Surface Mount Device (SMD) warehouse, that in turn receives the bin and stores it at an available position or storage position within the automated Surface Mount Device (SMD) warehouse by the use of one or more actuators, such as a robot, robot arm or other actuator known to a skilled person.

In yet another aspect of the technology disclosed, storing said bin further comprises determining tape reel identities of component tape reels in said bin.

In one example, determining the tape reel identities comprises scanning an identity tag of component tape reels comprised in said bin, wherein the identity tags are, for example, barcodes and/or RFID tags.

In yet another aspect of the technology disclosed, the determining tape reel identities of component tape reels in said bin comprises: scanning individual identity tags attached to component tape reels; and storing the identity (ID) of each component tape reel to a memory of the display unit (e.g. associated with the electronic label or tag of a bin or trolley) of the bin or trolley comprising the component tape reel, thereby linking/coding the ID of the component tape reel to the ID of the bin or trolley, and/or to a memory of said automated Surface Mount Device (SMD) warehouse.

In yet another aspect of the technology disclosed, the determining of tape reel identities of component tape reels in said bin comprises: scanning individual identity tags attached to component tape reels; and storing the identity (ID) of each component tape reel scanned linked/coded to the ID or position of the bin (or the shelf storage position of the bin) to at least one of a memory in an SMT information database. In one example, the scanning is performed at the input port of the SMD warehouse with the bin load units placed/positioned/located in the bin. In yet another aspect of the technology disclosed, said individual identity tags are barcodes adapted to be scanned by a barcode scanner unit and through said scanning provide information to the barcode scanner unit of an associated identity. In yet another aspect of the technology disclosed, the determining of tape reel identities of component tape reels in said bin comprises: scanning individual identity tags attached to pallets and/or component tape reels to obtain or receive input data for changing SMT job related display data on a display attached to said bin by association in a SMT information database to the bin ID; and retrieving the ID of component tape reel ID associated to said bin ID from said SMT information database.

In one example, the component tape ID's are associated with respective bin ID's in the SMT information database, and the receiving of input data for changing SMT job related display data on a display (e.g. an electronic label/tag) attached to said bin is obtained by first scanning, by the use of a barcode scanner, identity tags attached to the component tape reels (or reel+feeder/tape guide package) to be comprised in said bin in an upcoming SMT job, said scanning action triggering the retrieval or sending of instructions for changing the content on the display, wherein the instructions are received from said SMT information database, e.g. using database lookup.

In yet another aspect of the technology disclosed, the determining of tape reel identities of component tape reels in said bin comprises: scanning, or reading, individual identity tags attached to pallets comprising component tape reels, wherein individual pallet IDs are obtained from said scanning or reading of individual identity tags attached to pallets; and retrieving the ID of component tape reels associated with said obtained pallet ID's from said SMT information database. In one example, the component tape ID's are associated with respective pallet ID's in the SMT information database, the pallet ID's are obtained by scanning identity tags attached to the pallets and the ID's of component tape reels associated to the scanned pallet ID from said SMT information database using database lookup. In yet another aspect of the technology disclosed, the determining tape reel identities of component tape reels in said bin comprises: scanning an identity tag attached to said bin to obtain bin ID's; and retrieving the ID's of component tape reel ID's associated to said bin ID's from said SMT information database. In one example, the component tape ID's are associated with respective bin ID's in the SMT information database, the bin ID's are obtained by scanning identity tags attached to the bins and the ID's of component tape reels associated to the scanned bin ID from said SMT information database using database lookup.

In yet another aspect of the technology disclosed, said identity tag is one of a EAN-13, EAN-8, UPC, Code 39, GS1-128, AI, Code 128, ITF-14, ITF-14, GS1 Datamatrix, GS1 Databar, Industrial 2 of 5, Industrial 2 of 5 Interleaved, 3-DI, ArrayTag, Aztec Code, Small Aztec Code, Codablock, Code 1, Code 16K, Code 49, ColorCode, Color Construct Code, Compact Matrix Code, CP Code, CyberCode, d-touch, DataGlyphs, Data Matrix, Datastrip Code, Dot Code A, EZcode, Grid Matrix Code, HD Barcode, High Capacity Color Barcode, HueCode, INTACTA.CODE, InterCode, JAGTAG, MaxiCode, mCode, MiniCode, MicroPDF417, MMCC, Nintendo e-Reader#Dot code, Optar, PaperDisk, PDF417, PDMark, QR Code, QuickMark Code, Secure Seal, SmartCode, Snowflake code, ShotCode, SPARQCode, SuperCode, Trillcode, UltraCode, UnisCode, VeriCode, VSCode, WaterCode and Radio Frequency Identification (RFID) tags.

In one example, said position is an X, Y, Z coordinates of a shelf identity. In yet another aspect of the technology disclosed, the system further comprises: an input/output interface, wherein said input data is received from said input/output interface based on an operator indication of an upcoming SMT job.

In yet another aspect of the technology disclosed, the system further comprises: a communications interface and said input data is received from said SMT information database via a communications network and said input data is associated with (indicating) an upcoming SMT job. To operate the SMT system an operator responsible for monitoring the production of the SMT production units, to retrieve components from the SMD warehouse and to insert components in positions in the SMT pick and place machine. Today, these tasks are performed by manual methods such as printouts. Thus, there is a need to provide the operator with dynamic information including, for example, into which position a retrieved component should be inserted in the SMT pick and place machine and/or which components are about to run out when the SMT pick and place machine is in production of SMT production units. With improved information obtained by the operator, the risk of erroneous insertions into the SMT pick and place machine can be reduced, and the time required to stop the production to replace a component tape reel can be reduced.

In an example, a method is described for providing operator information in an Surface Mount Technology (SMT) system comprising an SMT information database, a SMT pick and place machine where SMT production have been started and an identity tag scanner, wherein SMT production comprises at least feeding components from a bin load unit to the SMT pick and place machine, the method comprising: receiving a bin in said SMT pick and place machine, wherein said bin comprises vertically oriented bin load units, wherein said bin load unit has an bin load unit identity tag attached to the bin load unit upwards facing surface; and scanning individual identity tags attached to pallets comprising component tape reels to obtain pallet ID's. In one or more aspect of the technology disclosed describes a method for providing operator information in a Surface Mount Technology (SMT) system comprising an SMT information database, a SMT pick and place machine and an identity tag scanner, the method comprising: receiving a bin in said SMT pick and place machine, wherein said bin comprises vertically oriented bin load units, wherein said bin load unit has an bin load unit identity tag attached to the bin load unit upwards facing surface; starting SMT production on said SMT pick and place machine; and scanning individual identity tags attached to bin load units comprising component tape reels to obtain bin load IDs.

Yet another aspect of the technology disclosed provides a method for providing operator information in an Surface Mount Technology (SMT) system comprising an SMT information database and a SMT pick and place machine where SMT production have been started, wherein started SMT production comprises at least feeding components from a bin load unit to the SMT pick and place machine, the method comprising: receiving a bin in said SMT pick and place machine, wherein said bin comprises an alphanumerical display controller unit and an alphanumerical display; receiving display data relating to an SMT job via a communications network; and presenting said display data on said alphanumerical display. Yet another aspect of the technology disclosed describes a method for providing operator information in a Surface Mount Technology (SMT) system comprising an SMT information database and a SMT pick and place machine, the method comprising: receiving a bin in said SMT pick and place machine, wherein said bin has a bin identity tag attached to the bins forward facing surface such that the surface is facing an operator, wherein said identity tag comprises an alphanumerical display controller unit and a alphanumerical display; starting SMT production on said SMT pick and place machine; receiving display data relating to an SMT job from said SMT information database; and presenting said display data on said alphanumerical display. In one example, the bin load units are comprised in a bin configured with a bin identity tag attached to the bins forward facing surface such that the surface is facing an operator, wherein said identity tag comprises an alphanumerical display controller unit and an alphanumerical display. Data relating to the number of components remaining in a bin load unit, such as a component tape reel, is continuously sent from the pick and place machine to the SMT information database. A selection of the identity of the pick and place machine, the location into where the bin should be placed in the pick and place machine, the type of component and the number of remaining component is received as display data and presented on the alphanumerical display. In one or more embodiments, said display data is received via a communications network.

In one or more embodiments, said communications network is a wireless communications network. In one or more embodiments, said display data relates to an SMT job retrieved from said SMT information database. In one or more embodiments, said bin has a bin identity tag in the form of a barcode attached to the bins forward facing surface such that the surface is facing an operator. In one or more embodiments, said communications network is an infrared network or a wireless local area network (WLAN). In one or more embodiments, the method further comprises sending said display information to an IR based system. In one or more embodiments, said display data is pushed down from a separate system. In one or more embodiments, the method step of receiving display data is preceded by scanning individual identity tags attached to bin load units, pallets, bins or pick and place machine magazines. In one example, the display data is received only after an individual identity tag has been scanned by an operator. Yet another aspect of the technology disclosed describes a bin in a Surface Mount Technology (SMT) system for providing operator information in a Surface Mount Technology (SMT) system comprising an SMT information database and a SMT pick and place machine, wherein said bin is adapted to be received in a SMT pick and place machine operating in a started SMT production, the bin comprising: an alphanumerical display controller unit and an alphanumerical display. Said controller is configured to: receive display data relating to an SMT job pushed down from a separate system via a communications network; and present said display data on said alphanumerical display.

In yet another aspect of the technology disclosed, said display data comprises a selection of SMT job ID, predetermined component feeder position in the SMT pick and place machine, component type and remaining number of components on a component tape reel comprised in said bin. In yet another aspect of the technology disclosed, a Surface Mount Technology (SMT) system for providing operator information comprises: an SMT information database; a SMT pick and place machine; and an identity tag scanner. Said system is adapted to receive a bin in said SMT pick and place machine, wherein said bin is adapted to comprise vertically oriented pallets, and wherein said pallet has a pallet identity tag attached to the pallets upwards facing surface. In yet another aspect of the technology disclosed, a bin in a Surface Mount Technology (SMT) system is used for providing operator information, wherein said bin is adapted to be received in a SMT pick and place machine, and wherein said bin has a bin identity tag attached to the forward facing surface of the bin such that the surface faces an operator, and wherein said identity tag may also, or alternatively, comprise an alphanumerical display controller unit and an alphanumerical display.

In yet another aspect of the technology disclosed, storing the position of a bin and/or said bin ID further comprises storing said position and said bin ID represented as parameters, such as a table, in a memory of said SMT information database. In yet another aspect of the technology disclosed, storing said position of a bin and/or said bin ID further comprises storing said position and said bin ID represented as parameters in an SMT information database via a communications network. In yet another aspect of the technology disclosed, storing said position and said bin ID further comprises storing said position and said bin ID represented as parameters in an SMT information database via a communications network. In yet another aspect of the technology disclosed, a computer program product comprising computer readable code configured to, when executed in a processor, perform any or all of the method steps described herein. In yet another aspect of the technology disclosed, a non-transitory computer readable memory on which is stored computer readable code configured to, when executed in a processor, perform any or all of the method steps described herein.

In yet another aspect of the technology disclosed, a computer program product comprising computer readable code configured to, when executed in a processor, perform any or all of the method steps discussed herein. In yet another aspect of the technology disclosed, a non-transitory computer readable memory on which is stored computer readable code configured to, when executed in a processor, perform any or all of the method steps described herein. In yet another aspect of the technology disclosed, a computer program product comprising computer readable code is configured to, when executed in a processor, perform any or all of the method steps described herein. In yet another aspect of the technology disclosed, a non-transitory computer readable memory on which is stored computer readable code is configured to, when executed in a processor, perform any or all of the method steps described herein.

Figure 5:
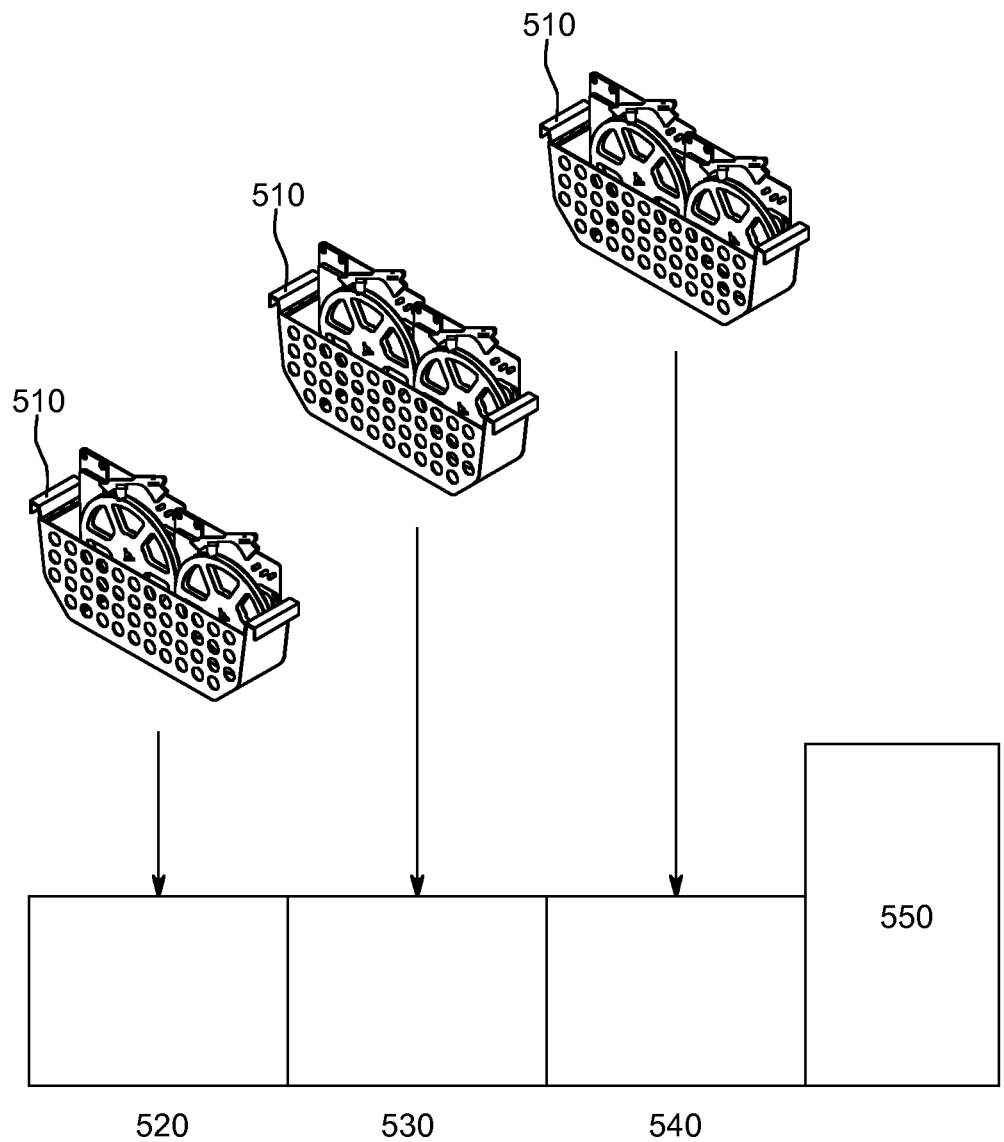
FIG. 5 shows an example where bins that are pre-loaded based on upcoming SMT jobs are inserted into a component feeding position of the SMT pick and place machine.

FIG. 5 shows a schematic view of pre-loaded bins 510 (e.g., pre-loaded based on component requirements of an upcoming SMT job) being inserted or loaded into component feeding positions 520, 530 and 540 of the pick and place machine 550. To pre-load the bins to improve, optimize or prepare for presentation at a port of the automated Surface Mount Device (SMD) warehouse based on upcoming SMT jobs, thereby ensuring that the components required for production of an SMT production unit are present when the bin is presented, the bin load units are redistributed within the same bin or between two or more different bins. The advantage is that bins can be pre-loaded for upcoming SMT jobs, and the retrieval time in the tower can be reduced by placing bins required for the next upcoming SMT job close to the port and certain components can be distributed in different automated Surface Mount Device (SMD) warehouses. In some embodiments, the bins might comprise pallets that in turn comprise component tape reels and optionally a matching SMT feeder. In some aspect of the technology disclosed, the bin might be adapted with an alphanumerical display controller that is adapted to receive display data by wired or wireless communication, wherein the data might be relating to an upcoming SMT job and displayed to the operator. The data may include: the position at the pick and place machine where the bin should be inserted; time or date; the number of remaining components remaining in the bin; an alert to replace the bin or manually refill the bin with bin load units; or other alarm conditions relating to production of SMT production units. The information (e.g., component requirements) used to pre-load bins and present bins at a port of the automated Surface Mount Device (SMD) warehouse might be entered by the operator via a input/output device comprised in the automated Surface Mount Device (SMD) warehouse or obtained from the SMT information database, either actively retrieved by request/reply or pushed from the SMT information database or other node connected to the communication network. When the automated Surface Mount Device (SMD) warehouse receives a bin, the processor comprised in the automated Surface Mount Device (SMD) warehouse stores, in a memory, the position at which the bin is stored to a memory (e.g., in automated Surface Mount Device (SMD) warehouse).

Figure 8A:
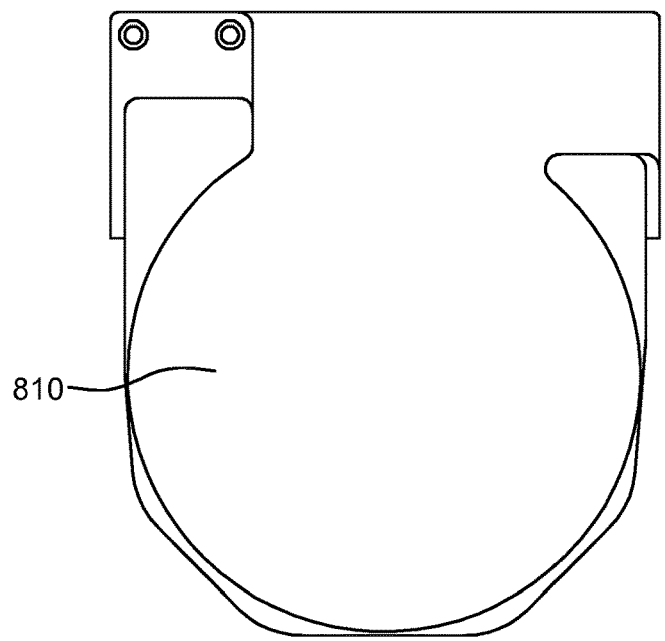
FIG. 8a shows an example of a pallet.

In some aspect of the technology, disclosed bins might be brought to a designated intermediate redistribution area where bin load units might be redistributed within or between two or more bins by the use of an actuator such as a robot. FIG. 8a shows an example of a pallet 810.

Figure 8B:
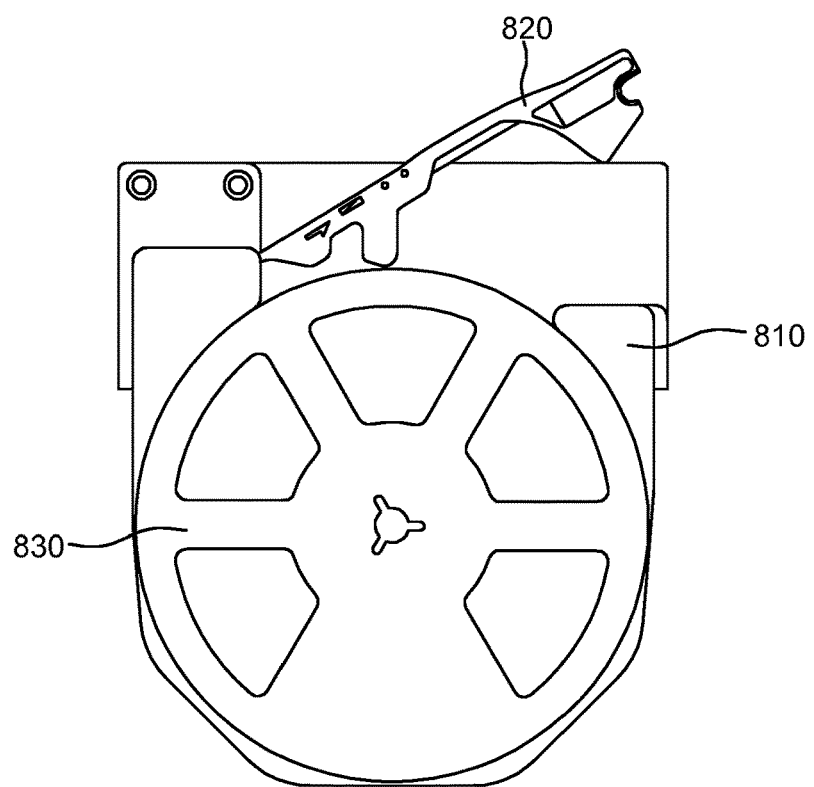
FIG. 8b shows an example of a pallet comprising a component tape reel and an SMT feeder.

FIG. 8b shows an example of a pallet 810 comprising a component tape reel 830 and an SMT feeder 820.

Figure 9:
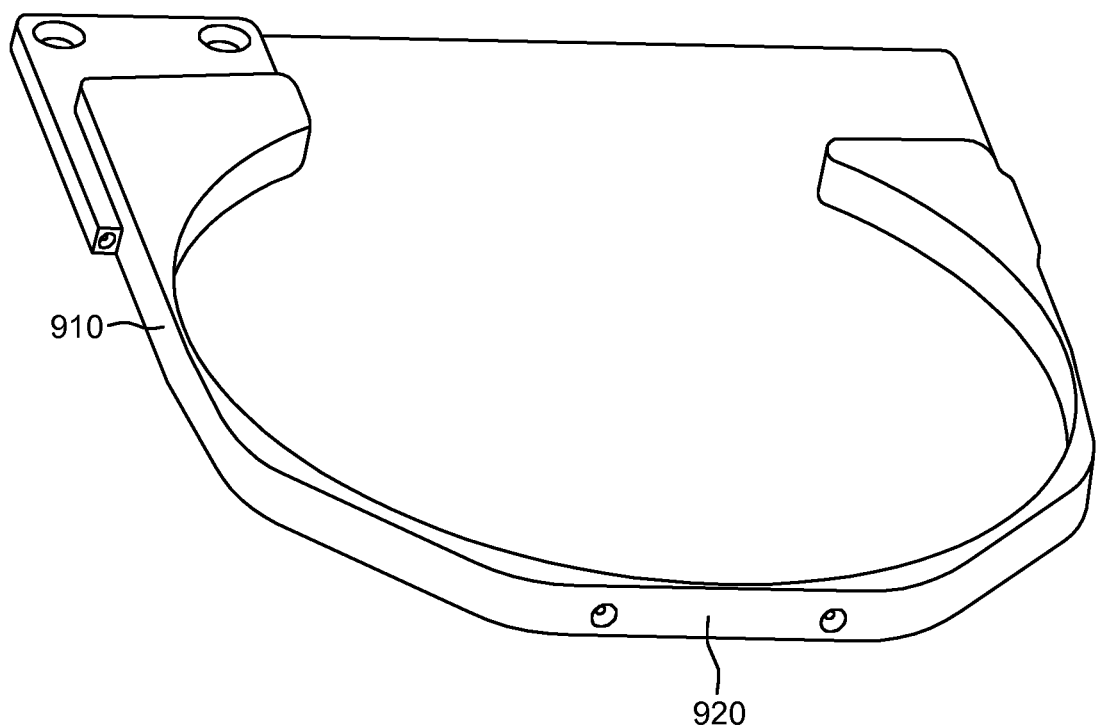
FIG. 9 shows an example of a pallet adapted with an X axis component tape reel retainer and a Y axis component tape reel retainer, wherein said X, Y, Z axis retainers are adapted to allow said component tape reel rotate.

FIG. 9 shows an example of a pallet, wherein said pallet is adapted to comprise a backplane, an X axis component tape reel retainer 910, and a Y axis component tape reel retainer 920. The X and Y axis retainers 910 and 920 are adapted to allow said component tape reel to rotate. The retainers 910 and 920 restrict movement of a component tape reel along the X axis and Y axis.

Figure 10A:
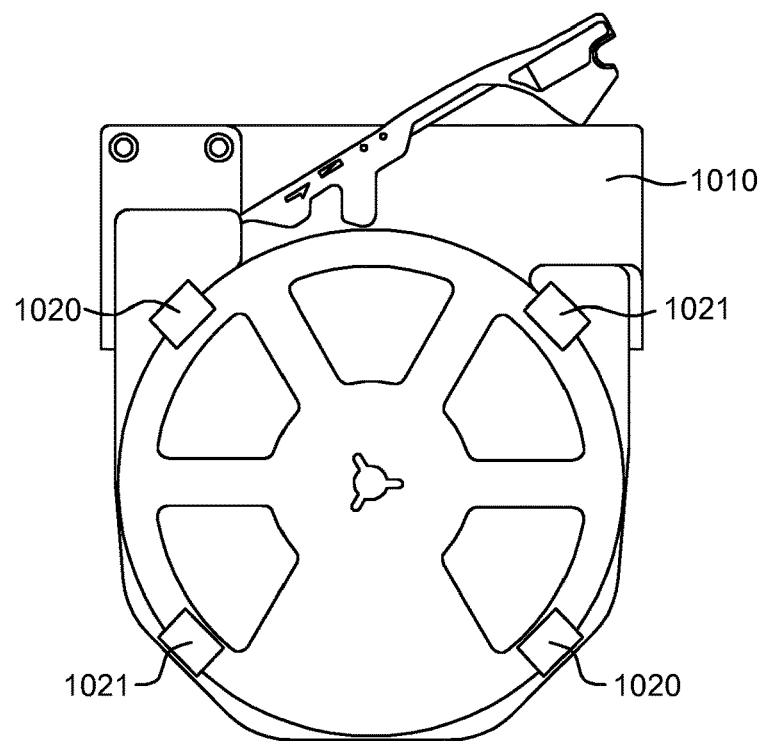
FIG. 10a shows an example of a pallet adapted with a Z-axis component tape reel retainer, wherein the Z-axis component tape reel retainer comprises a backplane and a peripheral Z-axis component tape reel retainer.

FIG. 10a shows an example of a pallet, wherein said pallet is adapted to comprise a backplane 1010, a combined reel-peripheral support structure in the form of an X axis component tape reel retainer, a Y axis component tape reel retainer 1 and a Z axis component tape reel retainer 1020/1021, wherein said X, Y, Z axis retainers are adapted to allow said component tape reel rotate. The retainers restrict movement of a comprised component tape reel along the X-axis, Y-axis and Z-axis.

Figure 10B:
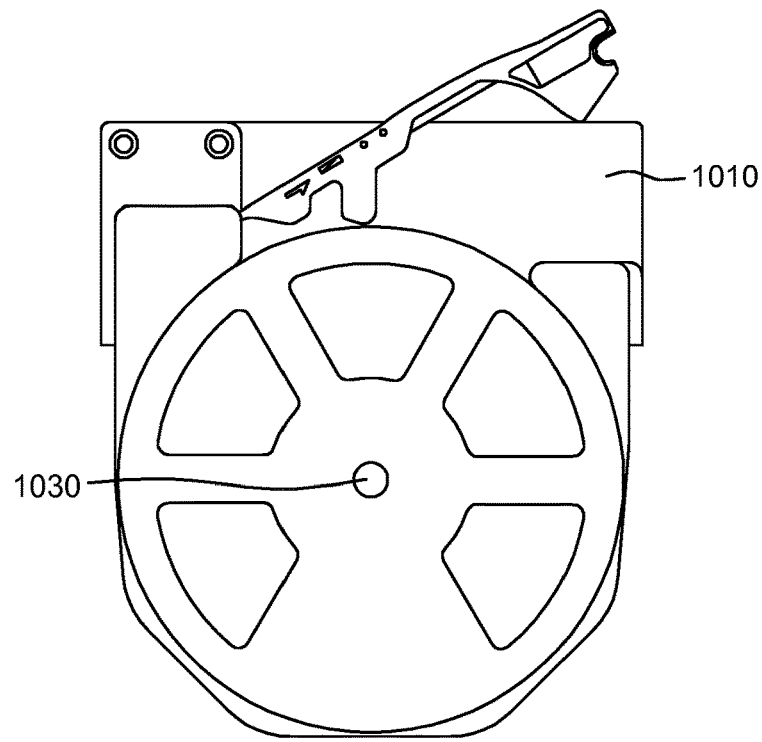
FIG. 10b shows an example of a pallet adapted with a Z-axis component tape reel retainer, wherein the Z-axis component tape reel retainer comprises a backplane and a central Z-axis component tape reel retainer.

FIG. 10b shows yet an example embodiment of the invention, wherein said Z-axis component tape reel retainer comprises a backplane and a nave or central Z-axis component tape reel retainer 1030. In yet another aspect of the technology disclosed said Z-axis component tape reel retainer comprises a backplane and a central Z-axis component tape reel retainer.

Figure 12A:
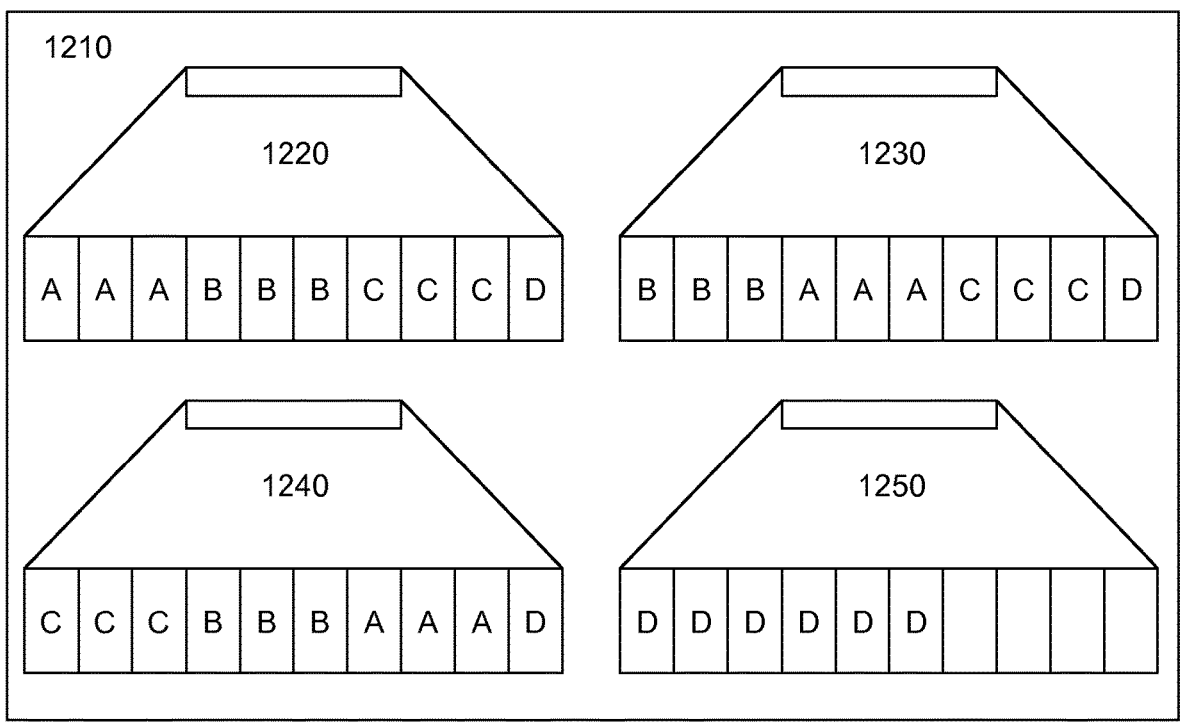
FIG. 12a and FIG. 12b shows schematically how bin loading units are redistributed between two or more stored bins in the automated Surface Mount Device (SMD) warehouse (e.g., based on component requirements of upcoming SMT jobs).
Figure 12B:
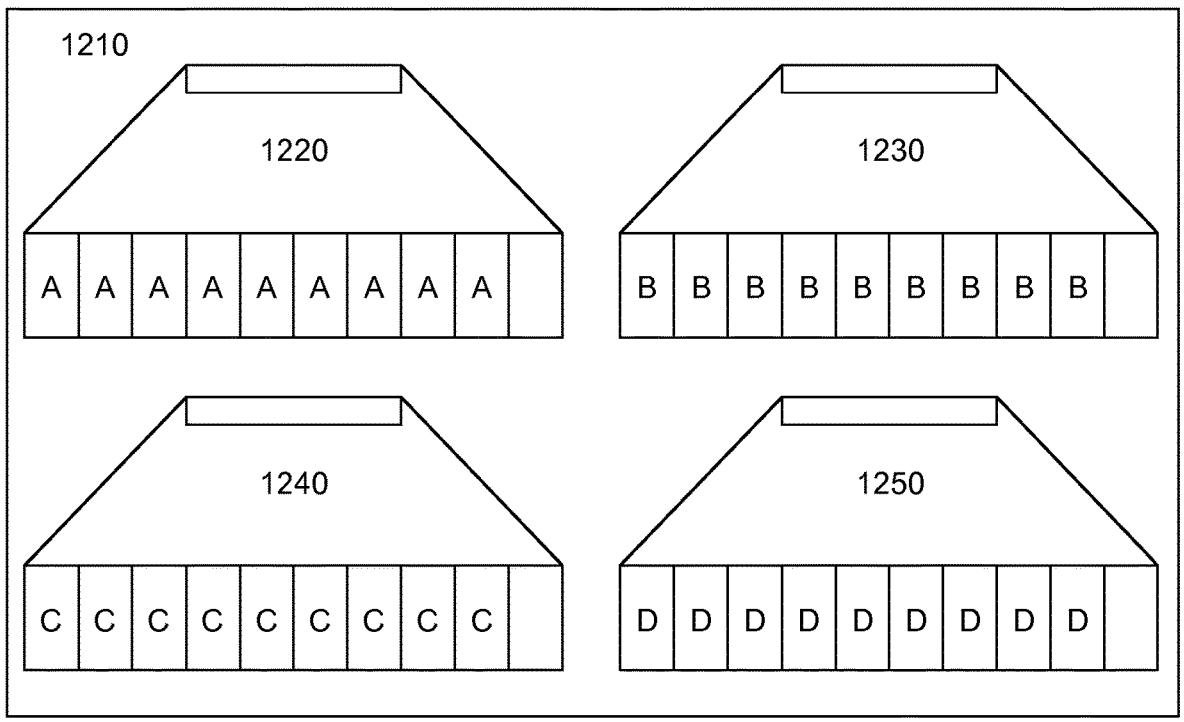

FIGS. 12a and 12b shows schematically how in an embodiment, bin loading units, denoted by letters A-D in FIGS. 12a and 12b, are redistributed among two or more stored bins in the automated Surface Mount Device (SMD) warehouse based on, for example, component requirements of upcoming SMT jobs. In this example, FIG. 12b illustrates how bins 1220-1250 are pre-loaded based on the component requirements of upcoming SMT jobs (e.g., job A, job B, job C and job D), and FIG. 12a illustrates the bin loading units after being redistributed among the two or more stored bins in the automated SMD warehouse according to the upcoming SMT jobs.

Figure 13:
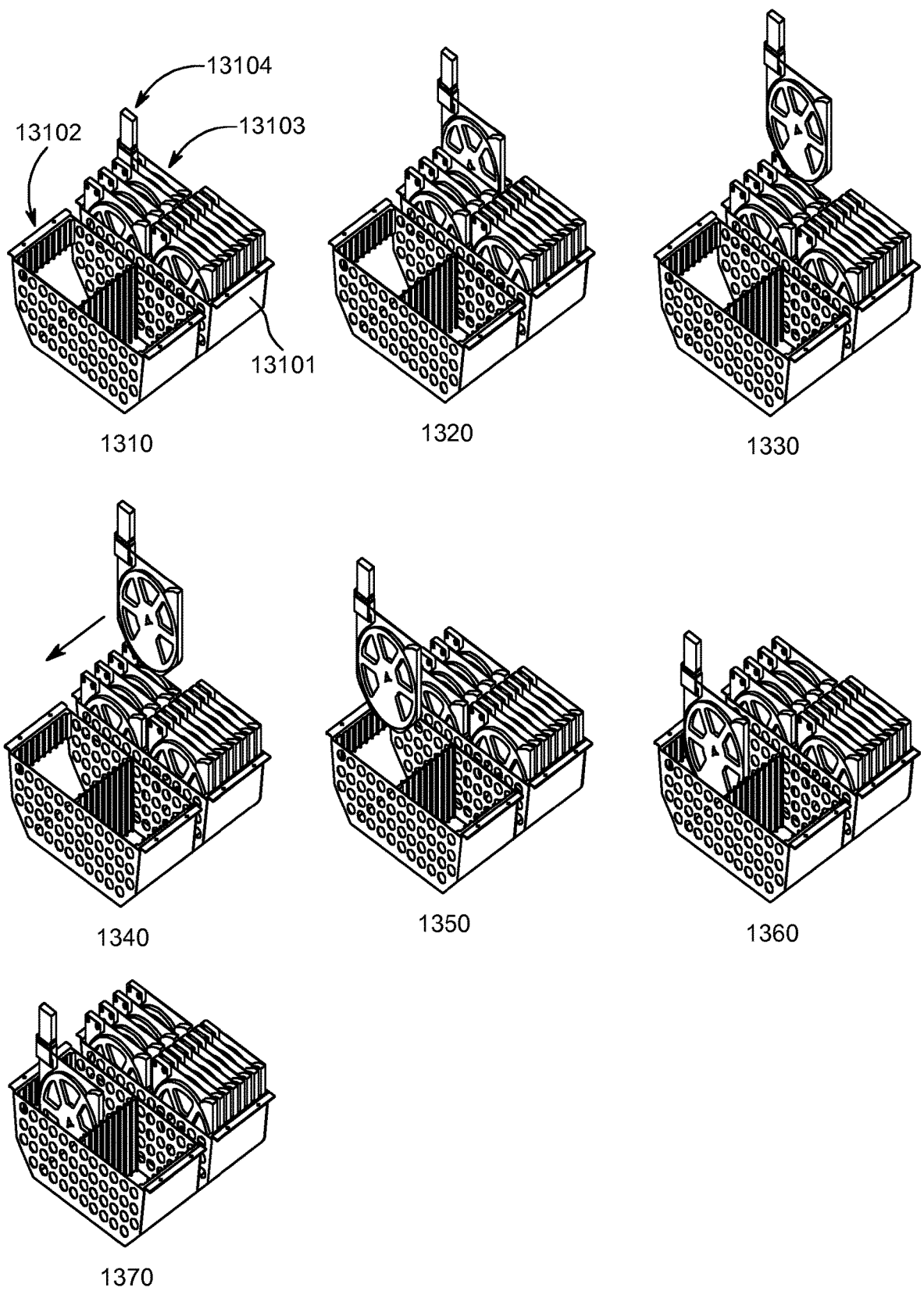
FIG. 13 shows schematically how bin loading units may be redistributed between two or more stored bins in the automated Surface Mount Device (SMD) warehouse (e.g., by being brought to a designated intermediate redistribution area where bin load units might be redistributed).

FIG. 13 shows an example of how bin loading units may be redistributed between two or more stored bins in the automated Surface Mount Device (SMD) warehouse (e.g., by being brought to a designated intermediate redistribution area where bin load units might be redistributed). Referring to FIG. 13, the actuator or robotic arm 13104 of the automated Surface Mount Device (SMD) warehouse grips a load unit 13103 in a first bin 13101 and moves the load unit 13103 to a compartment in a second bin 13102 as illustrated by image sequence 1310 through 1370 in FIG. 13.

Figure 14A:
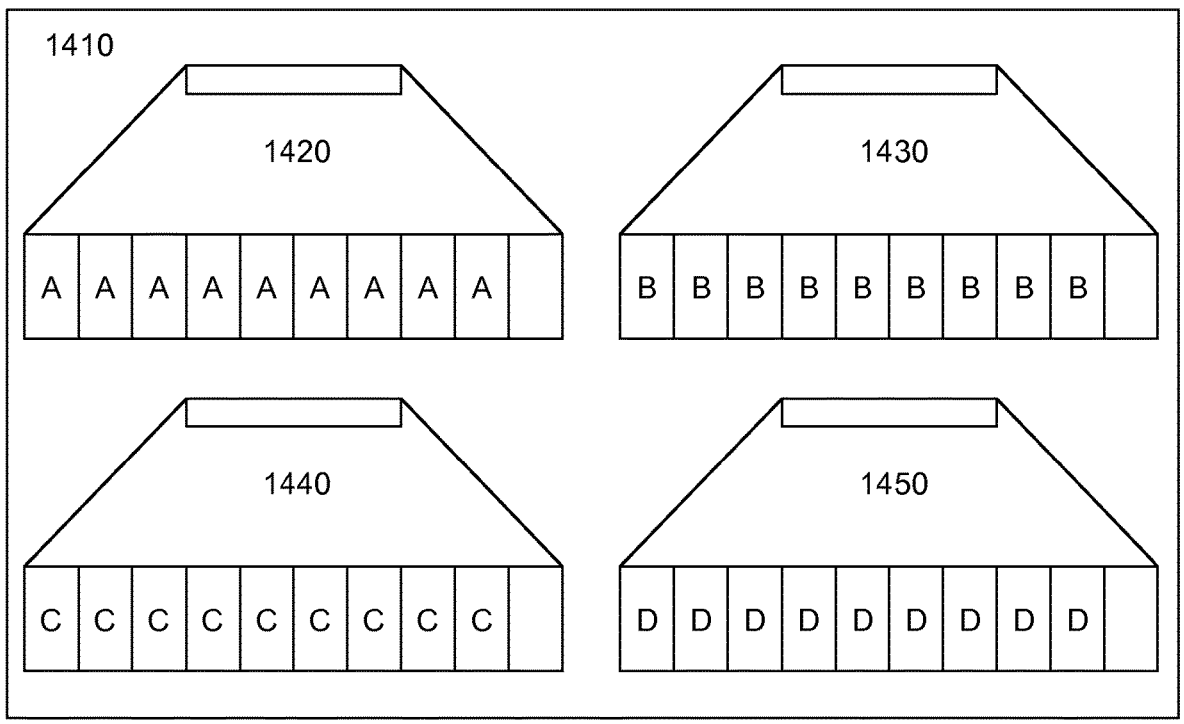
FIGS. 14a and 14b shows schematically how bins are redistributed between positions in the automated Surface Mount Device (SMD) warehouse (e.g., based on component requirements of upcoming SMT jobs).
Figure 14B:
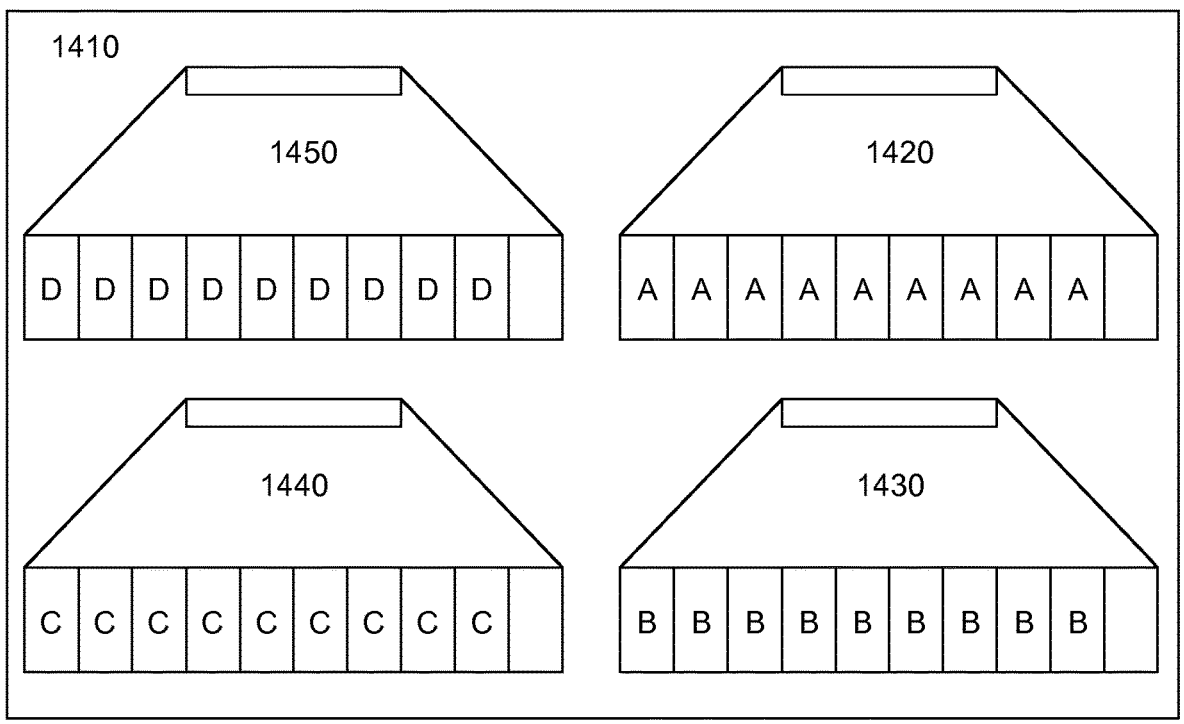

FIGS. 14a and 14b shows an example of how bins may be redistributed between positions in the automated Surface Mount Device (SMD) warehouse based on component requirements of upcoming SMT jobs. In one example, a SMT job list or sequence of job D, job A, job C and job B are to be performed. By redistributing the bins from the arrangement shown in FIG. 14a to the arrangement shown in FIG. 14b, the retrieval time for the bin pre-loaded for SMT job D can be reduced as the distance to the port is reduced.

Figure 16:
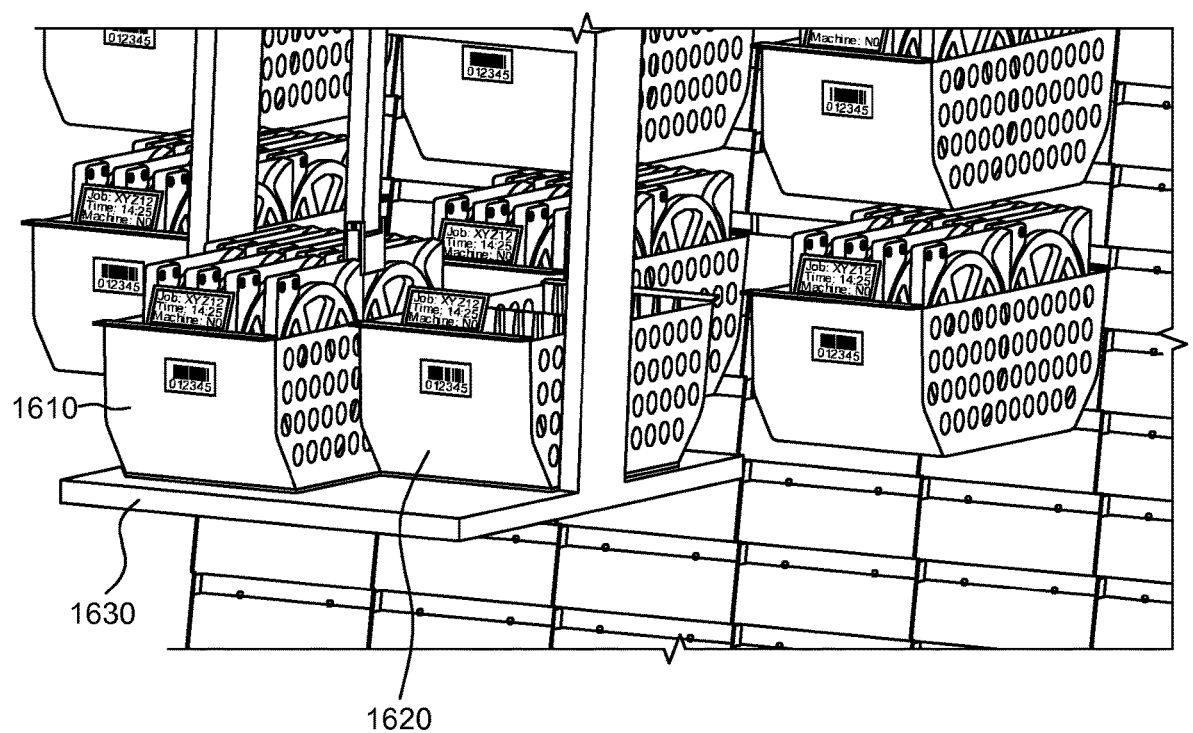
FIG. 16 shows schematically how bin load units in a bin are redistributed between storage positions using a table.

FIG. 16 shows an example of how bin load units are automatically redistributed between positions in the automated Surface Mount Device (SMD) warehouse using a table 1630. Referring to FIG. 16, a first stored bin 1610 is retrieved to the table 1630 attached to an actuator in said automated Surface Mount Device (SMD) warehouse, and said actuator is moved to a position of a second stored bin 1620 within said automated Surface Mount Device (SMD) warehouse. The second bin 1620 is retrieved to the table 1630, and the bin load units are automatically redistributed between positions in the automated Surface Mount Device (SMD) warehouse using a table by redistributing bin load units from said first bin 1610 to said second bin 1620.

Figure 17A:
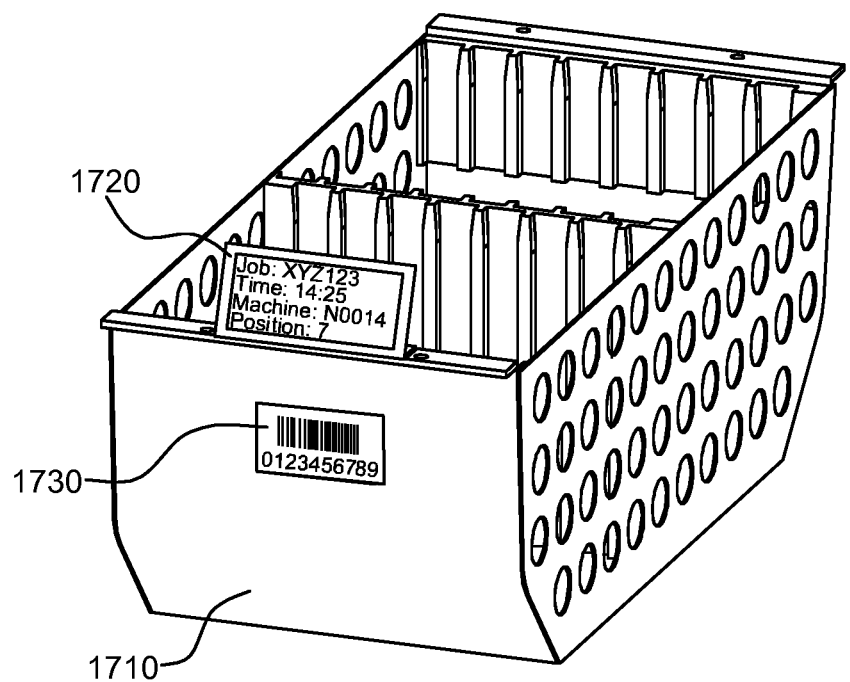
FIG. 17a shows an embodiment of the invention, wherein a bin is configured with a display with an integrated display controller and an identity tag in form of a barcode is attached to said bin such that a bin ID can be obtained by scanning the tag.

FIG. 17a shows an embodiment of the invention, wherein a bin 1710 is configured with an alphanumerical display 1720 with an integrated alphanumerical display controller, and an identity tag 1730 attached to the bin 1710 such that a bin ID can be obtained. In one example, this identity tag 1730 is a barcode.

Figure 17B:
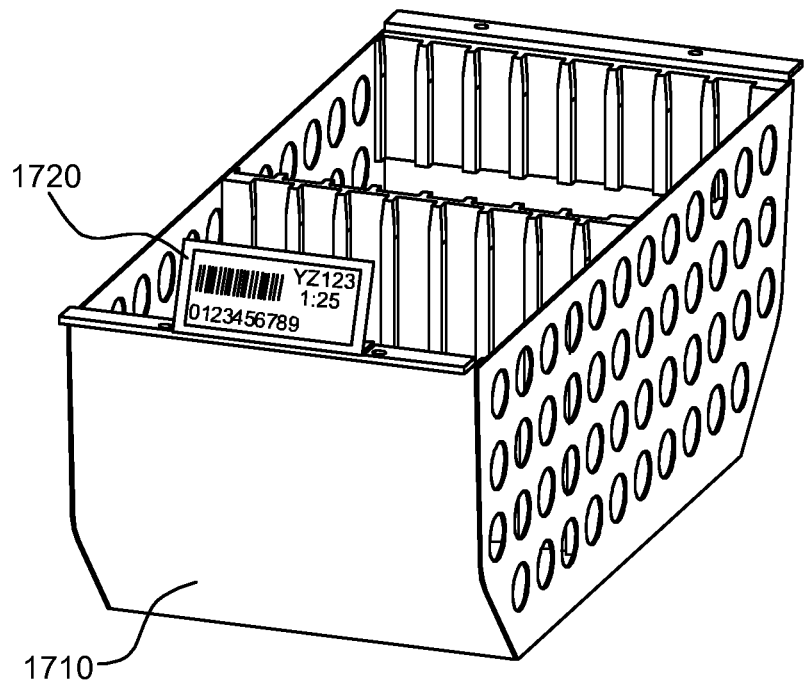
FIG. 17b shows yet an embodiment of the invention, wherein a bin is configured with a display/electronic label with an integrated display controller, where display data comprises a bin ID in form of an electronically displayed barcode that can be scanned by a barcode scanner in order to obtain the bin ID.

FIG. 17b shows an embodiment of the invention, wherein a bin 1710 is configured with an alphanumerical display 1720 with an integrated alphanumerical display controller, wherein display data on the alphanumerical display comprises a bin ID, wherein said bin ID is presented as a barcode, QR code or the like. Thus, the alphanumerical display 1720 also functions as an identity tag of the bin. In one or more embodiment, the communications network ID of the alphanumerical display 1720, used to send data to and receive data from the alphanumerical display controller, is identical to the bin ID.

Figure 18:
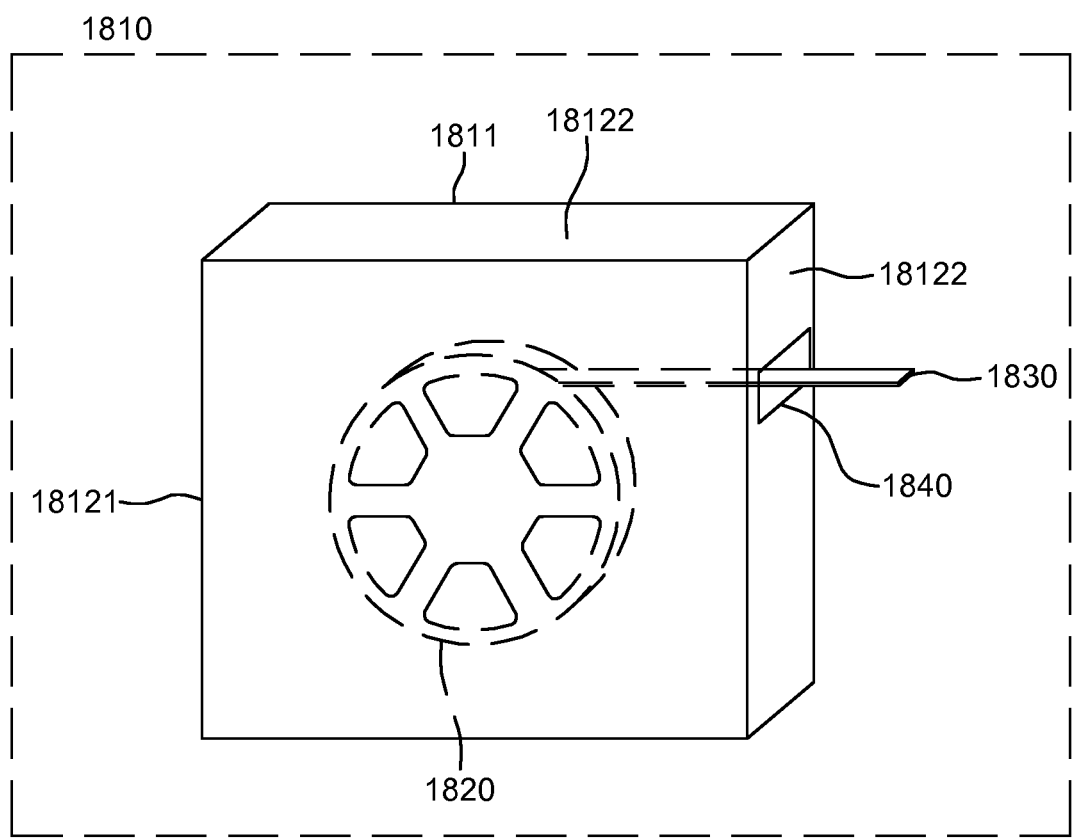
FIG. 18 shows an embodiment of a pallet, wherein the pallet comprises a backplane and a component tape reel retainer structure in the shape of a box.

FIG. 18 shows an embodiment of a pallet 1810.

Referring to FIG. 18, the pallet 1810 comprises a backplane 1811 and a component tape reel retainer structure in the shape of a box. The box is configured with a bottom 18121, four side walls 18122 and a slit 1840 configured to allow a component tape 1830 on a component tape reel 1820 protrude through the slit 1840. In one or more embodiments, the pallet 1810 further comprises a friction break (not shown) configured to engage upon removal of said palette from said SMT pick and place machine, hereby suppressing and/or preventing unwinding of the tape when the reel is no longer feeding components to a pick-and-place machine.

The inventors have realized that with the rising complexity of SMT production comes a greater need for quality data. High part number count, a wide variety of boards, and an ever-changing production schedule are constant challenges that require improved system support and control of information handling. Through embodiments presented herein, there is achieved efficiency and service level from a customer or operator point of view, in the performing any or all of the steps of planning, associating, loading, replenishing and/or unloading as part of an SMT production process.

FIGS. 19a-19d show schematically how planning, associating, loading, replenishment and unloading may be performed in accordance with a use case example of a typical workflow in a SMT system.

Referring to FIGS. 19a-19d, a planning user starts the workflow by planning an SMT job to be executed, and stores said SMT job in an SMT information database. In a use case example referring to FIG. 19a, a planning operator uses an SMT planning tool, for example, a graphical user interface of a computer program that is adapted to help the user optimize the job sequence and changeover strategy for incoming orders to plan an SMT job. The outcome of the planning is typically a bill of materials 1910 (also referred to herein as SMT job data). The bill of material/SMT job data is sent to the automated SMD warehouse 1912 (e.g., corresponding to the SMD warehouse 93 discussed herein).

In response to receiving the bill of materials/SMT job data, the automated SMD warehouse 1912 automatically delivers bin load units 1914 (e.g., in the form of any of the bin load units 420, 620, 630, 640, 650, 720 described herein). In this use case example, the bin load units 1914 are in the form of component tape reels. Typically, the bin load units delivered from the automated SMD warehouse are already in the correct order for loading into bins. An SMT operator (e.g., a human being or alternatively a robot) then retrieves the bin load units that are delivered from said automated Surface Mount Device (SMD) warehouse, and possibly also substrates from separate storage or from said automated Surface Mount Device (SMD) warehouse. In the use case example, the SMT operator retrieves component tape reels from the automated SMD warehouse 1912, and prepares the component tape reels for loading into the pick and place machine 1924. In order to be able to trace the component tape reels, the preparations include a step of associating the ID of each component tape reel with the ID of a feeder 1919. The SMT operator performs this association by scanning each component tape reel and a corresponding feeder using an identity tag scanner 1918. Through scanning of the unique IDs, the SMT system records the movement of the scanned components. Accordingly, components are automatically traced.

When the bin load units have been associated with the feeders, the SMT operator places the one or more associated component pairs into a bin 1920. The bin may, for example, correspond to any of the bins 410, 510, 610 or 710 discussed herein. When a bin is ready, the SMT operator places/loads the bin in the pick and place machine 1924. The pick and place machine may correspond to any of the pick and place machines (e.g., 91, 550) discussed herein.

Figure 19A:
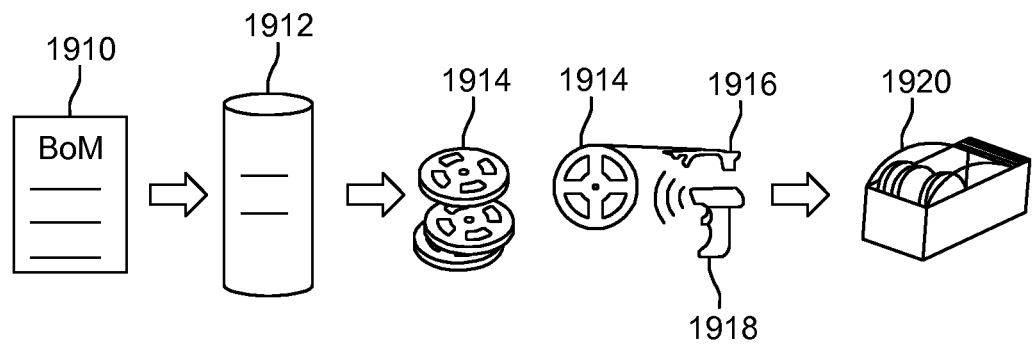
FIGS. 19a-19d show schematically how planning, associating, loading, replenishment and unloading may be performed in accordance with a use case example of a typical workflow in a SMT system.
Figure 19B:
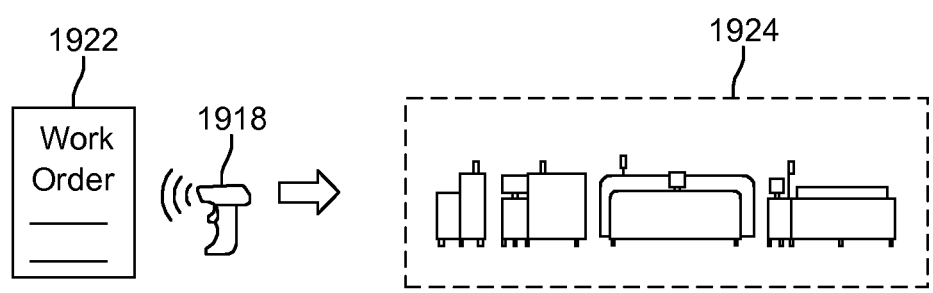

In order for the pick and place machine to know which settings are to be used, SMT job data from the planning step is provided to the pick and place machine, either directly from the planning tool or by the SMT operator scanning the barcode of a work order 1922, using a scanner 1918, comprising the required information/SMT job data. This is illustrated in FIG. 19b.

Based on the input SMT job data, machine programs are selected automatically, as are conveyor width and loader/unloader settings. In other words, loading into the pick and place machine is fast and easy for the SMT operator as it requires no manual data entry—just one or two scans of barcodes or other identifiers. As soon as the line is up and running, the SMT operator is free to start preparing the next SMT job. Also, as all bins and feeders are given a unique ID, the SMT operator can check quantity, location, MSD data and batch codes, for a single component or a complete component list for an SMT job, at any point during production.

Figure 19C:
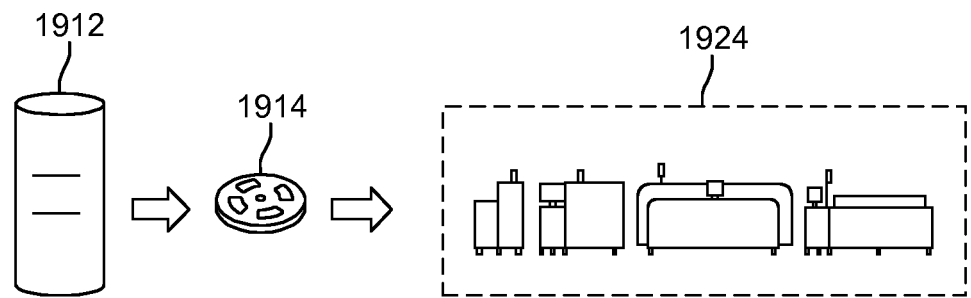

If, at any time, components are about to run out, the machine alerts the operator, re-optimizes and continues mounting other components. The SMT operator that notices such an alert may, for example, press a "provide" button or the like, whereby the SMD warehouse 1912 immediately delivers the requested component/components 1914 for the SMT operator to retrieve, associate and load into the pick and place machine 1924 to replenish the machine. This is illustrated in FIG. 19*c*. Advanced SMT system of today, such as the system embodiments described herein, may also have a plug-and-play simplicity, which means that the SMT operator can load and unload bins in seconds, saving countless hours of operator time. Specially designed software automatically recognizes the presence, absence and location of components, which means that there is no need to program pick positions and production does not stop if a bin runs out of parts.

Figure 19D:
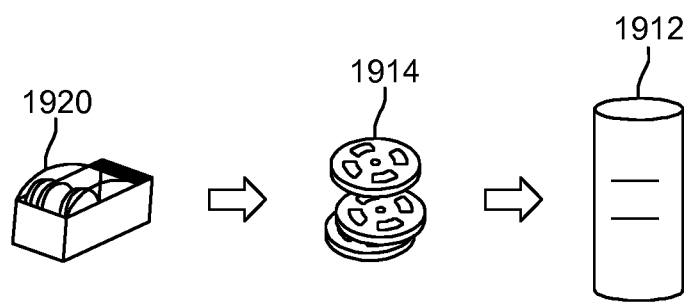

As illustrated in FIG. 19*d*, when an SMT job is done, or when the work day ends, the SMT operator unloads the bins 1920 from the pick and place machine, removes the component tape reels 1914 from the bin and places them back into an SMD warehouse 1912, which can be the same as the one from where the components where retrieved or a different one. As each component has an identifier, the system keeps track of the components and mix-ups are avoided.

Embodiments of the invention may improve parts or all of the SMT production workflow, as further described herein.

FURTHER ADVANTAGES OF THE INVENTION

The technology disclosed relates to methods, systems and devices for handling of components in an SMT system, and changing and/or providing display data information regarding an SMT job to an SMT system operator, thereby providing reduced probability of inserting non-required components in an SMT pick and place machine and improved preparations of refill of components in a SMT pick and place machine. Further, the technology disclosed relates to methods, systems and devices for changing display data on a display and providing information related to an ongoing or upcoming SMT job from an operator to an SMT information database, thereby providing reduced probability of inserting non-required components in an SMT pick and place machine and improved preparations of refill of components in a SMT pick and place machine during changeovers and replenishment work.

Figure 3:
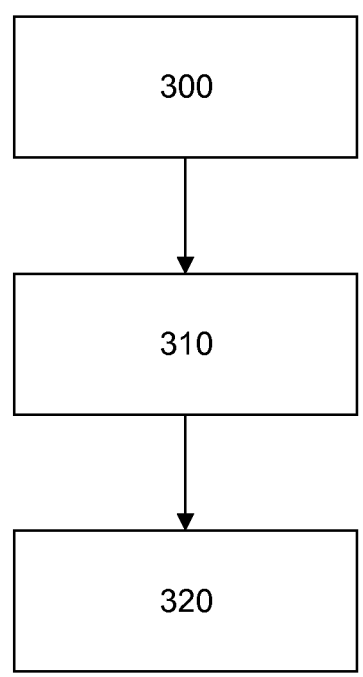
FIG. 3 shows a method in an SMT system for presenting a retrieved bin at a port of an automated Surface Mount Device (SMD) warehouse.
Figure 4:
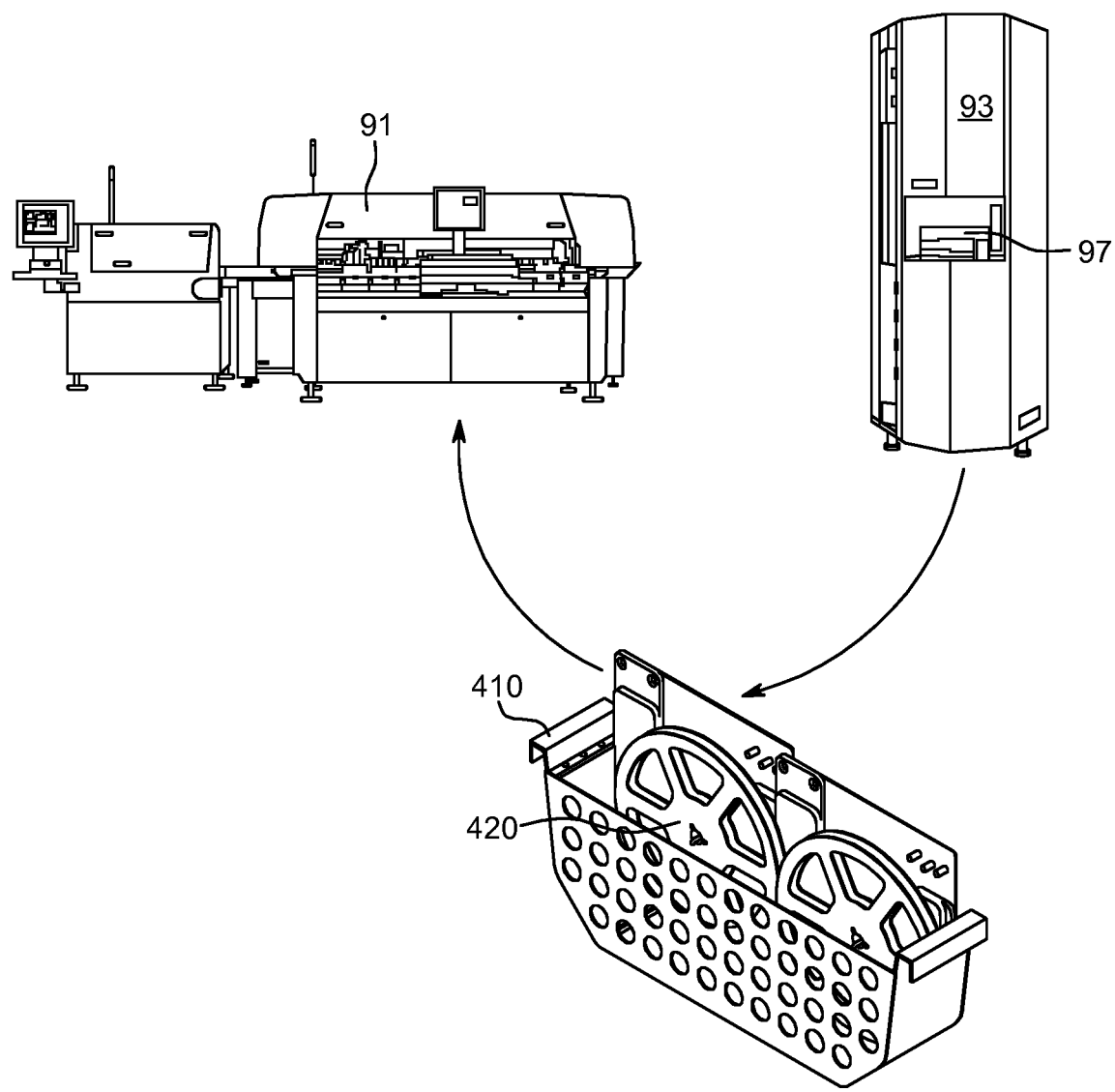
FIG. 4 shows bins, which are pre-loaded based on upcoming SMT jobs are retrieved at an automated surface mount device (SMD) warehouse and inserted into a component feeding position of the SMT pick and place machine.
Figure 20:
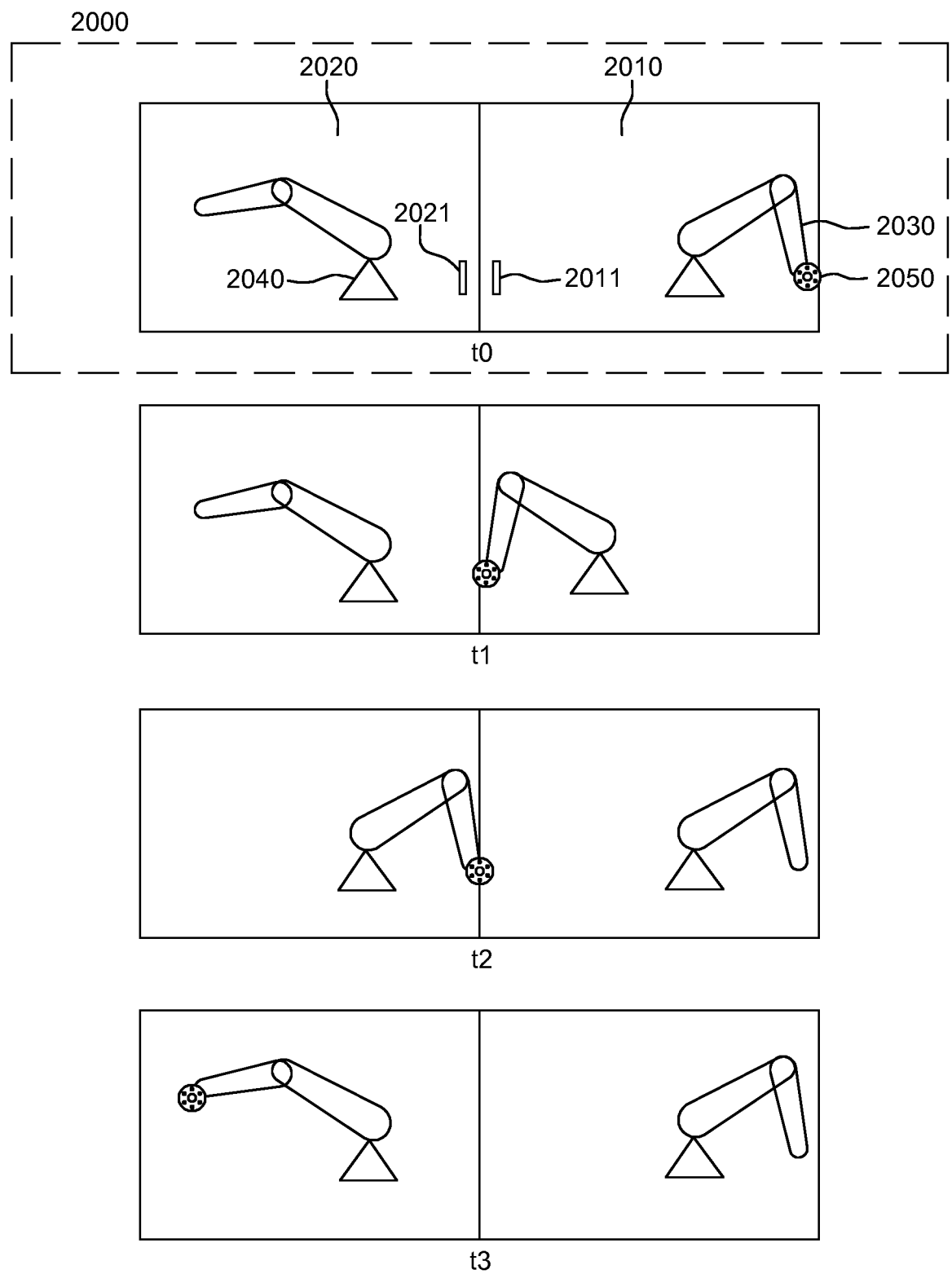
FIG. 20 illustrates an example of a time sequence of how bin load units may be redistributed between a first and a second automated Surface Mount Device (SMD) warehouse in an integrated automated Surface Mount Device (SMD) warehouse cluster.

FIG. 3 shows a method for presenting a retrieved bin at a port of an automated Surface Mount Device (SMD) warehouse in Surface-mount technology (SMT) system. FIG. 20 illustrates an example of a time sequence on how bin load units may be redistributed between a first and a second automated Surface Mount Device (SMD) warehouse in an integrated automated Surface Mount Device (SMD) warehouse cluster.

Identifying a Bin in an SMT System

When an operator is returning a bin to the automated Surface Mount Device (SMD) warehouse, there is a need to determine the bin load units in the bin by scanning a bin ID and retrieving the associated bin load units' ID, such as pallet ID, component tape reel ID and SMT feeder ID, from an SMT information database. When an operator is retrieving a bin from the manual/automated Surface Mount Device (SMD) warehouse, there is a need to associate a bin ID with the bin load units' ID's, such as pallet ID, component tape reel ID and SMT feeder ID, by scanning a bin ID and storing the associated bin load units' ID's, such as pallet ID, component tape reel ID and SMT feeder ID, to an SMT information database. One or more aspect of the technology disclosed provides a method in an automated Surface Mount Device (SMD) warehouse configured to store bins at pre-determined positions within said automated Surface Mount Device (SMD) warehouse, the method comprising: receiving a bin at a port of said automated Surface Mount Device (SMD) warehouse; and scanning an identity tag (e.g., in form of an electronic display) attached to said bin to obtain a bin ID. In one or more aspect of the technology disclosed, the method further comprises: storing said bin at a position within said automated Surface Mount Device (SMD) warehouse. In one or more aspect of the technology disclosed, the method further comprises: storing said position and said bin ID in a memory of said automated Surface Mount Device (SMD) warehouse. One or more aspect of the technology disclosed describes a method in an automated Surface Mount Device (SMD) warehouse adapted to obtain information related to upcoming SMT jobs, to store bins at predetermined positions within said automated Surface Mount Device (SMD) warehouse, the method comprising: receiving a bin at a port of said automated Surface Mount Device (SMD) warehouse; scanning an identity tag attached to said bin to obtain a bin ID; storing said bin at a position within said automated Surface Mount Device (SMD) warehouse; and storing said position and said bin ID. In yet another aspect of the technology disclosed, the method further comprises: presenting said retrieved bin at a port of said automated Surface Mount Device (SMD) warehouse. In yet another aspect of the technology disclosed, said bins are adapted to comprise bin load units, wherein said bin load unit comprises at least a component tape reel. In yet another aspect of the technology disclosed, storing said position and said bin ID further comprises storing said position and said bin ID represented as parameters, such as a table, in a memory of said automated Surface Mount Device (SMD) warehouse. In yet another aspect of the technology disclosed, storing said position and said bin ID further comprises storing said position and said bin ID represented as parameters in an SMT information database via a communications network. In one or more embodiments, a bin is configured with an electronic display such as alphanumerical display, with an integrated display controller, and a printed identity tag attached to said bin such that information relating to an SMT job is displayed and a bin ID can be obtained by scanning (e.g., optically scanning a barcode) the printed identity tag. In one or more embodiments, a bin is configured with an electronic display such as an alphanumerical display with an integrated alphanumerical display controller, display data may comprise information about the reels carried by said bin and/or a bin ID, and said bin ID is presented as an optically scannable code such as a barcode, QR code or the like. In one or more embodiments, an alphanumerical display functions as an identity tag of the bin. In one or more embodiments, the communications network ID of the electronic display, used to send data to and receive data from the electronic display controller, such as an electronic alphanumerical display, is identical to the bin ID. In one or more embodiments, scanning comprises scanning an optically scannable code such as a barcode, QR code or the like, and the optically scannable code is presented on a printed label or an electronic display such as an electronic alphanumerical display. In one example, the electronic display (e.g., an electronic alphanumerical display) is attached to a bin and displays an electronic barcode representing a unique bin ID of the bin and/or that the electronic display is further representing and showing SMT job related information to the operator (e.g., information about each of the individual bin load units, such as component tape reels) stored in one of the compartments of the bin.

Conventional electronic shop/shelf label (ESL) systems are configured based on an infrared (IR) scheme, low frequency band communication, or radio frequency (RF) band communication. Such conventional ESL systems may have a degraded accuracy when reading or updating information of a plurality of ESL tags based on an environment of the store, for example, an obstacle within the store, and may increase complexity and/or costs for facility infrastructure. More specifically, to update ESL tag information within the store (e.g., to update details), conventional ESL systems may use between one reader (or antenna) to tens of readers (or antennas) based on a radio communication scheme or a frequency difference. Also, when conventional ESL systems employ an IR scheme, a relatively large number of readers may be required, thereby increasing a facility costs and an area where reception is impossible may occur depending on the store environment. When the conventional ESL systems employ an RF scheme (e.g., at 2.4 GHz), reception may be impossible in certain areas depending on the store environment. In addition, due to a short battery lifespan, battery replacement costs may also be incurred. At least one example embodiment provides an electronic shelf label (ESL) system using radio frequency identification (RFID) that may store, in an ESL tag attached to a shelf, SMT job information received from an ESL server, thereby readily updating the details included in the ESL tag/display, and an operation method of the ESL system. At least one other example embodiment provides an ESL system using RFID that may obtain identification information of a bin load unit, such as a component tape or component tape reel positioned on a shelf, from a component tape recognition tag attached to the component tape, and provide the obtained identification information to an ESL server, thereby enabling a manager to readily plan and manage SMT-related jobs/actions involving the stored component tape (e.g., replenishment work, loading a bin with reels in the compartments of the bin, preparing for a SMT pick-and-place job) and to effectively manage and provide instructions related to the component tape and decrease a cost used for managing human resources, and an operation method of the ESL system. An ESL system using RFID, may include: an ESL tag to be attached to a shelf; and a radio tag reader to store, in the ESL tag, details received from an ESL server (e.g., originating from the SMT information database), in response to an SMT information update request from the ESL server (or SMT information database via a separate ESL system to the shelf tags/displays). An operation method of an ESL system using RFID may include: receiving details regarding an SMT job from an ESL server together with an SMT job information update request from the ESL server; storing the received details in an ESL tag attached to a shelf; and displaying the received details. An ESL tag according to one or more example embodiments may include, or be associated with, one or more pressure sensitive buttons to enable an operator to change the information displayed on the ESL tag and dynamically update SMT-job related information, which frequently varies. The pressure sensitive buttons may be used to confirm actions, trigger actions, and/or modify the content of the display itself.

Pressing of the pressure sensitive buttons may send an immediate trigger to an external system, or store information to be sent at a next scheduled communication event (e.g., a periodic communication event). The action may also be local and change between predefined information sets. In more detail, for example, an operator may use the pressure sensitive buttons to confirm an action related to the display (e.g., component picked from a shelf location) without using a barcode scanner (having both hands free for picking the related object). In another example, the operator may use the pressure sensitive buttons to change the displayed content immediately, for example, from component name to component quantity or next action for the object. According to one or more example embodiments, the pressure sensitive buttons may include one or several buttons, and may be mechanical, optical, electrical, touch screen, etc. In response to pressing of the pressure sensitive buttons, the ESL tag may inform a controlling system (e.g., base station and related software that a button on the ESL tag has been pressed) save the button pressed information to be available at the next scheduled communication event, and/or directly trigger a change in the display on the ESL tag between predefined messages. An ESL tag attached to a shelf may store details (e.g., SMT job related information) received from an ESL server, thereby readily updating the details included in and/or displayed on the ESL tag. FIGS. 26*a* through 26*f* illustrate various ESL tags according to example embodiments. As shown in FIGS. 26*a* through 26*f*, the ESL tags may include pick and place information, such as one or more of slot, kit name, location, bin name, bin barcode, component name, etc. The pick and place information may be arranged as desired on the ESL tag. According to one or more example embodiments, the ESL tags may be arranged on component shelves, bins, trolleys, bin load units, pallets, SMT pick and place machines, etc.

Figure 27:
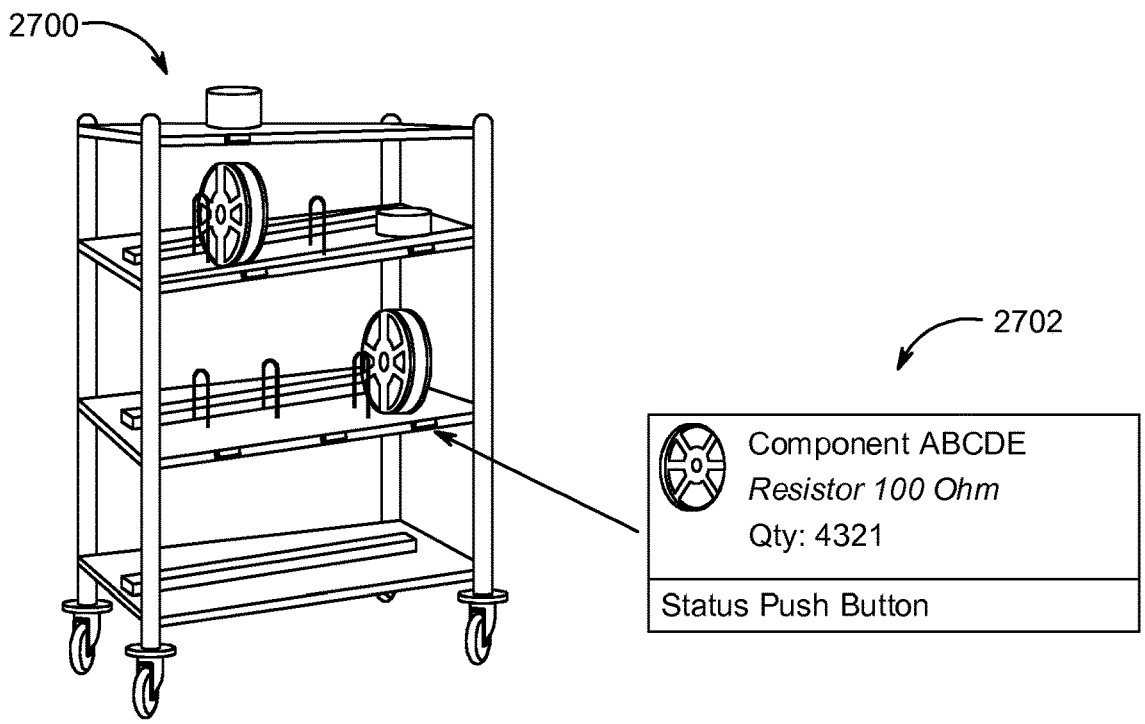
FIG. 27 illustrates a shelf along with an ESL tag arranged thereon.

FIG. 27 illustrates a component shelf 2700 along with an ESL tag 2702 arranged thereon. As shown, the ESL tag 2702 may include a component name, component type, quantity of components on the shelf, a container name associated with the component, and a barcode. The information provided to the ESL tag 2702 by an operator may be sent to the ESL server wirelessly.

Figure 24:
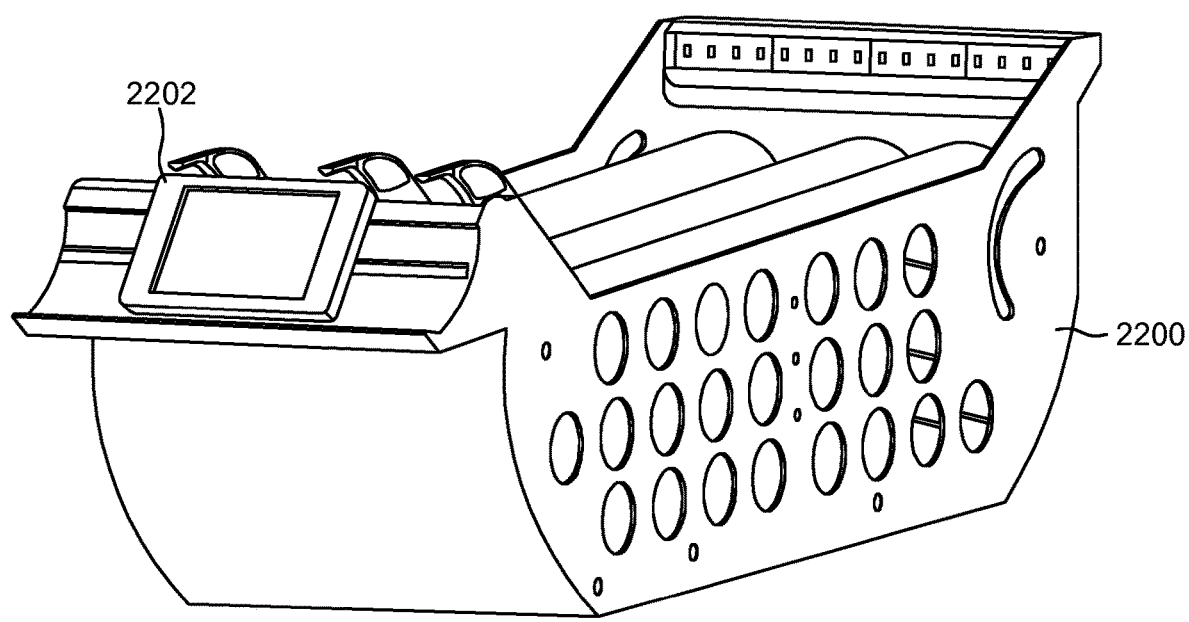
FIG. 24 is a perspective view of a bin having an electronic label/ESL tag arranged thereon.

FIG. 24 is a perspective view of a bin 2200 having an ESL tag 2202 arranged thereon.

Figure 22:
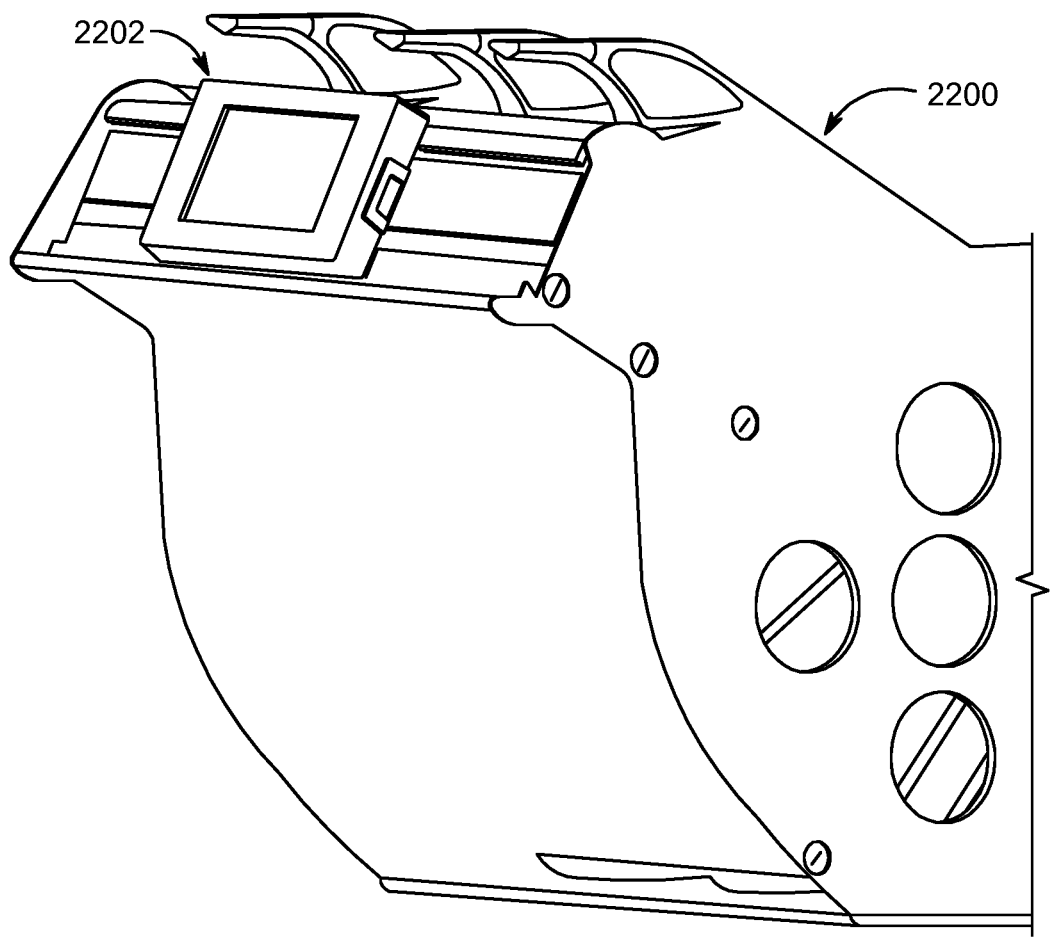
FIG. 22 is a perspective view of a portion of the bin shown in FIG. 24 with an electronic label/ESL tag arranged thereon.

FIG. 22 is a perspective view of a portion of the bin 2200 shown in FIG. 24 with the ESL tag 2202 arranged thereon.

Figure 23:
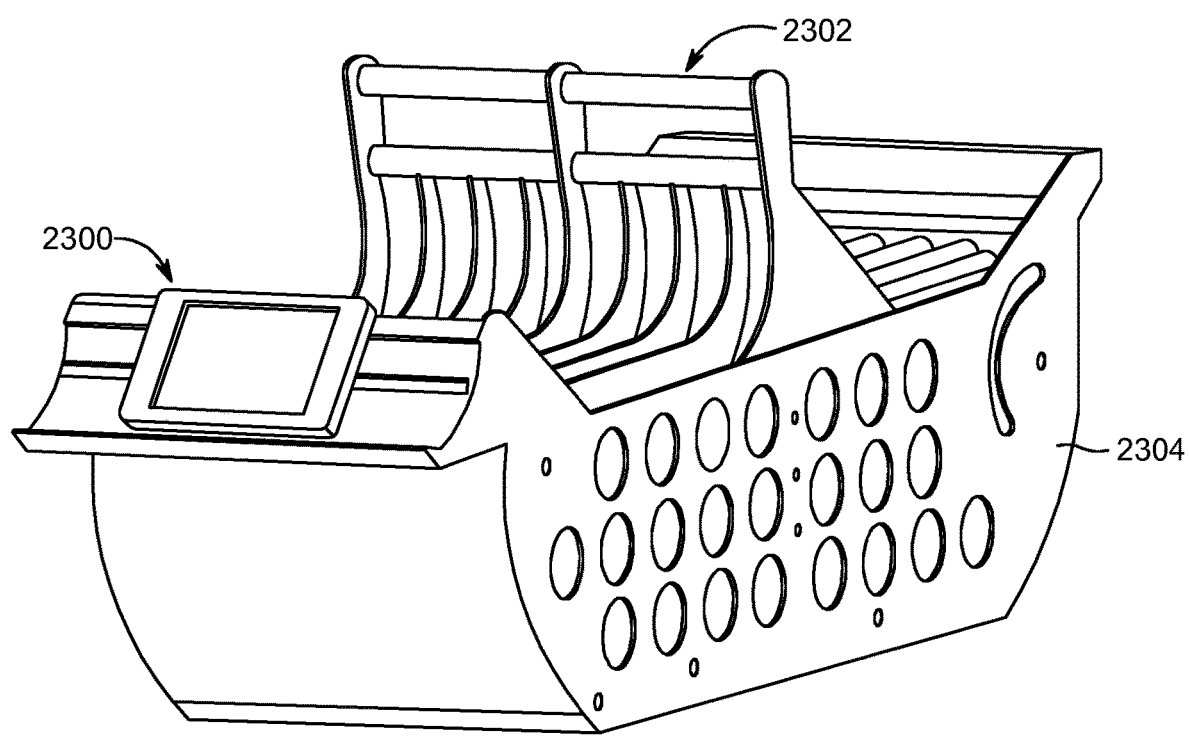
FIG. 23 is a perspective view of a bin including a magazine for holding component reels.

FIG. 23 is a perspective view of a bin 2304 including a magazine 2302 for holding component reels. As shown in FIG. 23, an ESL tag 2300 is arranged on the bin 2304.

Figure 25:
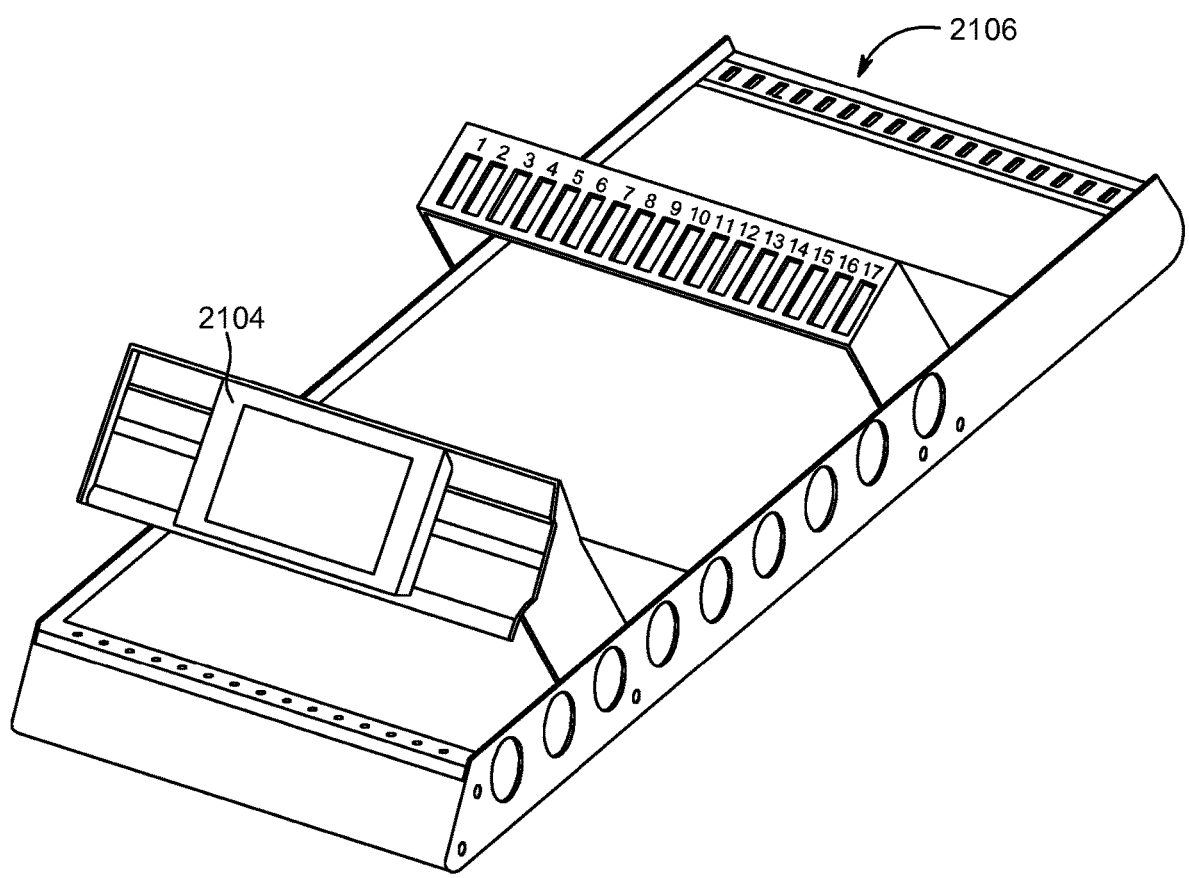
FIG. 25 is a perspective view of a stick magazine including an electronic label/ESL tag arranged thereon.
Figure 26A:
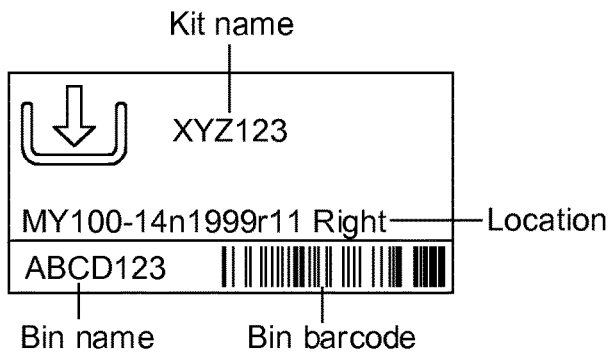
FIGS. 26a through 26f illustrate various examples of different types information on electronic labels/ESL tags attached to a bin or trolley for providing instructions or guidance to an SMT operator performing a kitting or loading job and according to different embodiments of the technology disclosed.
Figure 26B:
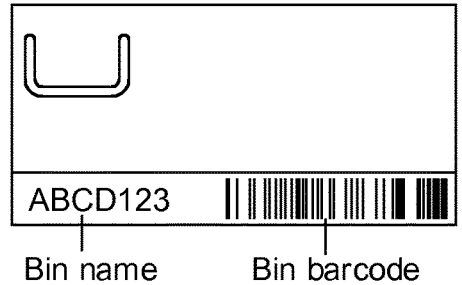
Figure 26C:
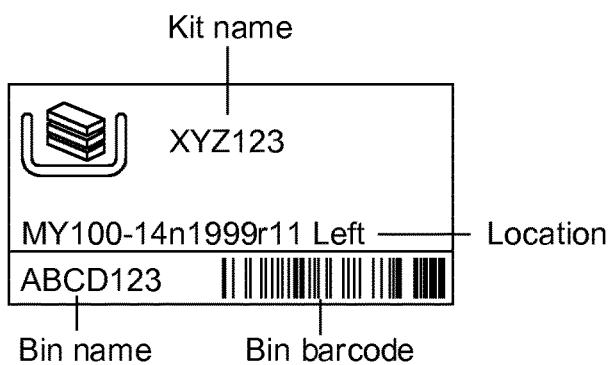
Figure 26D:
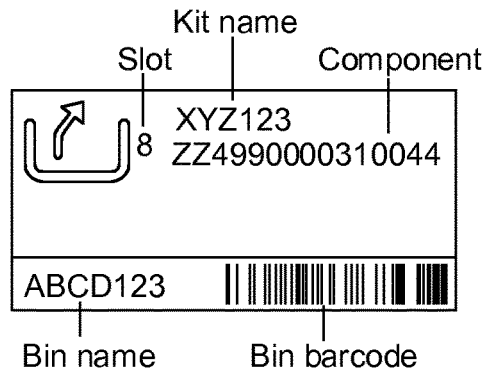
Figure 26E:
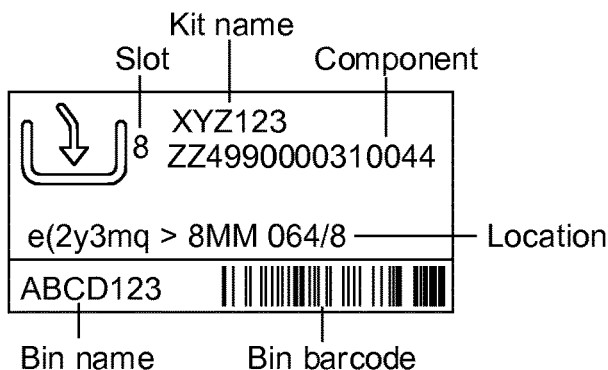
Figure 26F:

FIG. 25 is a perspective view of a stick magazine 2106 including an ESL tag 2104 arranged thereon.

Figure 21:
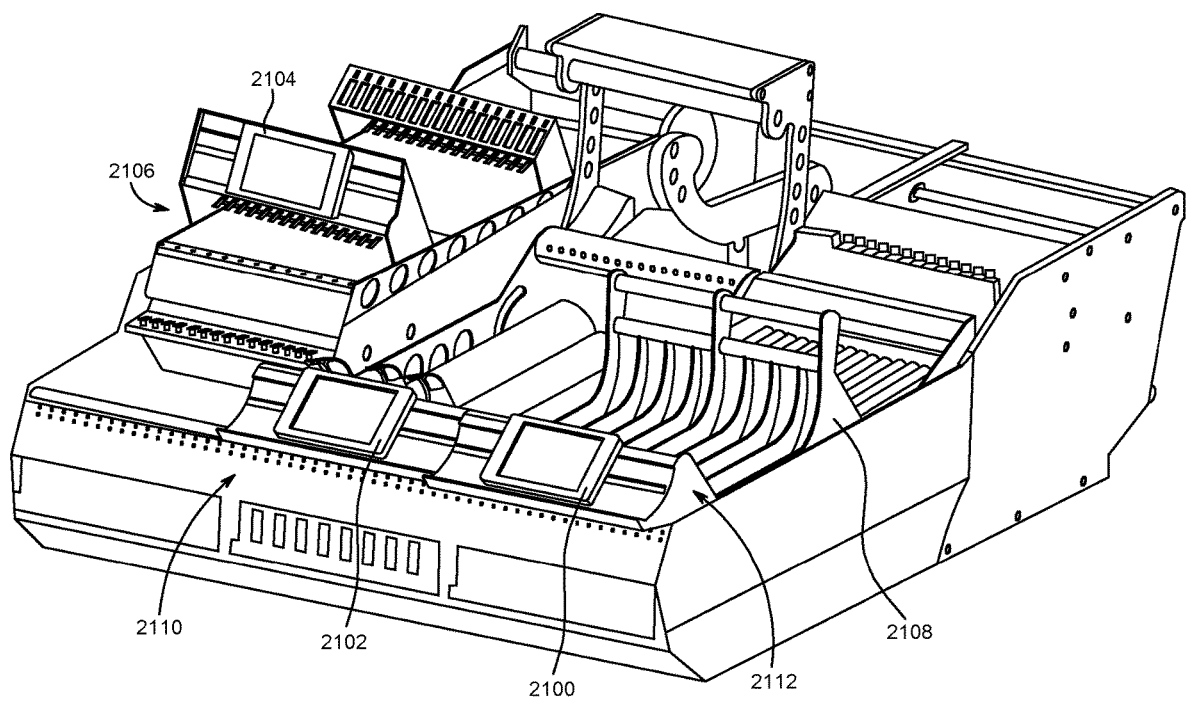
FIG. 21 illustrates a portion of a pick and place machine including two bins and a stick magazine.

FIG. 21 illustrates a portion of a pick and place machine including two bins 2110 and 2112 and a stick magazine 2106. As shown in FIG. 21, the bin 2110 has an ESL tag 2102 arranged thereon. The bin 2112 includes a magazine 2108, and has an ESL tag 2100 arranged thereon. The stick magazine 2106 has an ESL tag 2104 arranged thereon.

Figure 29:
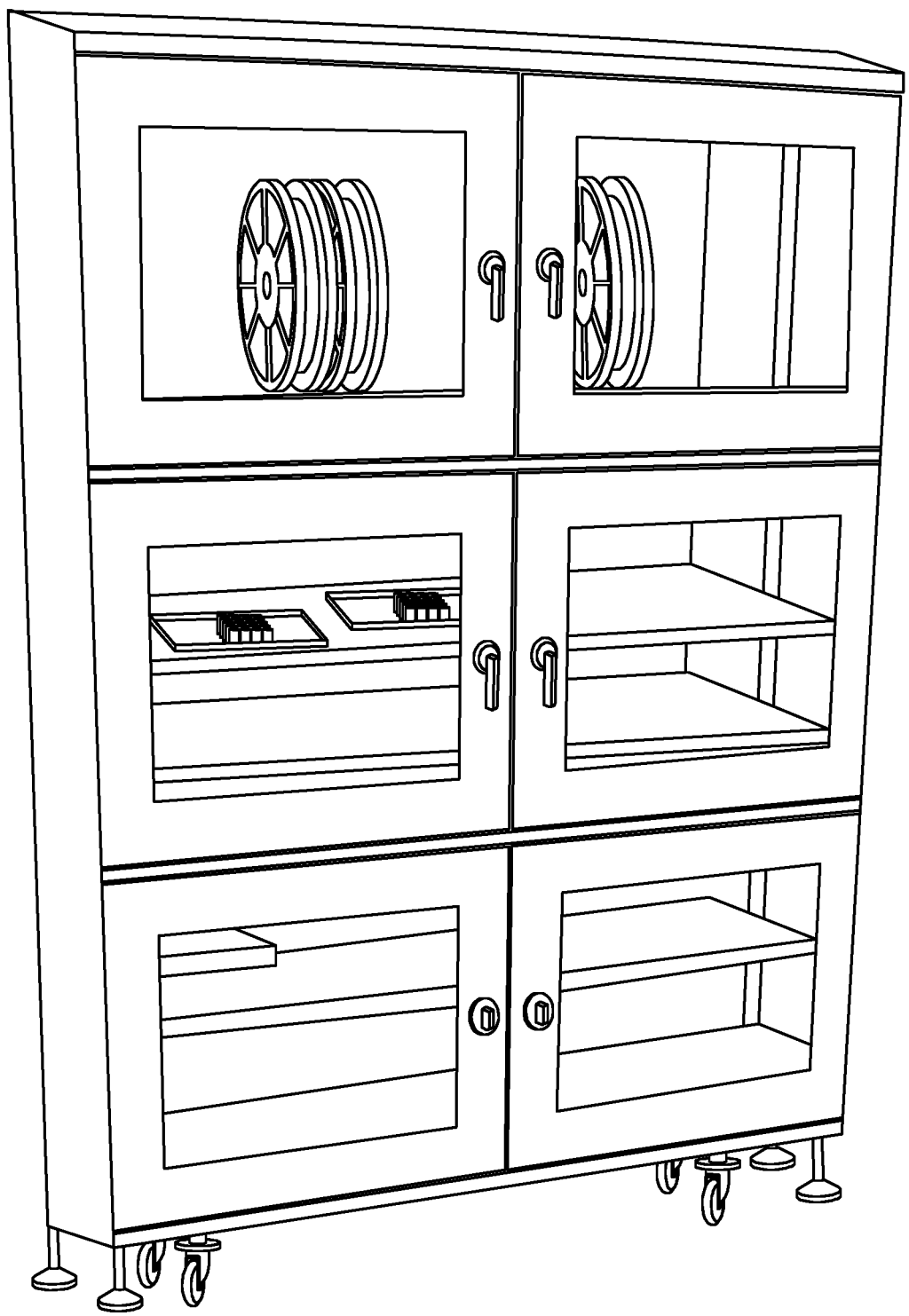
FIG. 29 illustrates a storage unit including ESL tags for each location on each shelf of the unit.

FIG. 29 illustrates a dry storage unit including ESL tags for each location on each shelf of the unit. The ESL tag may display the shelf location content and be configured to change appearance as discussed herein.

According to one or more example embodiments, identification information of a component tape reel positioned on a shelf may be obtained from a component tape ESL tag attached to the shelf edge. The obtained identification information may be provided to an ESL server, thereby enabling the ESL system (IR-based or RFID-based) to readily perform inventory of component tape reels stored at storage positions/shelves, push down to the ESL tags (e.g., a display touch screen or an electronic dynamic label) on the shelf edges associated with a stored component tape reel and (dynamically through event-triggered automatic pushed down instructions) change SMT job related information on the displays. Therefore, it is possible to effectively manage and trace component tape reels and thereby decrease costs for managing human resources. E-label tags/electronic displays, according to one or more example embodiments, display shelf location content in form of SMT job related information similar to smart labels on shelves for easy component tape fetching. An IR-based or RFID-based Electronic Shop/Shelf Label (ESL) system may be used to provide (e.g., dynamically/automatically changing) the SMT job related information (from the SMT information database) on the displays (e.g., during a kitting process, a replenishment process, when loading a bin with component tape reels in preparation of a pick-and-place job). The above ESL, where the SMT operator preparing SMT pick-and-place jobs have an input possibility on (or associated with) an external display unit, where the input mechanism may be one or several buttons (mechanical, optical) or a touch screen on the display itself, and where the internal action of the operator may be at least one of: direct sending a button pressed message to a controlling system (base station and related software, the SMT information database via an IR and/or RFID-based ESL system); saving the button pressed message to be available at the next scheduled communication event; and directly triggering a display content change (e.g., between predefined messages). The e-labels may be configured to (dynamically/automatically) change their appearance to clearly indicate to the SMT job operator where to pick the needed components for an upcoming SMT pick-and-place job (e.g., based on pushed down instructions from the SMT information database using or via a separate ESL system or the operator's pushing of a button), the electronic displays will dynamically change from dark to bright, change its color, indicate in which order the component tapes (bin load units) shall optimally fetched by the operator from the shelves or stored in compartments of a bin (for storing component tape reels).

Figure 28A:
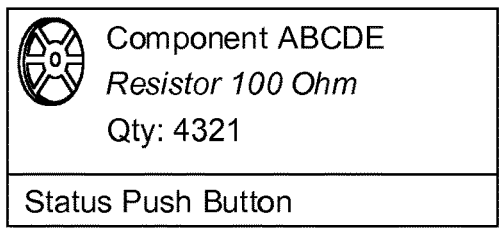
FIGS. 28a through 28h illustrate examples of eight displays/e-labels for presenting different types of guidance information to an SMT operator performing a kitting or loading job.
Figure 28B:
Figure 28C:
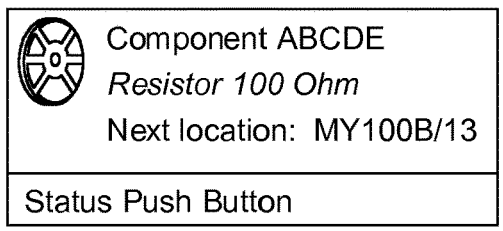
Figure 28D:
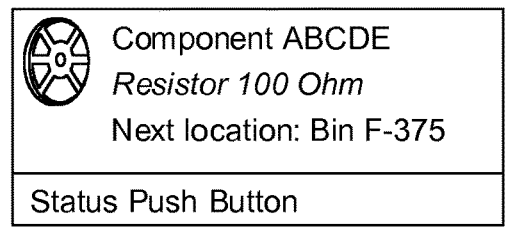
Figure 28E:
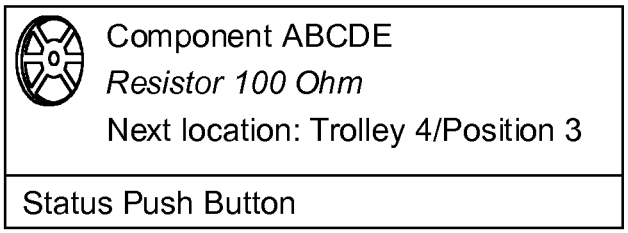
Figure 28F:
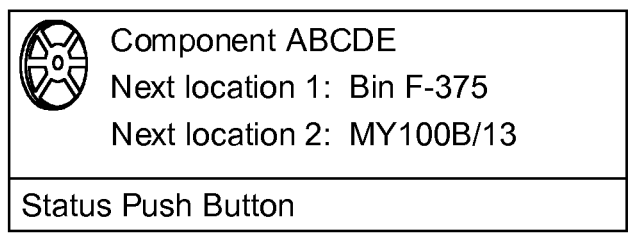
Figure 28G:
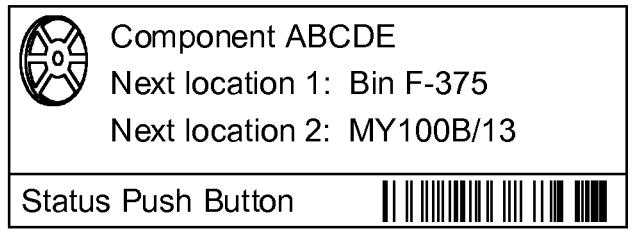
Figure 28H:
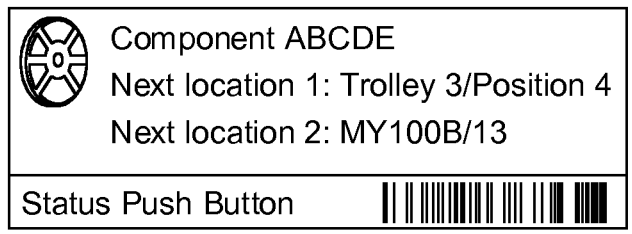

FIGS. 28a through 28d illustrate examples of four e-labels. As shown, the e-label in FIG. 28b is an example in which e-label has dynamically changed from bright to dark based on pushed down instructions from the SMT information database using or via a separate ESL system or the operator's pushing of a button. The shelves are adapted for storing component tapes (e.g., component tape reels, or "bin load units" in form of packets comprising a reel with a component tape pre-threaded into a tape guide/SMT component feeder), where at least one electronic label/tag is attached to a shelf edge for each storage location on each shelf. In certain aspects the invention, the technology disclosed allows for the use of at least one sensor/detector for detecting/indicating when/whether a component tape reel is fetched from (or stored at) the storage location on the shelf (by the operator or a robot) and send uplink information to the ESL system (to be forwarded to SMT information database system), or send it directly to the conventional SMT information database system. This revolutionary Mycronic enhancement to the material handling process will significantly reduce the effort of bringing and keeping track of components (improved traceability) during kitting and replenishment process. By using modern E-paper labels information about the various phases during materiel handling will be displayed just in front of the operator when he needs the information with the Smart e-labels it is possible to show operator what to do independently if the bin is in the machine or in the kitting area. The e-labels can also be used to show what you have on your shelves and guide you collecting those components. At least one other example embodiment provides a smart barcode scanner display configured to display SMT job related information (e.g., direct instructions to the operator) when scanning a barcode (e.g., on a component tape reel, a pallet for carrying a component tape reel or an electronic shelf label/display) during, for example, a kitting process, a replenishment process, when loading a bin with component tape reels in preparation of a pick-and-place job, etc.

Figures 30A, 30B, 30C, 30D:
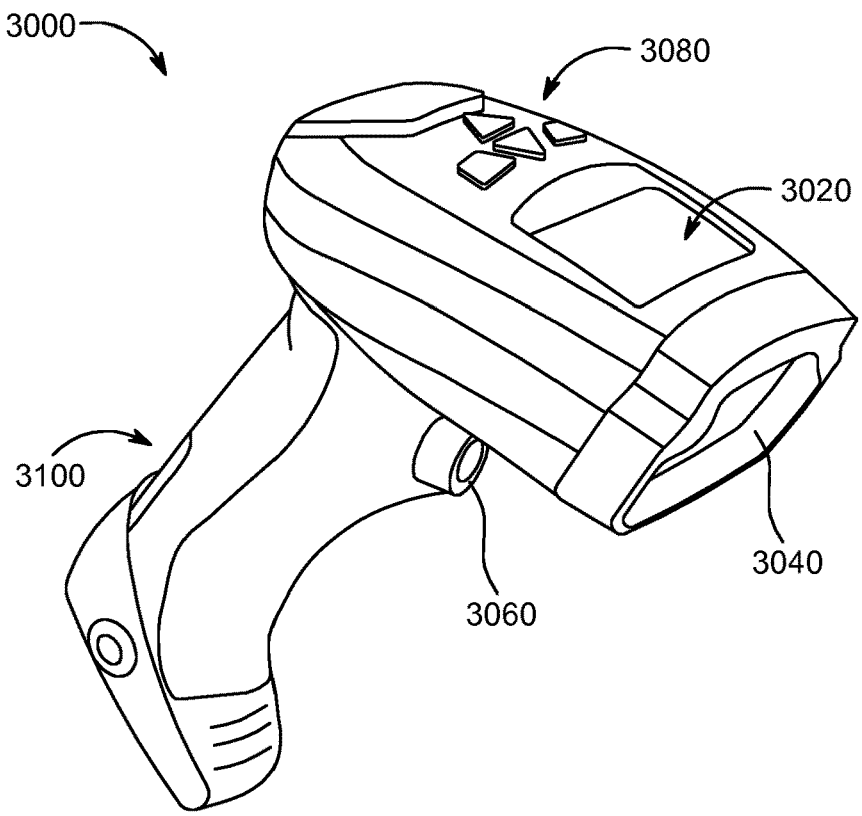
FIG. 30a is a perspective view of a barcode scanner according to an example embodiment.
FIGS. 30b through 30d illustrate example displays output on the display of the barcode reader.

FIG. 30a is a perspective view of a barcode scanner according to an example embodiment. Referring to FIG. 30a, the barcode scanner 3000 includes a handle 3100, a trigger 3060, a scanner input device 3040, a display 3020, and input buttons 3080. The barcode scanner 3000 may also include a memory, a processor, and a wireless transceiver to communicate wirelessly with a ESL system. The smart barcode scanner 3000 with the display 3020 may be used to display SMT job related information to the SMT operator in order to guide the operator on what to do with an object (e.g., a component tape reel) corresponding to the scanned barcode. This enhancement to the material handling process by the provision of guidance to the operator (e.g., sequentially provided and/or event-based triggered guidance SMT job related information) provides improved traceability and/or less error-prone kitting and replenishment processes. An IR-based or RFID-based ESL system may be used for providing (e.g., dynamically/automatically changing) the SMT job related information from the SMT information database on the barcode scanner display 3020. When preparing for upcoming SMT pick-and-place jobs, the SMT operator handling the barcode scanner 3000 with the display 3020 may also have an input possibility on (or associated with) a barcode or an external display unit, where the input mechanism may be the scanning of a barcode (e.g., a conventional barcode on a component tape reel or on (or associated with) an ESL display itself) by the scanner device 3040, and where the barcode scanning action of the operator may be sending data (e.g., through IR or RFID data) to a controller unit associated with the barcode or an external display unit. The controller unit may trigger: sending direct uplink SMT job related information to a controlling system (e.g., a base station and related software, the SMT information database via an IR and/or RFID-based ESL system); saving SMT job related information to be available at the next scheduled communication event; or directly triggering the display content on the barcode scanner display to change (e.g., between predefined messages).

The trigger 3060 may be used to activate the scanner device 3040 to perform a scanning operation. The buttons 3080 may be used to modify/update information on the display 3020, and transmit the updated information to the ESL system to update the ESL database. The barcode scanner display 3020 may be configured to change its appearance to more clearly indicate to the SMT job operator where to pick the next component tape reel (or SMT packet) for an upcoming SMT pick-and-place job. In one example, the barcode scanner display 3020 may change its appearance in response to the scanning of a barcode by the operator or pushed down instructions from the SMT information database using or via a separate ESL system or the operator's pushing of a button. The barcode scanner display 3020 may automatically/dynamically change from dark to bright and/or change its color to indicate to the operator in which order the component tapes (bin load units) should be at least one of: loaded into a bin; fetched by the operator from storage shelves in a kitting or replenishment process; or stored in an automatic SMD component warehouse including a robot. The ESLs discussed herein may be e-paper labels. The barcode scanner display 3020 may show an operator what to do independently if the bin is in the machine or in the kitting area (e.g., during a replenishment process or kitting process). The barcode scanner display may also be used to directly show what the operator has on the shelves, and sequentially guide the operator in collecting the component tape reels. One or more example embodiments may enhance the material handling process to reduce the effort of bringing and tracking components during kitting and replenishment processes (e.g., improved traceability and more efficient and less error prone SMT job related actions performed by the operator). FIGS. 30b through 30d illustrate example displays output on the display of the barcode reader. In more detail, FIG. 30b illustrates example content displayed when scanning a carrier for loading into a pick and place machine. FIG. 30c illustrates example content displayed when scanning a feeder for loading. FIG. 30d illustrates example content when scanning an action barcode.

As previously described, a component tape reel and/or a pre-threaded tape guide may be provided with an identity tag and optionally associated/linked/coded together in the SMT information database to form a bin load unit or a packet unit. The bin load unit may be stored in a storage unit, either individually as a packet unit optionally comprised in a pallet or comprised in a carrier such as a, a bin or a trolley. The carrier may be provided with an identity tag representing a carrier identity/ID, such as a barcode or RFIF tag, and registered individually or associated/linked/coded together with comprised bin load units in the SMT information database. The carrier may further be provided with a display, where the display identity/ID is optionally associated/linked/coded together with the carrier ID in the SMT information database. The process of collecting components and/or bin load units required to complete the SMT job may be referred to as loading or kitting, typically involving collecting components and/or bin load units from a Storage unit and optionally placed into a pick-and-place machine or a magazine of the SMT pick-and-place machine. The process of redistributing bin load units required to complete the SMT job, e.g. redistributing bin load units in-between magazines of the same or different SMT pick-and-place machines may be referred to as changeover work, typically involving collecting bin load units and/or bin load units from a first magazine of the SMT pick-and-place machine to a second magazine of the SMT pick-and-place machine. The process of collecting bin load units required to complete the SMT job when a components and/or bin load unit, being used in a pick-and-place machine or a magazine of the SMT pick-and-place machine, is empty or is about to become empty may be referred to as replenishment work. The carrier may not have the capacity to hold all bin load unit required to complete the SMT job and the bin load units have to be divided into a bin load unit subset for each carrier, e.g. a subset of bin load units. The subset of components may be referred to as a kit having an associated kit identity and may optionally be associated/linked/coded together with the carrier ID and/or the bin load unit subset in the SMT information database.

A first problem with conventional solutions is that it is time consuming for the SMT operator to obtain instructions to complete the next step in a loading, kitting or changeover work or replenishment work process. A second problem with conventional solutions is that it is time consuming to identify the location of components/bin load units, which may result in downtime of the SMT pick and place machine. A third problem is that an SMT operator may collect the wrong type of components resulting in incorrect material delivery to the SMT pick and place machine. A fourth problem is that it is time consuming to returning components/bin load units from the SMT pick and place machine to the Surface Mount Device (SMD) warehouse.

The present invention solves the problems above by guiding the operator through a loading/kitting, changeover work or replenishment work process by presenting instructions on the display, e.g. an electronic label. As a result, operators can work more efficiently and instantly identify the next step in the process.

Figure 31:
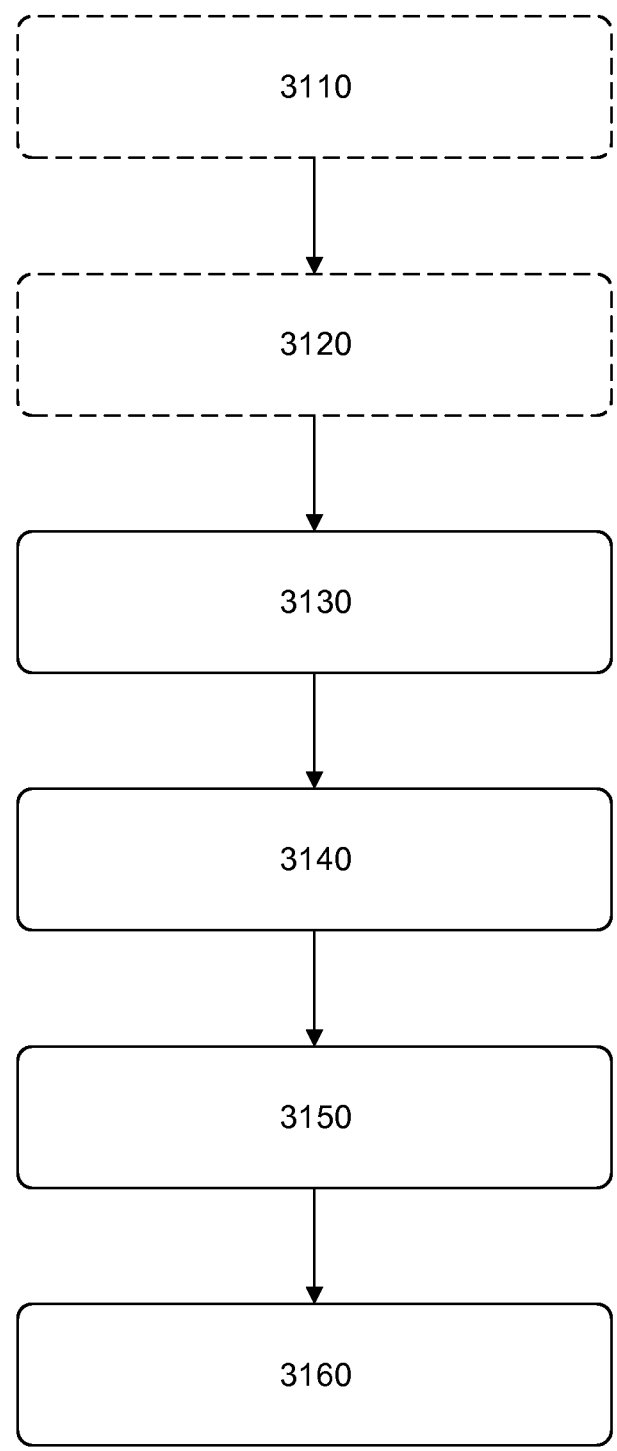
FIG. 31 shows a method for changing operator display data on a display associated to and located on a carrier in a Surface Mount Technology (SMT) system, in accordance with one or more embodiments of the invention.

FIG. 31 shows a method for presenting or changing operator display data on a display associated with and located on a carrier in a Surface Mount Technology (SMT) system comprising a carrier ID in form of a barcode ID or RFID tag:

Step 3130: reading, by a RFID reader or barcode scanner, the identity/ID of the carrier represented by a barcode or RFID tag attached to said carrier, wherein data representing the carrier unique ID of said carrier is thereby obtained by said reader unit.

Step 3140: sending, from said reader unit and via at least one communications network of the SMT system, data representing said carrier ID in order to provide the SMT information database 92 of the SMT system, and/or software comprised in a computer in connection with said database, with data representing said barcode ID.

Step 3150: receiving, at said carrier, input data which is originating from and/or corresponding to data triggered by the action in Step 3140 and which is sent from a software program or the SMT information database of the SMT system, wherein said input data is wirelessly received at said carrier from a wireless communications network of the SMT system.

Step 3160: presenting, based on said received input data, display data such as changed or updated display data, on the display of the display unit or electronic label arranged on said carrier, thereby the SMT operator is presented with instructions or guidance information for a started or ongoing loading, kitting or changeover work or replenishment work process involving the same carrier on which the display data is presented.

Further aspects of the technology disclosed, related to additional steps in FIG. 31, includes a method comprising:

Step 3110: scanning, by the use of a barcode scanner, the unique barcode ID of at least one bin load unit, e.g. a component tape reel, wherein data representing the carrier unique ID of said carrier is thereby obtained by said reader unit, and wherein said at least one bin load unit according to the SMT job planning is to be comprised in one of the compartments of (said) carrier in an upcoming SMT pick-and-place job performed by an SMT pick and place machine 91.

Step 3120: sending, from said reader unit and via at least one communications network of the SMT system, data representing said barcode ID of at least one bin load unit, thereby providing the SMT information database 92 and/or software comprised in a computer in connection with said database, with data or information representing said barcode ID.

Further aspects of the technology disclosed includes a method comprising the steps of:

presenting display data on a display arranged on one a carrier such as;

reading, by a reader unit adapted for scanning a barcode ID and/or RFID tag arranged on or attached to said carrier, wherein data representing the carrier unique ID of said carrier is thereby obtained by said reader unit; and sending, from said reader unit and via at least one communications network of the SMT system, data representing or related to said obtained ID of said carrier, thereby providing the SMT information database 92, and/or software connected to said SMT information database 92, with data or information representing or related to said carrier ID.

Further aspects of the technology disclosed includes a method comprising the steps of:

scanning the unique barcode ID of at least one bin load unit, e.g. a component tape reel, wherein said at least one bin load unit according to the SMT job planning is to be comprised in one of the compartments of said carrier in an upcoming SMT pick-and-place job performed by an SMT pick and place machine 91; sending, from said reader unit and via at least one communications network of the SMT system, data representing or related to said barcode ID of at least one bin load unit, thereby providing the SMT information database 92, and/or software in a computer connected to said database, with data or information representing said barcode ID;

receiving, at the display unit of said carrier and from a wireless communications network, input or instruction data originating from the SMT information database 92 or software 951 in a computer 95 configured to retrieve data and information from said SMT information database 92, data for instructing or generating a change of display data on said display of said display unit; and generating, based on said received input or instruction data, a change of contents of the display data on said display arranged on the carrier, wherein said changed display data indicates at least one of a changed state of the carrier in a process for loading the carrier with bin load units, updated information about the bin load units comprised or to be comprised in the plurality of slots or compartments of the carrier, the next location and/or position for the carrier and/or a bin load unit(s) carried by said carrier to be placed or positioned according to SMT job planning, and/or updated information about an SMT job.

The method may further comprise associating the carrier with a carrier kit comprising a subset of bin load units required to complete the SMT job, wherein the input data further comprises the subset of bin load units, generate updated display data further indicative of an SMT operator instruction based on the identity of the bin load unit and the subset of bin load units.

The display data may further comprise a historic state value of a historic state of the carrier, e.g. a selection of ["Unregistered", "Idle", "Preloading", "Fully loaded", "Kitted", "Changeover" or "In machine"] and/or the updated display data may further comprise a current state value generated based on the tag identity and the historic state value, e.g. to a selection of ["Idle", "Preloading", "Fully loaded", "Kitted", "Changeover" or "In machine"]. The method may further comprise updating information in a SMT information database based on the user input data, e.g. indicating that the bin load unit has been retrieved. The updated display data may further comprise a selection of the carrier kit identity, a target magazine identity, an SMT job ID, a predetermined bin load unit feeder position in a SMT pick and place machine and a bin load unit. The updated display data may further comprise a selection of the carrier kit identity, a target magazine identity, an SMT job ID, a target magazine in the SMT pick and place machine and a bin load unit.

In an embodiment, the display data may comprise at least a historic state value descriptive or indicative of a historic state of the carrier, e.g. a selection of ["Unregistered", "Idle", "Preloading", "Fully loaded", "Kitted", "Changeover" or "In machine"]. In an embodiment generating updated display data further comprises setting a current state value based on the tag identity and the historic state value, e.g. to a selection of ["Unregistered", "Idle", "Preloading", "Fully loaded", "Kitted", "Changeover" or "In machine"]. In an embodiment, the updated display data comprises a representation of the current state value, a carrier label and an identity tag associated with the carrier. In yet an embodiment, the input data related to the SMT job comprises at least one of a carrier kit identity and a target magazine identity and the updated display data further comprises the carrier kit identity and/or the target magazine identity. In a further embodiment, the input data related to the SMT job further comprises a subset of bin load units required to complete the SMT job associated to the carrier kit identity. In yet an embodiment, the carrier kit identity is associated to the target magazine identity and/or the carrier identity.

In an example the carrier is configured to receive and/or contain and/or comprise the subset of bin load units. In a further example, the target magazine comprised in a SMT pick and place machine associated to the target magazine identity is configured to receive and/or contain the carrier. The system further comprises an SMT pick and place machine may be configured to perform the SMT job and to comprise a target magazine, wherein the target magazine is configured to receive the carrier. In a further embodiment, the carrier is configured to receive and/or contain and/or comprise the subset of bin load units. In a further embodiment, the carrier is a bin or a trolley.

The method and system according to the technology disclosed may further comprise associating the carrier and its unique identity/ID with at least one of a carrier kit comprising a carrier kit identity and the identity/ID of individual bin load units or a subset of bin load units to be carried by said carrier and which are required to complete an upcoming SMT job, wherein the unique carrier identity/ID may also be linked or coded together with at least one of the unique ID of the carrier kit, the unique ID of an individual bin load units or the unique ID of the subset of bin load units and where association between the carrier ID and at least one of those mentioned unique IDs are stored as retrievable information in the SMT information database 92. One advantage is that, by association between the carrier ID and the correct subset of bin load units required to complete a loading/kitting of the carrier and/or the upcoming SMT job is available as retrievable information in the SMT information database and can further be used for generating and presenting guidance information to the SMT operator standing in front of the same carrier and its display.

Figure 32:
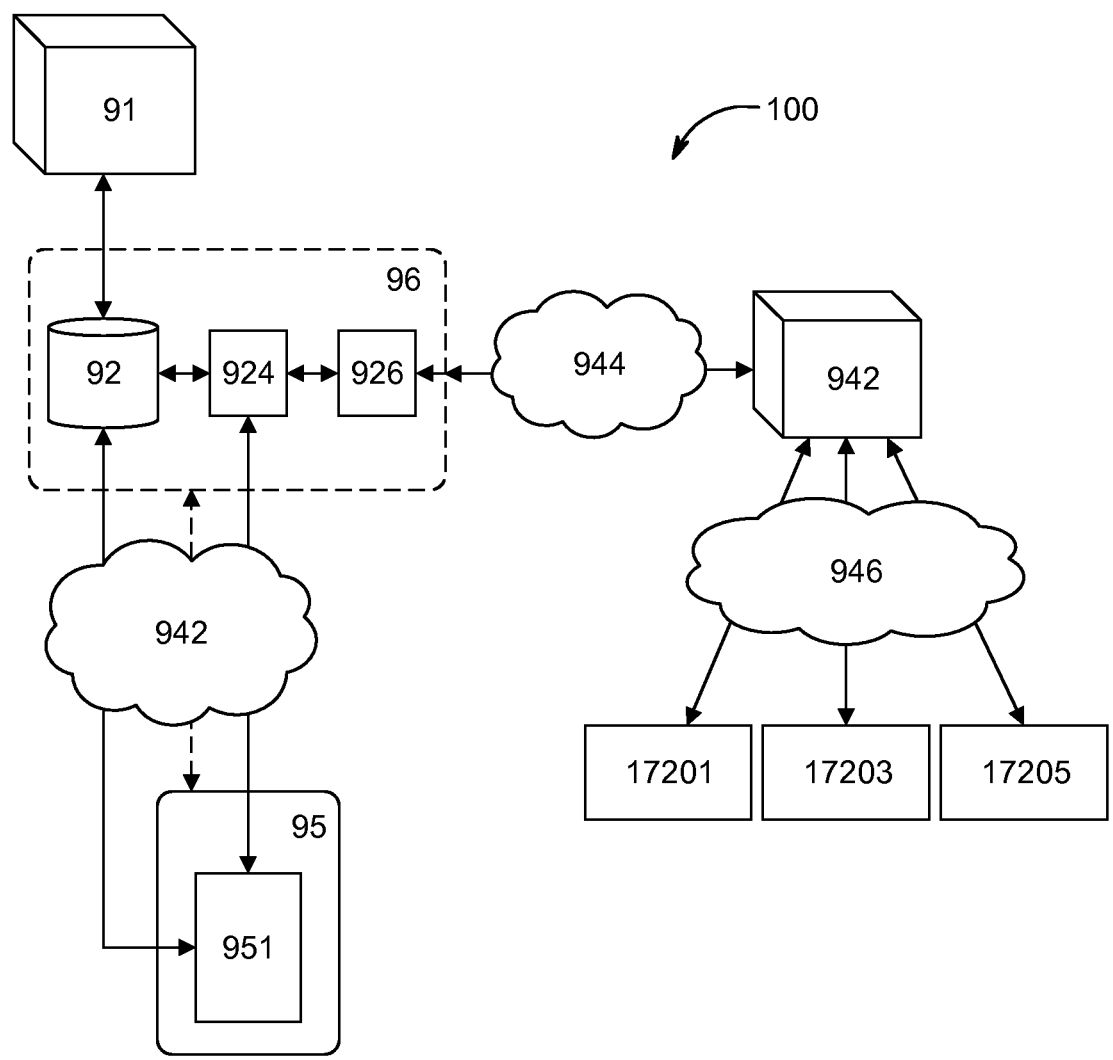
FIG. 32 shows details of the SMT system for presenting display data on a display.

FIG. 32 shows details of the SMT system in the form of an Electronic Shelf Label (ESL) System for changing operator display data on a display associated to and located on a carrier in a Surface Mount Technology, SMT, system. The SMT system 100 previously shown in FIG. 1, may comprise a selection of an ESL server 96, a SMT pick and place machine 91, a SMT information database or database server 92 and a SMT job planning computing device 95, optionally comprising a MyCentre (MC) service module 951. The ESL server 96 may be a Linux work station, the SMT information database server 92 may be a Linux server and the a SMT job planning computing device 95 may be a personal computer (PC) with a display. The ESL server 96, the SMT pick and place machine 91, the SMT information database server 92 and the SMT job planning computing device 95 are communicatively coupled via a communications network that may comprise a plurality of communications network, e.g. a first communications network 942, a second communications network 944 and a third communications network 946. The plurality of communication networks may use any combination of wired, infrared or wireless communications as further described in relation to FIG. 1, e.g. Ethernet, WLAN and RFID. In one example communication networks 942 and 944 employ wired Ethernet technology and the communication network 946 employ wireless communication in the 2.4 GHz band. The ESL server 96 may comprise the SMT information database or database server 92, an ESL service module 924 and a display service module 926. The SMT information database or database server 92, the ESL service module 924 and the display service module 926 may also be configured as stand-alone data servers or workstations communicatively coupled to each other and the ESL server 96, the SMT pick and place machine 91, the SMT information database or database server 92 and the SMT job planning computing device 95. The SMT system 100 may further comprise an ESL infrared or radio/wireless access point 942 and ESL labels/displays 17201, 17203, 17205. The ESL service module 924 comprised in the ESL server 96 may be configured to generate or receive display data or updated display data, e.g. from the SMT information database or database server 92, and send display data to the ESL label/display.

The ESL service module 924 may further be configured to send display data to the ESL labels/displays via the display service module 926. The display data may comprise or indicate a selection of a display bitmap and target display identity, where the target display is the display where the display data should be presented. The display data may be sent to the ESL labels/displays 17201, 17203, 17205 directly or via the ESL access point 942, e.g. employing IR or radio/wireless communication as described with regards to the communications network in FIG. 1. The display data may be sent to the ESL labels/displays 17201, 17203, 17205 via the SMT pick and place machine 91, e.g. when the ESL label/display is associated to and arranged on a carrier. The ESL label/display may be electrically/electronically coupled to the SMT pick and place machine 91 directly or via the carrier and configured to receive display data via the electrical/electronic coupling. The ESL labels/displays 17201, 17203, 17205 may be configured to receive display data and to present the display data on the display, e.g. to an operator involved in a component loading, kitting or changeover work or replenishment work process. The SMT information database or database server, the ESL service module or the ESL label/display may be configured to receive user input data and to generate updated display data based on input data, such as input data relating to an SMT job, user input data or display data.

The display may be configured with an Electronic Paper Display (EPD). An EPD display typically possess a paper-like high contrast appearance, ultra-low power consumption, and a thin, light form. An EPD display gives the viewer the experience of reading from paper, while providing the capability to electronically update the displayed information. EPD displays may be configured with electronic ink. Such ink carries an electrical charge enabling it to be updated through electronics. Electronic ink is well suited for EPD displays s as it is a reflective technology which requires no front or backlight, is viewable under a wide range of lighting conditions, including direct sunlight, and requires no power to maintain an image. Electrical power is only consumed when the displayed data is changed.

Figure 33A:
Figure 33B:
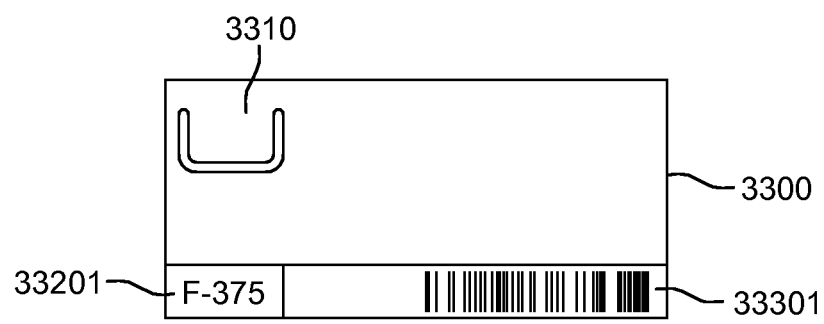
Figure 33C:
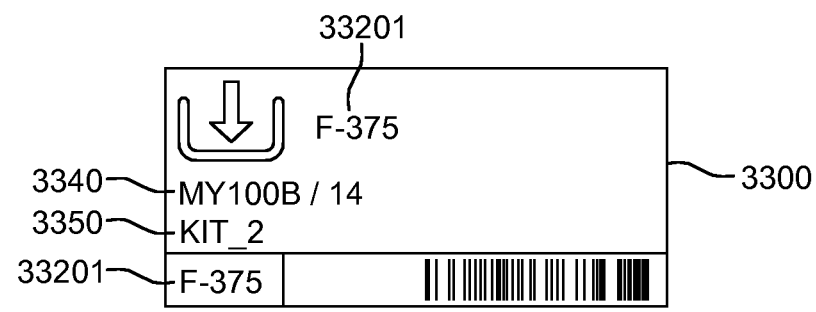
Figure 34A:
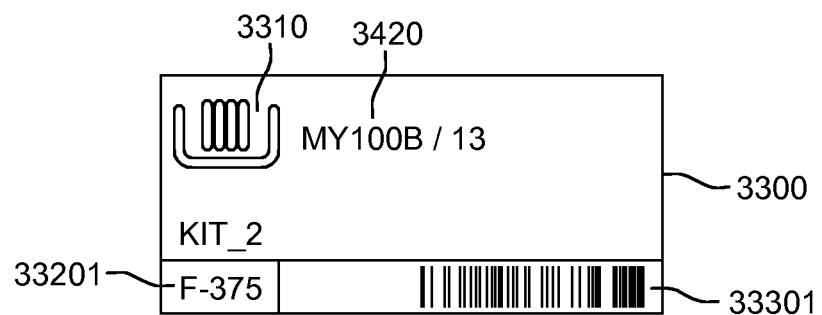
Figure 34B:
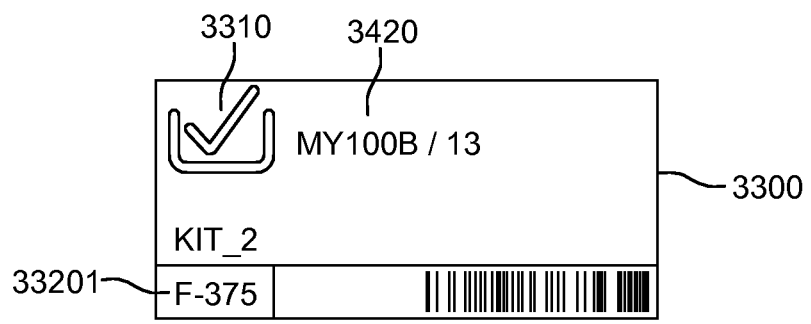

FIGS. 33a to c show three examples of display data presented on a display (or electronic label) arranged on/attached to a carrier (bin/trolley) according to the technology disclosed, where the change of display data to what is illustrated in FIGS. 34a and 34b being triggered by at least one of the actions of scanning the barcode ID (or reading an RF tag) on the carrier and the scanning of a barcode ID attached to a component tape reel associated with the same carrier on which the display/electronic label is arranged on. FIG. 33a shows a display 3300 that is presenting display data comprising a field representing a state value of a carrier 3310, a field representing a carrier name 3320 and a field representing a carrier barcode 3330, e.g. as for a carrier with a carrier state value equal to "Unregistered". The fields may be represented by different sections of a bitmap. In yet another aspect of the technology disclosed, the method described in relation to FIG. 31 wherein generating updated display data further comprises, retrieving a historic state value, e.g. from the SMT information database 92, generating a current state value based on the user input data comprising at least a tag identity, wherein the current state value is comprised in the updated display data.

FIG. 33b shows a display 3300 that present display data comprising a state value of "Idle" a carrier name of "F-375" 33201 and a carrier barcode 33301. In yet an embodiment, the method described in relation to FIG. 31 further comprises setting the current state value to ("Idle") if the tag identity is associated with the carrier and the historic state value is equal to ("Unregistered"). In an example the display data indicates that the historic state of the carrier is "Unregistered" and the user scans a barcode/identity tag associated, e.g. in the SMT information database, to and located on the carrier. Updated display data will then be generated indicating a current state value equal to "Idle".

FIG. 33c shows a display 3300 that present display data comprising a state value 3310 of "Preloading" a carrier name of "F-375" 33201 and the carrier barcode 33301. In yet an embodiment, the method further comprises setting the current state value 3310 to ("Preloading") if the tag identity is associated with a carrier kit identity and the historic state value is equal to ("Idle"). In an example the display data indicates that the historic state of the carrier is "Idle" and the user scans a barcode/identity tag associated, e.g. in the SMT information database, to a kit identity. Updated display data will then be generated indicating a current state value equal to "Preloading", as further shown in FIG. 33c.

FIG. 34a shows a display 3300 that present display data comprising a state value 3310 of "Fully loaded" a carrier name of "F-375" 33201, a carrier target magazine 3420 "MY100B/13", and the carrier barcode 33301. In yet an embodiment, the method further comprises setting the current state value to ["Fully loaded"] if the historic state value is equal to ["Preloading"], the tag identity is associated to a bin load unit/bin load unit comprised in the subset and all tag identities associated to the bin load units comprised in the subset have been received. In an example the display data indicates that the historic state of the carrier is "Preloading" and the user scans a barcode/identity tag associated, e.g. in the SMT information database, to a bin load unit/bin load unit and determines that all tag identities associated to the bin load units comprised in the subset have been received. Updated display data will then be generated indicating a current state value equal to "Fully loaded".

FIG. 34b shows a display 3300 that present display data comprising a state value 3310 of "Kitted" a carrier name of "F-375" 33201, carrier target magazine 3420, and the carrier barcode 33301. In yet an embodiment, the method further comprises setting the current state value to ["Kitted"] if the tag identity is associated to a carrier repository and the historic state value is equal to ["Fully loaded"]. In an example the display data indicates that the historic state of the carrier is "Fully loaded" and the user scans a barcode/ identity tag associated, e.g. in the SMT information database, to a Surface Mount Device (SMD) warehouse or a location/position within a storage unit or the Surface Mount Device (SMD) warehouse. Updated display data will then be generated indicating a current state value equal to "Kitted".

Figure 35A:
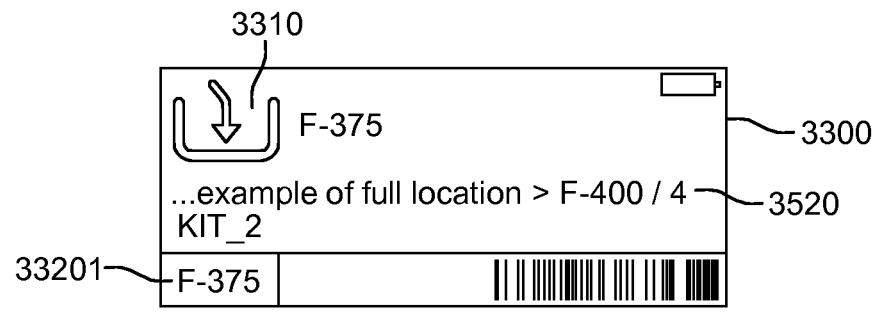

FIG. 35a shows a display 3300 that present display data comprising a state value 3310 of "Changeover" a carrier name of "F-375" 33201, a carrier target magazine 3420, the carrier barcode 33301 and instructions 3520 to collect bin load units from a location/position within a second carrier. In yet an embodiment, the method further comprises setting the current state value to ["Changeover"] if the tag identity is associated to a carrier repository and the historic state value is equal to ["Preloading"]. In an example the display data indicates that the historic state of the carrier is "Preloading" and the user scans a barcode/identity tag associated, e.g. in the SMT information database, to a storage unit or a Surface Mount Device (SMD) warehouse or a location/position within the Surface Mount Device (SMD) warehouse. Updated display data will then be generated indicating a current state value equal to "Changeover". In embodiments, the updated display data further comprises instructions to collect bin load units from a location/position within a second carrier.

Figure 35B:
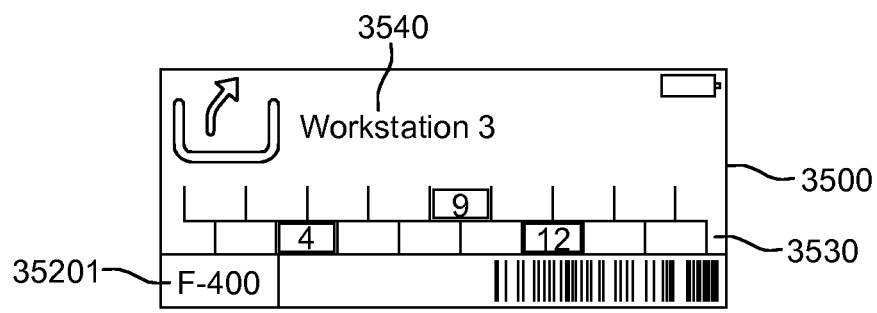

FIG. 35b shows a second display 3500 that present display data comprising a state value 3310 of "Changeover" a carrier name of "F-400" 35201, carrier target workstation 3540, the carrier barcode and instructions 3530 on where collect bin load units from a location/position within a second carrier. In embodiments, the second carrier is associated to a second display 3500 and the second display 3500 is configured to display the location/position within the second carrier where bin units or component required to complete the SMT job is stored.

Figure 35C:
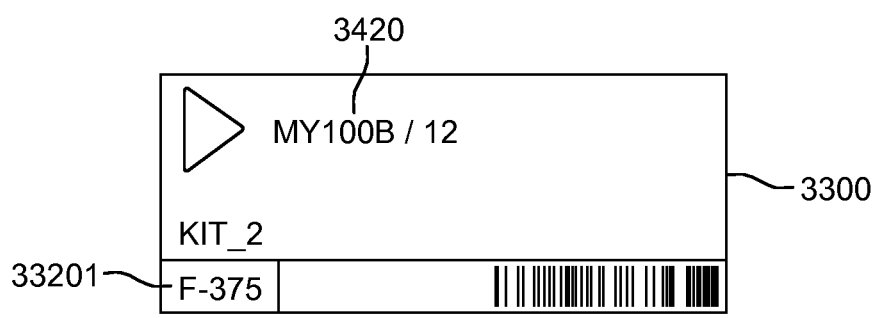

FIG. 35c shows the display 3300 that present display data comprising a state value 3310 of "In machine" the carrier name of "F-375" 35201, carrier target magazine 3540 and the carrier barcode. In embodiments, the method further comprise detecting that the carrier is placed in a pick and place machine magazine and setting the current state value to "In machine". In one example, an SMT operator places a carrier in the pick and place machine 91, a server, such as the SMT information database server 92 or the ESL server 96, detects that the carrier has been places in the pick and place machine 91, sets the current state value to "In machine" in the SMT information database, generates updated display data based on the current state value. The updated display data is then presented on the display.

Figure 36:
Figure 36:
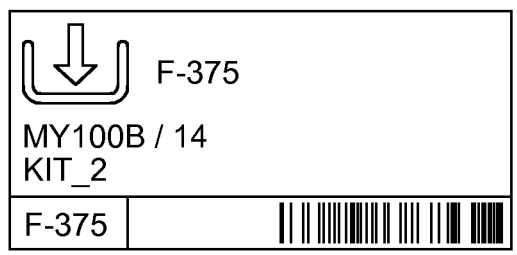
Figure 36:
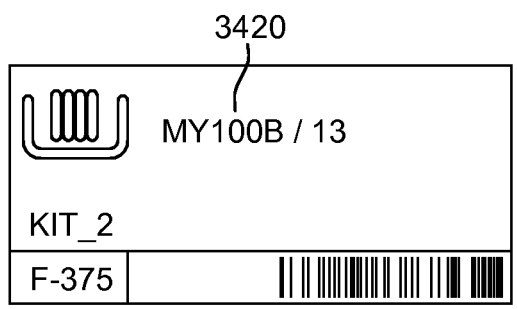
Figure 36:
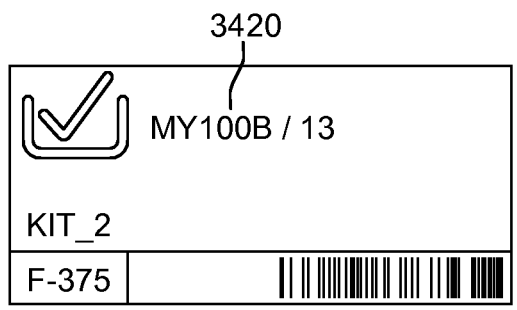

FIG. 36 shows illustrates that the display/electronic label arranged on a carrier (bin/trolley) can present a sequence of display data which each are triggered by a single or a plurality of action(s) of scanning barcodes (or reading an RF tag) arranged on or associated with said carrier comprising a state value of "Idle", "Preloading", "Fully loaded" and "Kitted".

FIG. 37 shows views on the SMT job planning computing device 95 configured to generate or update display data, in accordance with one or more embodiments of the invention. In embodiments the SMT job planning computing device 95 is configured to retrieve or receive display information, e.g. from the SMT information database 92, the SMT pick and place machine 91, the ESL server 96 or directly from the display and present them on the SMT job planning computing device 95. The display information may comprise carrier barcode, display battery level, carrier/container name type, carrier/container location, carrier/container size and status of connection to the display. The display may be configured to send display information directly to the SMT job planning computing device 95 or via any of the SMT information database 92, the SMT pick and place machine 91, the ESL server 96 or the radio/wireless access point 942. In a further aspect, the software/service module 951 is configured to retrieve or receive display information, e.g. from the SMT information database 92, the SMT pick and place machine 91, the ESL server 96 or directly from the display and present them on the SMT job planning computing device 95. In yet an embodiment, the method may comprise receiving user input data indicating the reset of a display, to send display data comprising a reset command to the display. The display is further configured, upon reception of the reset command, to make a hardware or software reset.

Certain aspects of the technology disclosed offer the richest software suite in the industry, with integrated applications covering the entire chain of a SMT assembly. This is accomplished by providing software tools that increase utilization, boost efficiency, improve the service level to your customers, and impact your bottom-line. In certain aspects of the technology disclosed, a software suite that is intuitive and easy to use is provided. The software suite is tailored for the most complex manufacturing environment including high part number count, a wide variety of boards, and an ever-changing production schedule are challenges our customers are overcoming daily. Connectivity is key and information handling is the new bottleneck in SMT production. Therefore, it's vital that data generated in one step of the process immediately becomes available to all other assembly functions. By providing an integrated system for planning, kitting, production and storage, the technology disclosed can ensure not only leaner manufacturing, but also leaner information handling.

The proposed system of the technology disclosed is designed to support integration, multiple users and parallel processes, using open interfaces and state-of-the-art software technology. Prepare your data quickly and correctly—every time. The technology disclosed may be used to convert all types of CAD and Bill-of-Materials information into ready-to-run pick & place programs within seconds. After being imported, the graphical rendering of the CAD image is checked for errors and can be edited as required.

The technology disclosed offers visual documentation and the fastest, easiest, and most comprehensive visual documentation system for electronic assembly and related processes. It also enables instant engineering change implementation across the entire document set. Library data and programs can be created for one or multiple pick-and-place machines, as well as other SMT equipment, totally off-line. Verified and up to date information can then be sent over the factory network in time for production start. Efficient handling of any batch size The technology disclosed as a planning tool—some benefits Example embodiments provide: Optimized sequences and changeover strategies for any group of jobs; Use of current kitting and part commonality to minimize feeder loading; Comprehensive kitting instructions—printed or paperless; Supports pre-loading of feeders while the line is running; and maximizes overall production efficiency. Optimize productivity according to your goals. The technology disclosed, working as a planning tool, lets the operator easily perform job scheduling, feeder optimization and line balancing for the entire facility. The operator can prioritize minimal changeover time, maximize throughput, or a balance between the two and the planning tool quickly calculates and predicts the assembly time, kitting and changeover procedures. By providing integrated material tracking, the planning tool of the technology disclosed providing paperless guidance information to the SMT operator at the carrier he is loading can help to increase actual throughput by selecting the best changeover strategy based on part commonality and batch size. The planning tool may also be integrated with other software tools for generating display data on display units or electronic labels, for full visibility of material status in order to avoid running out of or missing bin load units.

After optimization, the planning tool of the technology disclosed generates a comprehensive set of kitting instructions that provide operators with simple, step-by-step tasks to keep production running efficiently. The operator can also send the result electronically to the SMD Warehouse or request information about stored or delivered bin load unit tape reels from the SMD Warehouse, for automatic bin load unit delivery and paperless guidance. Management data tailored to the operator's needs. The planning tool of the technology disclosed is integrated with software reporting tools for easy performance tracking. The operator can generate customized reports on machine speed, production runs, error identification and utilization. Using electronic tags or labels comprising electronic barcodes to track bins, trolleys and the bin load units carried by, contained in or associated with, the bins, trolleys or containers, and display SMT job related information related to said bins, trolleys and associated components, the system of the technology disclosed reduces the risk of error and speeds up setup and changeover times. It keeps track of quantity, batch code, current location and floor life for each and every component.

In certain aspects, the technology disclosed and related software tools are used to inform and give guidance to the operator by providing, for the operator to view, display data from the factory floor on displays or electronic labels during production, and integrate it with a factory-wide tracking system or export display data for further processing. The displays or electronic labels may be associated with and/or may be attached to a carrier (e.g., a bin, a movable trolley or a container adapted for carrying at least one plastic bag with components), a shelf for storing components or a table for performing replenishment work or kitting work. In certain aspects of the technology disclosed, the display or electronic label is provided with an electronic barcode that can be scanned by the operator using a barcode reader in order to display information to the operator related to the preparation for an ongoing or upcoming pick-and-place job (e.g., replenishment work, kitting work or during loading of a component tape magazine or trolley, e.g. with feeders with pre-threaded component tape reels or bins carrying reels pre-threaded into tape guides/feeders).

In certain aspects of the technology disclosed, the displays or electronic labels are provided with at least one electronic barcode that can be scanned by the operator using a barcode reader in order to automatically (e.g., via a software tool and/or network of the SMT system) initiate an update of SMT job information in the SMT information database, where the updated SMT job information can subsequently be retrieved by the pick-and-place machine, the SMD warehouse or other units of the SMT system, retrieved by the action (e.g., scanning of a barcode, such as an electronic barcode) or other request of the operator or automatically pushed down (e.g., using software creating, such as a bitmap image, provided to the control unit of a separate communications network and system, such as an ESL system discussed above) that pushes down display data to the displays or electronic labels) to guide the operator in preparation of an ongoing or upcoming pick-and-place job (e.g., replenishment work, kitting work or during loading of a component tape magazine or trolley, e.g., with feeders with pre-threaded component tape reels or bins carrying reels pre-threaded into tape guides/feeders).

In certain aspects of the technology disclosed, the display or electronic label of the carrier, table or shelf is further is associated with or provided with an input device that can be activated or pushed by the operator in order to display information to the operator related to the preparation for an ongoing or upcoming pick-and-place job (e.g., replenishment work, kitting work or during loading of a component tape magazine or trolley, e.g., with feeders with pre-threaded component tape reels or bins carrying reels pre-threaded into tape guides/feeders).

In certain aspects of the technology disclosed, the display or electronic label of the carrier, table or shelf is provided with an input device that can be used, activated or pushed by the operator to provide input (e.g., event-based input) to the control unit of the display/electronic label in order for the control unit of the display/electronic label to provide display information to the operator related to the preparation for an ongoing or upcoming pick-and-place job (e.g., replenishment work, kitting work or during loading of a component tape magazine or trolley, e.g., with feeders with pre-threaded component tape reels or bins carrying reels pre-threaded into tape guides/feeders). In certain aspects of the technology disclosed, the display or electronic label is provided with an input device that can be used, activated or pushed by the operator to provide input (e.g., event-based input) to the control unit of the display/electronic label in order for the control unit of the display/electronic label to automatically (e.g., via a software tool and/or network of the SMT system) initiate an update of SMT job information in the SMT information database, where the updated SMT job information can subsequently be automatically retrieved by the pick-and-place machine, the SMD warehouse or other units of the SMT system, retrieved by a request of the operator or automatically pushed down (e.g., via a software tool and control unit creating image data, e.g., bitmap image data, that is sent to the a separate communications network and system, e.g., ESL system that pushes down display data to the displays/electronic labels) to guide the operator in preparation of an ongoing or upcoming pick-and-place job (e.g., replenishment work, kitting work or during loading of a component tape magazine or trolley, e.g., with feeders with pre-threaded component tape reels or bins carrying reels pre-threaded into tape guides/feeders).

The invention claimed is:

1. A method in a Surface Mount Technology (SMT) system comprising
   at least one SMT pick and place machine,
   an SMT information database and
   a plurality of carriers in form of transport bins or trolleys,
      each of said plurality of carriers is arranged with a unique carrier identifier (ID), in a form of at least one of a barcode and a Radio Frequency Identifier (RFID) tag,
      a carrier is further comprising a display unit or electronic label, with a display for presenting SMT job related information, and is configured with a plurality of compartments, each for carrying a bin load unit that includes a unique ID and a reel of components for placement by the pick and place machine,
   the method comprising actions of:
      reading, by a reader unit adapted for scanning a barcode ID or RFID tag arranged on said carrier, wherein data representing the unique carrier ID of said carrier is thereby obtained by said reader unit;

sending, from said reader unit and via at least one communications network of the SMT system, the obtained data representing said the unique carrier ID, thereby providing the SMT information database, or computer software connected to said SMT information database, with data representing the unique carrier ID;

associating the carrier ID with IDs of individual bin load units to be carried by said carrier or an ID of a subset of bin load units to be carried by said carrier, and storing said association as retrievable information in the SMT information database;

receiving, at said carrier, input data from a wireless communications network of the SMT system, said input data is originating from or corresponding to data sent or retrieved from said database or said computer software in response to said action of providing said database or said computer software with data representing said unique carrier ID;

generating, based on said received input data, a change of contents of display data on said display unit arranged on the carrier, thereby providing instructions or guidance information to an SMT operator preparing for an SMT job by performing loading, kitting, changeover, or replenishment work involving the same carrier, wherein said retrievable information in the SMT information database from said step of associating the carrier ID with the IDs of individual bin load units or the ID of a subset of bin load units required to complete a loading or kitting of the carrier is used for triggering said generating and presenting of guidance information to the SMT operator standing in front of the same carrier and its display; and using the reels of components from the carrier in the pick and place machine.

2. The method according to claim 1, said method further comprising additional actions of:

scanning the unique barcode ID of at least one bin load unit, wherein said at least one bin load unit is loaded in or to be loaded in one of the compartments of said carrier in an upcoming SMT pick-and-place job performed by an SMT pick and place machine;

sending, from said reader unit and via at least one communications network of the SMT system, data representing or related to said barcode ID of at least one bin load unit, thereby providing the SMT information database with data or information representing said barcode ID of said at least one bin load unit; and generating, based on said received input or instruction data triggered by said action of scanning of the unique barcode ID of at least one bin load unit among a plurality of bin load units loaded in or to be loaded in one of the compartments of said carrier, an update of contents of the display data on said display arranged on the carrier, wherein said updated display data indicates at least one of a changed state of the carrier in a process for loading the carrier with bin load units, updated information about the bin load units loaded or to be loaded in a plurality of slots or compartments of the carrier, a next location or position for the carrier or bin load unit(s) carried by said carrier to be placed or positioned according to an upcoming SMT job.

3. The method according to claim 1, wherein the display data further comprise a state value of a state of the carrier, wherein the updated display data further comprises a current state value generated based on the tag identity and the state value.

4. The method according to claim 1, further comprising updating information in the SMT information database based on data representing a carrier ID or bin load unit ID provided to the SMT information database following the scanning of a barcode ID, or reading of a RFID tag, on bin load units and/or the carrier, thereby updating the database with retrievable information indicating that a carrier or a bin load unit has been retrieved.

5. The method according to claim 1, wherein said updated display data further comprises a selection of a carrier kit identity in form of the identity defining a subset of bin load units required to complete an SMT job, a target magazine identity, an SMT job ID, a predetermined bin load unit feeder position in a SMT pick and place machine and the identity of a bin load unit.

6. The method according to claim 1, wherein the carrier ID and the ID of at least one of the bin load units to be loaded in said carrier in a kit job and/or loading job are linked and/or coded together by said actions of reading or scanning and then associated with each other in the SMT information database.

7. A computer program product comprising computer readable code configured to, when executed in a processor, perform the method steps in claim 1.

8. The method according to claim 1, wherein component tape reels in the bin load units are arranged with unique IDs on barcode labels which are attached to the reels.

9. The method according to claim 2, wherein the bin load unit is a component tape reel.

10. The method according to claim 3, wherein the state of the carrier includes at least one of "Unregistered", "Idle", "Preloading", "Fully loaded", "Kitted", "Changeover" or "In machine", wherein the state value generated based on the tag identity includes at least one of "Idle", "Preloading", "Fully loaded", "Kitted", "Changeover" or "In machine".

11. A Surface Mount Technology (SMT) system for changing operator display data on a display unit and/or electronic label located on a carrier in the system, the system comprising:

a plurality of carriers in form of transport bins and/or trolleys, each configured with compartments for carrying bin load units each comprising a component tape reel, wherein each of said plurality of carriers comprises a display unit and/or electronic label and a carrier identifier (ID) in a form of at least one of:

a barcode displayed on said display unit and/or electronic label, a separate barcode tag, or an RFID tag;

a barcode scanner and/or a RFID reader;

an SMT information database and software in a computer communicatively coupled to said database, said database and software is configured to:

link and/or code together the carrier ID with an ID of a subset of bin load units transported in or to be transported in said compartments of a carrier according to an upcoming SMT job, thereby associating the carrier ID with the ID of a subset of bin load units required to complete a loading or kitting of the carrier, and store said association as retrievable information in the SMT information database;

receive, from a barcode and/or RFID tag scanner/reader via at least one communications network, both firstly scanned and/or read data representing the carrier ID and secondly scanned and/or read data representing the ID of a bin load unit, e.g. a component tape reel, loaded in, or to be loaded in one of the compartments of the carrier; and generate and send, based on said association between the carrier ID with the ID(s) of a subset of bin load units including the secondly scanned and/or read data representing the ID of said bin load unit, data for triggering a change of display data on a carrier in response to said data received from the barcode scanner and/or RFID tag reader;

said SMT system further comprising:
the at least one communications network configured to be communicatively coupled to the plurality of carriers, the SMT information database and the barcode scanner and/or RFID reader, wherein each of the display units and/or electronic labels arranged on each of said plurality of carriers is configured to:
receive input data from a wireless communications network of said at least one communications network, wherein said input data originates from the database and software; and generate and present, based on said received input data, display data in form of a change of display contents on the display, wherein the display data is related to loading of said carrier with a plurality of bin load units.

12. The Surface Mount Technology (SMT) system according to claim 11, wherein the wireless communications network is an infrared or radio-based communications network.

13. The SMT system according to claim 11, wherein said SMT information database is further configured to link/code together the carrier ID and the display unit and/or electronic label arranged on said carrier.

14. The system according to claim 11, wherein the bin load unit is a component tape reel.

15. A carrier in a form of a transport bin or trolley, said carrier comprising
a plurality of slots or compartments each for carrying a bin load unit including a component tape reel and being adapted to be easily movable between a storage area and a pick-and-place machine in an SMT system,
said carrier further comprising:
a unique carrier identity in form of a barcode ID or RFID ID tag;
a display unit and/or electronic label with a display, wherein said display unit and/or electronic label is configured to be communicatively coupled to a wireless communications network of an SMT system and is further configured to dynamically present and update display data on the display based on wirelessly received input data received from said wireless communications network,
wherein the data on said display and/or electronic label of the carrier is related to loading of a subset of bin load units with reels of components for placement by the pick-and-place machine into said carrier,
wherein said carrier is further configured to update and change said display data multiple times based on input data received from said wireless communications network in order to guide an SMT operator through an entire process of loading bin load units into said carrier, an entire changeover process involving said carrier, or an entire replenishment work or kitting work involving said carrier.

16. A method for providing information to an operator in a Surface Mount Technology (SMT) system comprising
an SMT information database and
an SMT pick-and-place machine,
the method comprising:
providing a carrier in a form of a transport bin or trolley configured with compartments for carrying a plurality of bin load units, each of said bin load units comprising a component tape reel, wherein said carrier further comprises a display;
scanning, by use of a barcode scanner, a unique barcode ID of at least one bin load unit, wherein said at least one bin load unit is to be loaded in one of the compartments of said carrier in an upcoming SMT pick-and-place job performed by the SMT pick-and-place machine;
sending, by the use of a barcode scanner, data representing or related to said unique barcode ID of said at least one bin load unit, thereby providing said SMT information database with data representing said scanned barcode ID;
receiving, at said display and via a communications network, input data related to said carrier and an ongoing or upcoming SMT job, said input data being based on data retrieved from the SMT information database; and
generating and presenting display data on said display based on said received input data, wherein said display data is updated and changed multiple times in order to guide the operator through an entire process of loading bin load units into said carrier, an entire changeover process involving said carrier, or an entire replenishment work or kitting work involving said carrier.

17. The method of claim 16, wherein said input data is retrieved from said SMT information database in response to a request triggered by the operator scanning a barcode which is part of or associated with the display of the carrier.

18. The method of claim 17, wherein said barcode is associated with said display of said carrier by being logically, wirelessly or electronically connected to the display.

19. The method according to claim 16, comprising:
associating, in said SMT information database, a carrier ID and a plurality of IDs of a subset of bin load units required to complete a loading/kitting of said carrier;
retrieving, from said SMT information database, information associating the carrier ID and the plurality of IDs of a subset of bin load units required to complete a loading/kitting of said carrier; and
generating and presenting guidance information to an SMT operator, thereby providing the SMT operator standing in front of the carrier with guidance information in form of display data indicating at least one of a changed state of the carrier in a process for loading the carrier with bin load units, updated information about the bin load units loaded or to be loaded in a plurality of slots or compartments of the carrier, a next location or position for the carrier or the next position for a bin load unit(s) carried by said carrier to be placed or positioned.

20. A carrier in form of a transport bin or trolley in a Surface Mount Technology (SMT) system comprising
an SMT information database and an SMT pick-and-place machine, wherein said carrier is configured with compartments for carrying a plurality of bin load units, each of said plurality of bin load units comprising a component tape reel, and wherein said carrier is adapted to be received in, or connected to the SMT pick-and-place machine, the carrier further comprising a display configured to:
receive, via a wireless communications network, input data related to said carrier and an ongoing or upcoming SMT job, wherein said input data is based on data retrieved from the SMT information database; and
present display data on said display by sequentially updating the display data multiple times based on input data sequentially received via a wireless communication network, said sequentially presented display data providing guidance to an SMT operator through a process of loading the plurality of bin load units into said carrier, a changeover process involving said carrier, replenishment work or kitting work involving said carrier.

21. The carrier of claim 20, wherein said display of the carrier is configured to receive input data from a wireless communications network separate from the communications network directly connected to the SMT information database.

22. A method in a Surface Mount Technology (SMT) system, the SMT system comprising:
a pick and place machine;
an information database; and
at least one transport carrier comprising a unique carrier identity, a display unit, and a plurality of positions each for transporting a bin load unit including a reel of components for placement by the pick and place machine;
the method comprising:
obtaining input data from said information database for supplying the pick and place machine with the components for placement, based on carrier data representing the unique carrier identity; and
presenting, based on the input data, updated display data on the display unit, indicating at least one of:
a changed loading state of the transport carrier; and
information about bin load units carried in the transport carrier; and
using the reels of components from the transport carrier in the pick and place machine.

23. The method according to claim 22, wherein:
the transport carrier is a bin or a trolley;
the display unit comprises an electronic label; and
the SMT system comprises a wireless communications network for transmitting said carrier data and said input data.

24. A Surface Mount Technology (SMT) support system, used to provision a plurality of pick and place machines that use reels of components for placement, the SMT support system comprising:
an SMT information database;
a plurality of transport carriers each comprising a unique carrier identity, a display unit, and a plurality of positions each for transporting a bin load unit including a reel of components for placement by the pick and place machines;
at least one communications network configured to be communicatively coupled to display units on the plurality of carriers and the SMT information database;
logic and resources coupled to the display units configurable to:
obtain input data from the SMT information database for supplying the pick and place machines with the components for placement, based on carrier data representing the unique carrier identity; and
present, based on the input data, updated display data on the display unit, indicating at least one of:
a changed loading state of the transport carrier; and
information about bin load units carried in the transport carrier.

25. The support system according to claim 24, wherein:
the transport carrier is a bin or a trolley; and
the display unit comprises an electronic label.

* * * * *